(12) United States Patent
Hansen

(10) Patent No.: US 7,245,356 B2
(45) Date of Patent: *Jul. 17, 2007

(54) LITHOGRAPHIC APPARATUS AND METHOD FOR OPTIMIZING ILLUMINATION USING A PHOTOLITHOGRAPHIC SIMULATION

(75) Inventor: Steven George Hansen, Phoenix, AZ (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 11/280,985

(22) Filed: Nov. 17, 2005

(65) Prior Publication Data

US 2006/0126046 A1    Jun. 15, 2006

Related U.S. Application Data

(63) Continuation-in-part of application No. 10/773,397, filed on Feb. 9, 2004, now Pat. No. 7,030,966, and a continuation-in-part of application No. 10/716,439, filed on Nov. 20, 2003, now Pat. No. 7,016,017, which is a continuation-in-part of application No. 10/361,831, filed on Feb. 11, 2003, now Pat. No. 6,839,125.

(51) Int. Cl.
*G03B 27/54* (2006.01)
*G03B 27/42* (2006.01)
*G03B 27/72* (2006.01)
*G03B 37/32* (2006.01)
*G06F 17/50* (2006.01)
*G03C 5/00* (2006.01)

(52) U.S. Cl. .......................... 355/67; 355/55; 355/67; 355/71; 355/77; 430/30; 703/13

(58) Field of Classification Search ................. 355/53, 355/67, 71, 77; 430/30; 703/13.22; 716/19, 716/21
See application file for complete search history.

(56) References Cited

U.S. PATENT DOCUMENTS 5,305,054 A    4/1994    Suzuki et al.

(Continued)

FOREIGN PATENT DOCUMENTS

EP    1 239 331 A2    9/2002

OTHER PUBLICATIONS

Burkhardt et al., "Illuminator Design for the Printing of Regular Contact Patterns," *Microelectronic Engineering*, 41/42, 1998, pp. 91-96.

(Continued)

*Primary Examiner*—Alan Mathews
(74) *Attorney, Agent, or Firm*—Pillsbury Winthrop Shaw Pittman LLP

(57) ABSTRACT

A method of configuring a transfer of an image of a patterning device pattern onto a substrate with a lithographic apparatus. The method includes determining an intermediate illumination arrangement parameter and an intermediate patterning device parameter by varying an initial illumination arrangement parameter and an initial patterning device parameter using a calibrated model until the calculated image of the pattern printed on the substrate is within predetermined specification; calculating a metric that represents a lithographic response of the printed pattern over a process range, where the pattern would be imaged with the intermediate illumination arrangement and patterning device parameters over the process range, and depending on a result of the metric, adjusting the initial patterning device and illumination arrangement parameters.

30 Claims, 60 Drawing Sheets

U.S. PATENT DOCUMENTS

| | | | |
|---|---|---|---|
| 5,523,193 | A | 6/1996 | Nelson |
| 5,680,588 | A | 10/1997 | Gortych et al. |
| 6,049,660 | A | 4/2000 | Ahn et al. |
| 6,128,067 | A | 10/2000 | Hashimoto |
| 6,452,662 | B2 | 9/2002 | Mulkens et al. |
| 6,463,403 | B1 | 10/2002 | Burdorf et al. |
| 6,466,304 | B1 | 10/2002 | Smith |
| 6,839,125 | B2 | 1/2005 | Hansen |
| 7,016,017 | B2 * | 3/2006 | Hansen ................. 355/67 |
| 7,030,966 | B2 * | 4/2006 | Hansen ................. 355/67 |
| 2002/0035461 | A1 | 3/2002 | Chang et al. |
| 2002/0045106 | A1 | 4/2002 | Baselmans et al. |
| 2002/0062206 | A1 | 5/2002 | Liebchen |
| 2002/0076629 | A1 | 6/2002 | Miwa et al. |
| 2002/0140920 | A1 | 10/2002 | Rosenbluth et al. |
| 2002/0152452 | A1 | 10/2002 | Socha |
| 2002/0167653 | A1 | 11/2002 | Mulkens et al. |
| 2003/0073013 | A1 | 4/2003 | Hsu et al. |
| 2003/0082463 | A1 | 5/2003 | Laidig et al. |
| 2003/0093251 | A1 | 5/2003 | Chang |
| 2004/0184030 | A1 | 9/2004 | Liebchen |

OTHER PUBLICATIONS

Chen et al., "Practical Method for Full-Chip Optical Proximity Correction," *Optical Microlithography X, Proceedings of SPIE*, vol. 3051, Mar. 12-14, 1997, pp. 790-803.

Chen et al., "Optical Proximity Correction for Intermediate-Pitch Features Using Sub-Resolution Scattering Bars," *Journal of Vacuum Science & Technology B*, vol. 15, No. 6, Nov./Dec. 1997, pp. 2426-2433.

Flagello et al., "Lithographic Lens Testing: Analysis of Measured Aerial Images, Interferometric Data and Photoresist Measurements," *SPIE Microlithography Seminar*, 1996, pp. 1-11.

Flagello et al., "Towards a Comprehensive Control of Full-Field Image Quality in Optical Photolithography," *SPIE Microlithography Seminar*, Mar. 1997, pp. 1-14.

Gau et al., "Strategy to Manipulate the Optical Proximity Effect by Post-Exposure Bake Processing," *Optical Microlithography XI, Proceedings of SPIE*, vol. 3334, 1998, pp. 885-891.

Gau et al., "The Customized Illumination Aperture Filter for Low k1 Photolithography Process," *Optical Microlithography XIII, Proceedings of SPIE*, vol. 4000, Mar. 2000, pp. 271-282.

Hsia et al., "Customized Off-Axis Illumination Aperture Filtering for Sub-0.18 µm KrF Lithography," *SPIE Conference on Optical Microlithography XII*, vol. 3679, Mar. 1999, pp. 427-434.

Liu et al., "The Application of Alternating Phase-Shifting Masks to 140 nm Gate Patterning: Line Width Control Improvements and Design Optimization," *SPIE*, vol. 3236, 1998, pp. 328-337.

Smith et al., "Illumination Pupil Filtering Using Modified Quadrupole Apertures," *Optical Microlithography XI, Proceedings of SPIE*, vol. 3334, 1998, pp. 384-394.

Suzuki et al., "Multilevel Imaging System Realizing k1=0.3 Lithography," *Optical Microlithography XII, Proceedings of SPIE*, vol. 3679, Mar. 1999, pp. 396-407.

Wong et al., "Level-Specific Lithography Optimization for 1-Gb DRAM," *IEEE Transactions on Semiconductor Manufacturing*, vol. 13, No. 1, Feb. 2000, pp. 76-87.

Zhou et al., "Lithography Process Window Analysis with Calibrated Model," Metrology, Inspection, and Process Control for Microlithography XVIII, Proceedings of SPIE, vol. 5375, pp. 721-726.

Australian Written Opinion and Search Report issued in Australian Application No. SG 200400559-1 dated Jan. 23, 2006.

European Search Report issued in EP 04 25 0743 dated Aug. 9, 2006.

Chris Mack, "Optimization of the Spatial Properties of Illumination for Improved Lithographic Response", SPIE, Optical/Laser Microlithography, vol. 1927, pp. 125-136 (1993) XP002390348.

* cited by examiner

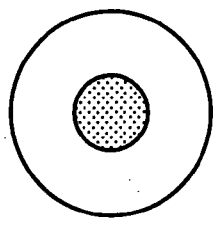 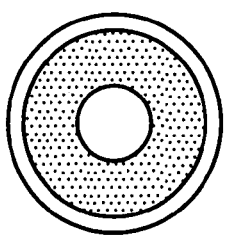 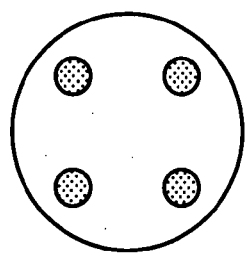 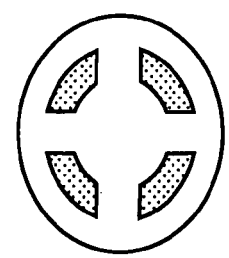
Fig. 2  Fig. 3  Fig. 4  Fig. 5
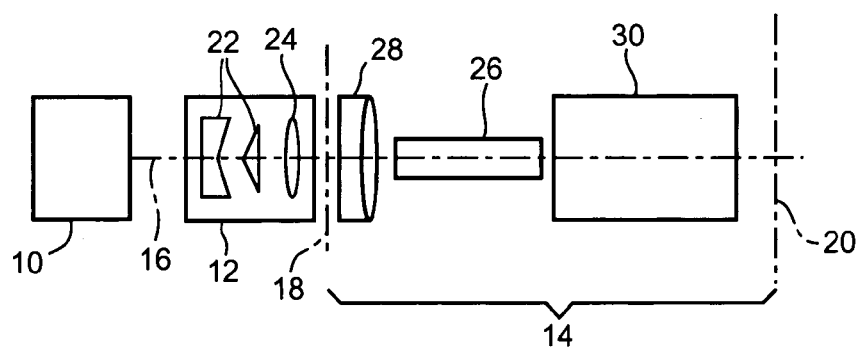
Fig. 6
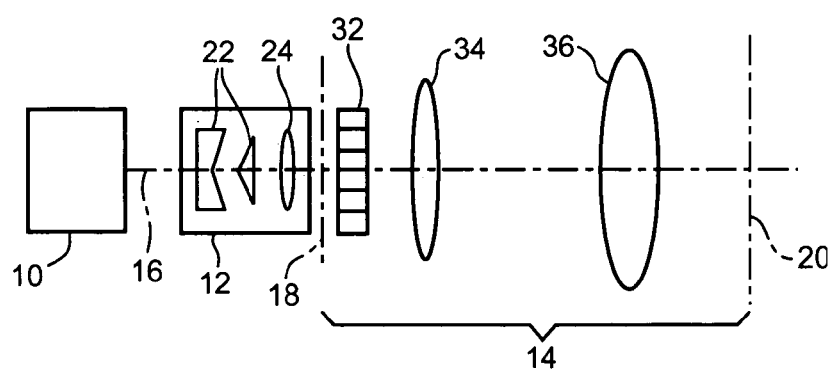
Fig. 7

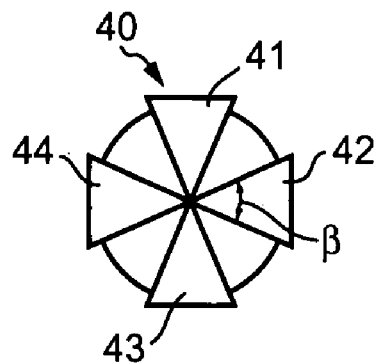 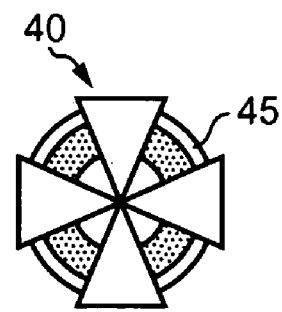
Fig. 10a Fig. 10b
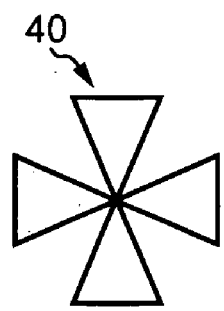
Fig. 11

| Trial illuminator | Prediction based on weighted and interpolated source measurements | Prolith simulation with this illuminator |
|---|---|---|
| 0.85_0.55 Q30 | 0.293u | 0.23u |
| 0.75_0.55 Q20 | 0.416 | 0.41 |
| 0.80_0.60 Q20 | 0.383 | 0.355 |
| 0.80_0.60 annular | 0.110 | 0.10 |
| 0.75_0.55 annular | 0.118 | 0.105 |

Fig. 21

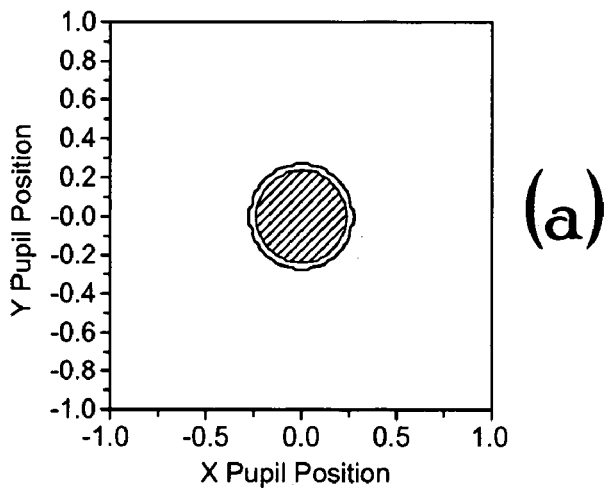
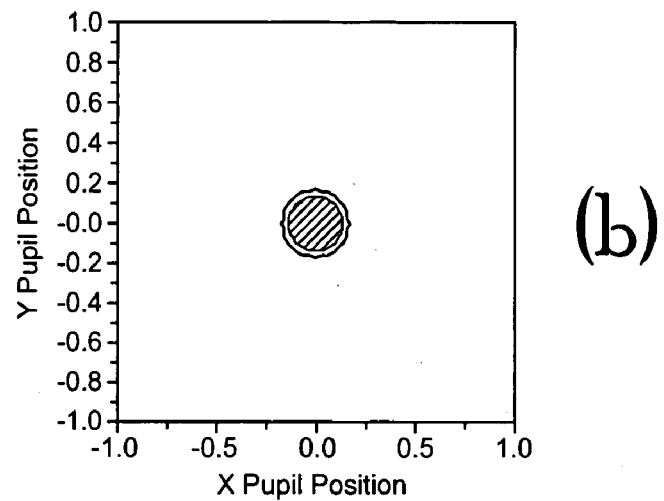
Fig. 41
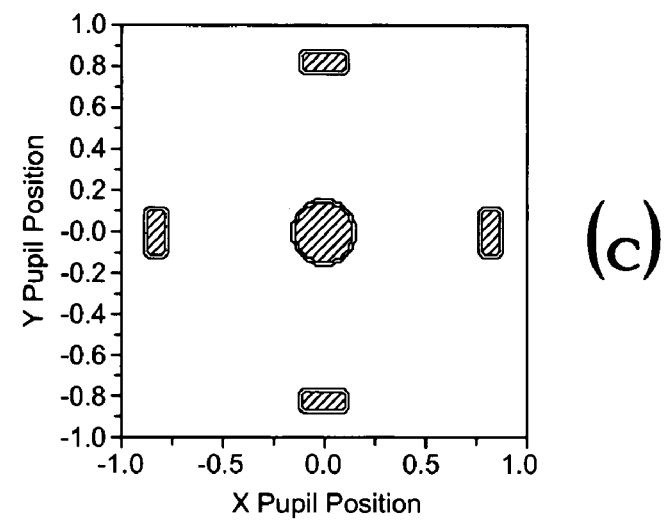

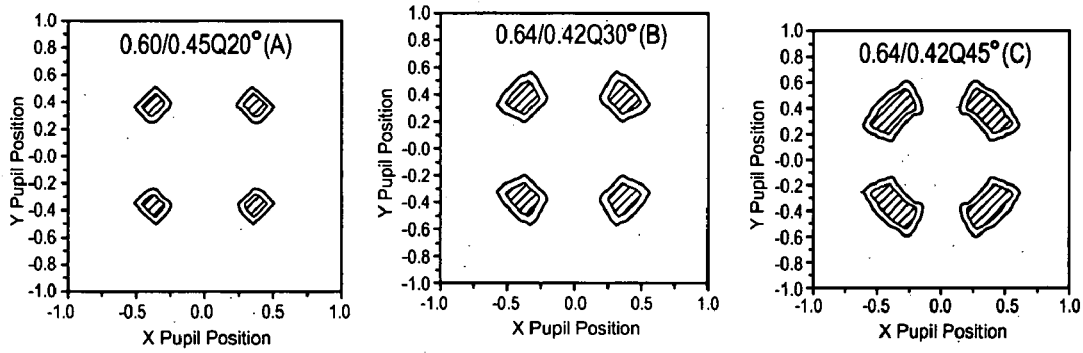
Fig. 59
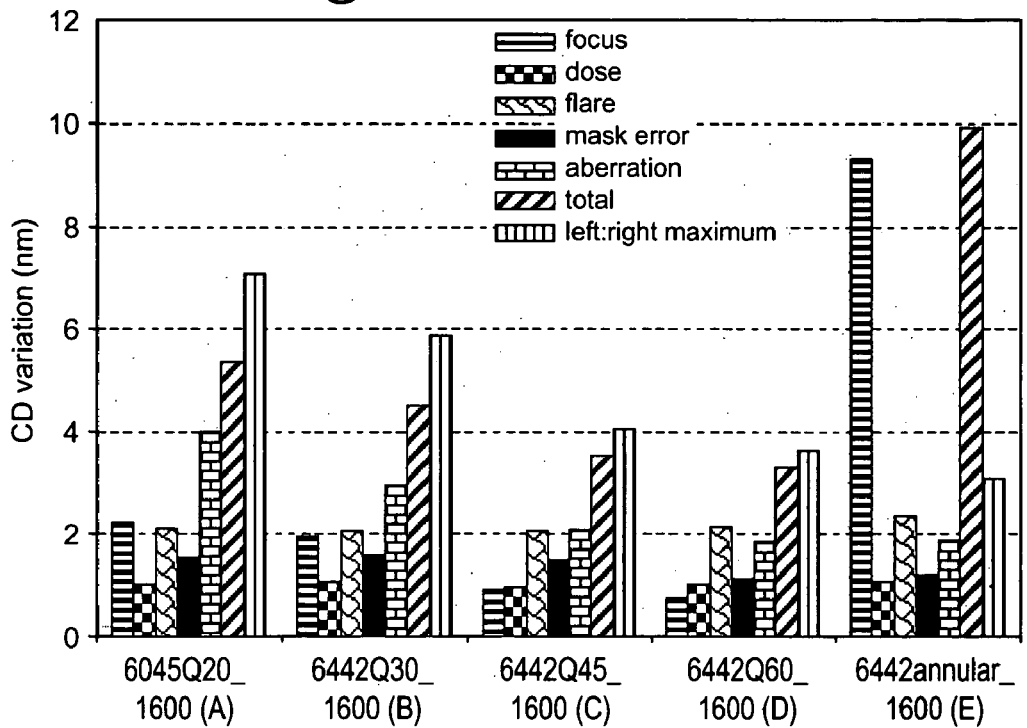
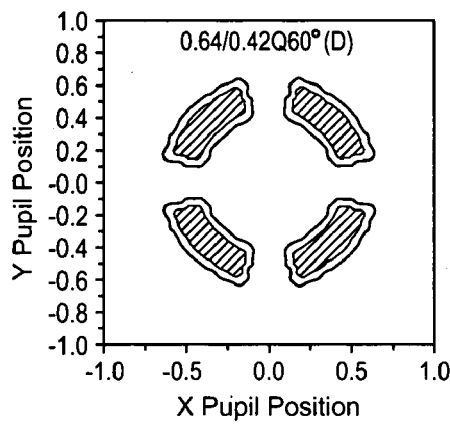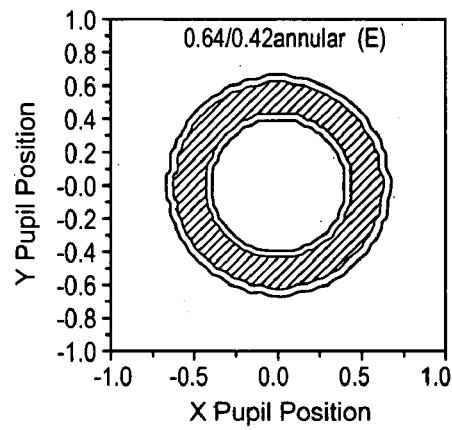

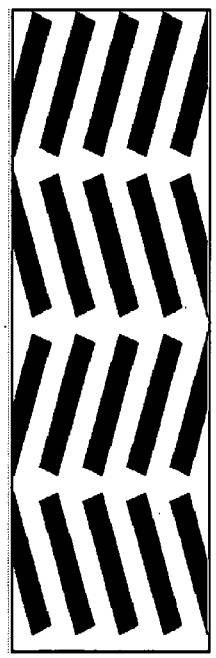
Fig. 67
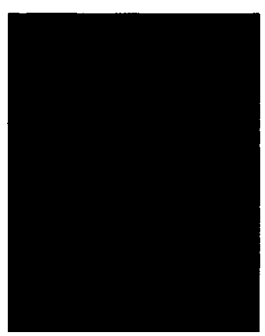 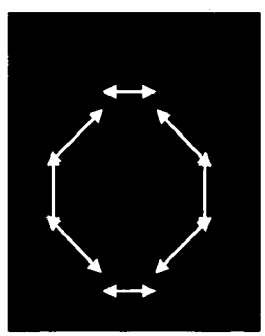 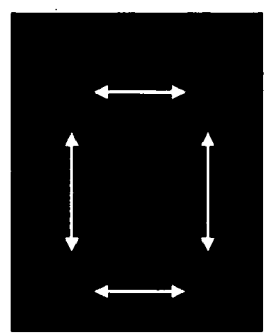
Fig. 68a  Fig. 68b  Fig. 68c

LITHOGRAPHIC APPARATUS AND METHOD FOR OPTIMIZING ILLUMINATION USING A PHOTOLITHOGRAPHIC SIMULATION

This application is a continuation-in-part of U.S. patent application Ser. No. 10/773,397, filed Feb. 9, 2004, entitled, "Lithographic Apparatus and Method for Optimizing an Illumination Source Using Photolithographic Simulations," now U.S. Pat. No. 7,030,966, which is a continuation-in-part of U.S. patent application Ser. No. 10/361,831, filed Feb. 11, 2003, now U.S. Pat. No. 6,839,125, entitled "Method for Optimizing an Illumination Source Using Full Resist Simulation and Process Window Metric," and is a continuation-in-part of U.S. patent application Ser. No. 10/716,439, filed Nov. 20, 2003, entitled "Lithographic Apparatus and Method for Optimizing an Illumination Source Using Isofocal Compensation," now U.S. Pat. No. 7,016,017. The contents of these applications are incorporated herein in their entirety by reference.

BACKGROUND

1. Field of the Invention

The present invention relates to a method for optimizing illumination in a lithographic apparatus. More specifically, the invention relates to a method for optimizing illumination using computer simulation.

2. Description of the Related Art

The term "patterning structure" as here employed should be broadly interpreted as referring to a device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. An example of such a patterning structure is a mask. The concept of a mask is well known in lithography, and it includes mask types such as binary, alternating phase shift, and attenuated phase shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired.

Another example of a patterning structure is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning structure can include one or more programmable mirror arrays. More information on mirror arrays as here referred to can be seen, for example, from U.S. Pat. Nos. 5,296,891 and 5,523,193, and PCT Publication Nos. WO 98/38597 and WO 98/33096. In the case of a programmable mirror array, the support structure may be embodied as a frame or table, for example, which may be fixed or movable as required.

Another example of a patterning structure is a programmable LCD array. An example of such a construction is given in U.S. Pat. No. 5,229,872. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning structure as hereabove set forth.

Lithographic projection apparatus can be used, for example, in the manufacture of integrated circuits (ICs). In such a case, the patterning structure may generate a circuit pattern corresponding to an individual layer of the IC, and this pattern can be imaged onto a target portion (e.g., including one or more dies on a substrate (silicon wafer) that has been coated with a layer of radiation sensitive material (resist). In general, a single wafer will contain a whole network of adjacent target portions that are successively irradiated via the projection system, one at a time. In current apparatuses, employing patterning by a mask on a mask table, a distinction can be made between two different types of machines. In one type of lithographic projection apparatus, each target portion is irradiated by exposing the entire mask pattern onto the target portion at once. Such an apparatus is commonly referred to as a wafer stepper. In an alternative apparatus, commonly referred to as a step and scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement and/or inspection of the imaged features. This array of procedures is used as a basis to pattern an individual layer of a device, e.g., an IC. Such a patterned layer may then undergo various processes such as etching, ion-implantation (doping), metallization, oxidation, chemical, mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing," Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatuses are described, for example, in U.S. Pat. Nos. 5,969,441 and 6,262,796.

Photolithography is widely recognized as one of the key steps in the manufacturing of integrated semiconductor circuits. At present, no alternative technology provides the desired pattern architecture with similar accuracy, speed, and economic productivity. However, as the dimensions of the ICs become smaller, photolithography is becoming one of the most, if not the most, critical gating factors for enabling miniature semiconductor device structures to be manufactured on a truly massive scale.

A theoretical estimate of the limits of pattern printing can be given by the Rayleigh criterion for resolution R as shown in equation (1):

$$R = k_1 * \frac{\lambda}{NA} \tag{1}$$

where $\lambda$ is the wavelength of the radiation used, NA is the numerical aperture of the lens in the projection system and $k_1$ is a process dependent adjustment factor.

It follows from equation (1) that the resolution can be improved in three ways: by shortening the exposure wavelength $\lambda$, by increasing the numerical aperture NA or by decreasing the value of $k_1$. All of these strategies have been pursued simultaneously in the past and are expected to continue in the future.

The performance of the lithographic apparatus and its limitation may also be explained and characterized with the Depth Of Focus (DOF), which is generally viewed as one of the most critical factors in determining the resolution of the lithographic projection apparatus. The DOF, defined in equation (2), is defined as the distance along the optical axis over which the image of the pattern is adequately sharp.

$$DOF = +/- k_2 * \frac{\lambda}{NA^2} \tag{2}$$

where $k_2$ is an empirical constant.

Additional important responses/measures that provide more insight into the real difficulties associated with photolithography at the resolution limit include the Exposure Latitude (EL), the Dense Isolated Bias (DIB), and the Mask Error Enhancement Factor (MEEF). The Exposure Latitude describes the percentage dose range where the printed pattern's critical dimension (CD) is acceptable, typically 10%. It is used along with the DOF to determine the process window, i.e. the regions of focus and exposure that keep the final resist profile within prescribed specifications. As for the DIB, it is a measure of the size difference between similar features, depending on the pattern density. Finally, the MEEF describes how reticle CD errors are transmitted into wafer CD errors.

As the semiconductor industry moves into the deep submicron regime, the resolution limit of currently available lithographic techniques is being reached due to a decrease in the depth of focus, difficulty in the design of lenses and complexities in the lens fabrication technology. In order to address this issue, there have been continued endeavors to develop resolution enhancement techniques.

Historically, the resolution limit of a lithographic projection tool was optimized by the control of the relative size of the illumination system numerical aperture (NA). Control of this NA with respect to the projection system's objective lens NA allows for modification of spatial coherence at the mask plane, commonly referred to as partial coherence σ. This is accomplished through specification of the condenser lens pupil in a Köhler illumination system. Essentially, this allows for manipulation of the optical processing of diffraction information. Optimization of the partial coherence of a projection imaging system is conventionally accomplished using full circular illuminator apertures. By controlling the distribution of diffraction information in the objective lens with the illuminator pupil size, maximum image modulation can be obtained. Illumination systems can be further refined by considering variations to full circular illumination apertures. A system where illumination is obliquely incident on the mask at an angle so that the zero-th and first diffraction orders are distributed on alternative sides of the optical axis may allow for improvements. Such an approach is generally referred to as off-axis illumination.

Off-axis illumination improves resolution by illuminating the mask with radiation that is at an angle to the optical axis of the lens. The incidence of the radiation on the mask, which acts as a diffraction grating, improves the contrast of the image by transmitting more of the diffracted orders through the lens. Off-axis illumination techniques used with conventional masks produce resolution enhancement effects similar to resolution enhancement effects obtained with phase shifting masks.

Various other enhancement techniques that have been developed to increase the resolution and the DOF include optical proximity correction (OPC) of optical proximity errors (OPE), phase shifting masks (PSM), and sub-resolution assist features (SRAF). Each technique may be used alone, or in combination with other techniques to enhance the resolution of the lithographic projection tool.

One approach to generate off-axis illumination is to incorporate a metal aperture plate filter into the fly eye lens assembly of the projection system illuminator providing oblique illumination. A pattern on such a metal plate would have four symmetrically arranged openings (zones) with sizing and spacing set to allow diffraction order overlap for specific geometry sizing and duty ratio on the photomask. Such an approach results in a significant loss in intensity available to the mask, lowering throughput and making the approach less than desirable. Additionally, the four circular openings need to be designed specifically for certain mask geometry and pitch and do not improve the performance of other geometry sizes and spacings. The previous work in this area describes such a method using either two or four openings in the aperture plate. See, for example, EP 0 500 393, U.S. Pat. Nos. 5,305,054, 5,673,103, 5,638,211, EP 0 496 891 and EP 0 486 316.

Another approach to off-axis illumination using the four-zone configuration, which is disclosed in U.S. Pat. No. 6,452,662 is to divide the illumination field of the projection system into beams that can be shaped to distribute off-axis illumination to the photomask. By incorporating the ability to shape off-axis illumination, throughput and flexibility of the exposure source is maintained. Additionally, this approach allows for illumination that combines off-axis and on-axis (conventional) characteristics. By doing so, the improvement to dense features that are targeted with off-axis illumination is less significant than straight off-axis illumination. The performance of less dense features, however, is more optimal because of the more preferred on-axis illumination for these features. The result is a reduction in the optical proximity effect between dense and isolated features. Optimization is less dependent on feature geometry and more universal illumination conditions can be selected.

Referring to FIGS. 2–5, currently available illumination intensity distributions or arrangements include small, or low, sigma (FIG. 2), annular (FIG. 3), quadrupole (FIG. 4), and quasar (FIG. 5), with the illuminated areas (hereinafter referred to as the aperture(s)) shown in cross section. The annular, quadrupole and quasar illumination techniques of FIGS. 3–5 are examples of off-axis illumination schemes.

Small sigma illumination is incident on the mask with approximately zero illumination angle (i.e., almost perpendicular to the mask) and produces good results with phase shifting masks to improve resolution and increase the depth of focus. Annular illumination is incident on the mask at angles that are circularly symmetrical and improves resolution and increases depth of focus while being less pattern dependent than other illumination schemes. Quadrupole and quasar illumination are incident on the mask with four main angles and provide improved resolution and increased depth of focus while being strongly pattern dependent.

Referring to FIGS. 6 and 7, two illumination systems are schematically illustrated. The systems illustrated in FIGS. 6 and 7 include light collecting/collimating optics 10; an axicon/zoom module 12; and light integrating and projecting optics 14. The illumination systems define an optical axis 16, a pupil plane 18, and a mask plane 20. The axicon/zoom module 12 comprises a pair of axicons 22, one concave and one convex, whose separation can be varied. The module 12 also comprises a zoom lens 24.

For the case of conical axicons, some examples of the illumination intensity distributions achievable at the pupil plane 18 are shown in FIG. 8. The spot size can be varied between states A and B by changing the zoom lens position. Similarly, the annularity can be changed between states A and C by varying the axicon opening (separation between the axicons).

To improve the illumination homogeneity, an optical integrator 26 is used. In FIG. 6 the optical integrator takes the form of a light pipe 26, such as a glass, calcium fluoride or quartz rod. A coupler 28 couples the illumination at the pupil plane 18 into the rod 26, and rod exit imaging optics 30 are also provided. In FIG. 7 a fly's eye element 32 acts as the integrator. The fly's eye element 32 is a composite lens comprising an array or honeycomb of small lenses. Further, objective lenses 34 and 36 complete the projection optics.

It results from the foregoing discussion that numerous options are available to the process engineer for increasing the resolution of the lithographic projection apparatus and for maximizing the process window. Yet, given the cost and time to perform experiments in a semiconductor fabrication facility (fab), the approach that would consist of testing these options across the board to develop a robust process is simply unrealistic. As the product cycle times in the semiconductor field are relatively short, severe limitations are put on the amount of time that can be spent on research and development for each new product line or manufacturing process.

In response to this concern, there has been a growing interest in photolithographic simulations within the industry. Given the fact that a simulation experiment for optimizing the optical proximity correction features for a new mask test may only take one day, instead of months with experiments on wafers, simulations are viewed today as a useful tool to aid in the development and optimization of lithographic apparatuses.

It follows that simulations can be extremely helpful as a development tool, by quickly evaluating options, optimizing processes, and saving time and money by reducing the number of required experiments. Simulations can also aid in the research context to understand many physical phenomena that occur when pushing the limits of resolution to achieve feature size in the order of or below the wavelength of the lithographic apparatus. Finally, simulations can be a tremendous tool to extend the optical lithography to the sub-150 nm regime and to prolong the lifetimes of million dollar steppers and billion dollar fabs.

SUMMARY

One aspect of the present invention is optimizing the illumination conditions of a lithographic projection apparatus by computer simulation. The present invention provides optimization of illumination conditions of various responses of a lithographic projection apparatus, including, for example, the process window (exposure/dose latitude versus depth of focus), side lobe printing and mask error enhancement factor.

According to this aspect of the present invention, there is provided a method for optimizing the illumination conditions of a lithographic apparatus by computer simulation, wherein the lithographic apparatus includes an illuminator and a projection system, the method including: defining a lithographic pattern to be printed on a substrate; selecting a simulation model; selecting a grid of source points in a pupil plane of the illuminator; calculating separate responses for individual source points, each of the responses representing a result of a single or series of simulations using the simulation model; and adjusting an illumination arrangement of the illuminator based on analysis of accumulated results of the separate calculations.

According to another aspect of the present invention, there is provided a method for optimizing the illumination conditions of a lithographic apparatus by computer simulation using full resist calculation, wherein the lithographic apparatus includes an illuminator and a projection system, the method including: defining a lithographic pattern to be printed on a substrate; selecting a resist model; selecting a grid of source points; calculating separate responses for individual source points, each of the responses representing a result of a single or series of simulations using the resist model; and adjusting an illumination arrangement based on analysis of accumulated results of the separate calculations.

According to yet another aspect of the invention, there is provided a method for optimizing the illumination conditions of a lithographic apparatus by computer simulation using isofocal compensation, wherein the lithographic apparatus includes an illuminator and a projection system, the method including: defining a lithographic pattern to be printed on a substrate; selecting a simulation model; selecting a grid of source points in a pupil plane of the illuminator; calculating separate responses for individual source points, each of the responses representing a result of a single or series of simulations using the simulation model; calculating a metric representing variation of the separate responses for individual source points with defocus; and adjusting an illumination arrangement based on analysis of the metric.

According to yet another aspect of the invention, there is provided a method for optimizing the illumination conditions of a lithographic apparatus by computer simulation using aberration sensitivity, wherein the lithographic apparatus includes an illuminator and a projection system, the method including: defining a lithographic pattern to be printed on a substrate; selecting a simulation model; selecting a grid of source points in a pupil plane of the illuminator; defining at least one aberration set for the projection system; calculating separate responses for individual source points and for the at least one aberration set, each of the responses representing a result of a single or series of simulations using the simulation model; and adjusting an illumination arrangement based on analysis of accumulated results of the separate calculations.

According to yet another aspect of the invention, there is provided a method for optimizing the illumination conditions of a lithographic apparatus by computer simulation using mask assist features at the illuminator level, wherein the lithographic apparatus includes an illuminator and a projection system, the method including: defining a lithographic pattern to be printed on a substrate; selecting a simulation model; defining mask assist features configured to help print the lithographic pattern on the substrate; selecting a grid of source points in a pupil plane of the illuminator; calculating separate responses for individual source points with and without mask assist features, each of the responses representing a result of a single or series of simulations using the simulation model; and adjusting an illumination arrangement based on analysis of accumulated results of the separate calculations.

According to another aspect of the invention, there is provided a method for optimizing the illumination conditions of a lithographic apparatus by computer simulation using best CD uniformity metric, wherein the lithographic apparatus includes an illuminator and a projection system, the method including: defining a lithographic pattern to be printed on a substrate; selecting a simulation model; selecting a grid of source points in a pupil plane of the illuminator; defining a plurality of parameters and their range of variation; calculating separate responses for individual source points and for each of the plurality of parameters, each of the responses representing a result of a single or series of simulations using the simulation model; calculating a metric representing CD variation of the lithographic pattern for the plurality of parameters and for the individual source points; and adjusting an illumination arrangement based on analysis of the metric.

According to yet another aspect of the present invention, there is provided a lithographic projection apparatus including: an illumination system to provide a projection beam of radiation; a support structure to support a patterning structure which can be used to pattern the projection beam according to a desired pattern; a substrate table to hold a substrate; a projection system to project the patterned beam onto a target portion of the substrate; a processor to define a lithographic pattern to be printed on the substrate, select a grid of source points in a pupil plane of the illumination system, calculate separate responses for individual source points, each of the responses representing a result of a single or series of simulations using a simulation model, and calculate an optimized illumination arrangement based on analysis of the accumulated results of the separate calculations; and a selectably variable beam controller that is adapted to modify a cross-sectional intensity distribution in the projection beam exiting the illumination system in accordance with the optimized illumination arrangement calculated by the processor.

According to another aspect of the present invention, there is provided a machine readable medium encoded with machine executable instructions for optimizing an illumination arrangement of an illuminator according to a method including: defining a lithographic pattern to be printed on a substrate; selecting a simulation model; selecting a grid of source points in a pupil plane of the illuminator; calculating separate responses for individual source points, each of the responses representing a result of a single or series of simulations using the simulation model; and adjusting the illumination arrangement based on analysis of the accumulated results of the separate calculations.

According to yet another aspect of the invention, there is provided a device manufacturing method including: projecting a patterned beam of radiation onto a target portion of a layer of radiation-sensitive material on a substrate, wherein, prior to impinging the mask, a cross-sectional intensity distribution in the projection beam is optimized using a method as described above.

In an embodiment of the invention, there is provided a method of configuring a transfer of an image of a patterning device pattern onto a substrate with a lithographic apparatus. The method includes determining an intermediate illumination arrangement parameter and an intermediate patterning device parameter by varying an initial illumination arrangement parameter and an initial patterning device parameter using a calibrated model until the calculated image of the printed pattern on the substrate is within predetermined specification; calculating a metric that represents a variation of a lithographic response of the printed pattern over a process range, where the pattern would be imaged with the intermediate illumination arrangement and patterning device parameters over the process range, and depending on a result of the metric, iteratively (a) varying the initial patterning device and illumination arrangement parameters and (b) calculating the metric until a substantially maximum or minimum value of the lithographic response is obtained.

In yet another embodiment of the invention, there is provided a lithographic apparatus, including an illumination system configured to condition a beam of radiation; a substrate table configured to hold a substrate; a projection system configured to project a beam of radiation patterned by a patterning device onto a surface of the substrate; and a processor to perform a method of configuring a transfer of an image of a patterning device pattern onto the substrate. The method includes determining an intermediate illumination arrangement parameter and an intermediate patterning device parameter by varying an initial illumination arrangement parameter and an initial patterning device parameter using a calibrated model until the image of the calculated pattern printed on the substrate is within predetermined specification; calculating a metric that represents a variation of a lithographic response of the printed pattern over a process range, where the pattern would be imaged with the intermediate illumination arrangement and patterning device parameters over a process range, and depending on a result of the metric, iteratively (a) varying the initial patterning device and illumination arrangement parameters and (b) calculating the metric until a substantially maximum or minimum value of the lithographic response is obtained.

In an embodiment of the invention, there is provided a computer product having machine executable instructions, the instructions being executable by a machine to perform a method of configuring a transfer of an image of a patterning device pattern onto a substrate with a lithographic apparatus. The method includes determining an intermediate illumination arrangement parameter and an intermediate patterning device parameter by varying an initial illumination arrangement parameter and an initial patterning device parameter using a calibrated model until the calculated image of the pattern printed on the substrate is within predetermined specification; calculating a metric that represents a variation of a lithographic response of the printed pattern over a process range, where the pattern would be imaged with the intermediate illumination arrangement and patterning device parameters over the process range, and depending on a result of the metric, iteratively (a) varying the initial patterning device and illumination arrangement parameters and (b) calculating the metric until a substantially maximum or minimum value of the lithographic response is obtained.

In another embodiment of the invention, there is provided a method of configuring a transfer of an image of a patterning device pattern onto a substrate with a lithographic apparatus. The method includes determining a plurality of intermediate parameters by varying a corresponding plurality of initial intermediate parameters using a calibrated model until the calculated image of the pattern printed on the substrate is within predetermined specification; calculating a metric that represents a variation of a lithographic response of the printed pattern over a process range, where the pattern would be imaged with the plurality of intermediate parameters over the process range, and depending on a result of the metric, iteratively (a) varying the initial plurality parameters and (b) calculating the metric until a substantially maximum or minimum value of the lithographic response is obtained.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid crystal display panels, thin film magnetic heads, etc. It should be appreciated that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the invention will now be described, by way of examples only, with reference to the accompanying schematic drawings in which:

FIG. 2 is a schematic illustration of a small, or low, sigma illumination arrangement;

FIG. 3 is a schematic illustration of an annular off-axis illumination arrangement;

FIG. 4 is a schematic illustration of an off-axis quadrupole illumination arrangement;

FIG. 5 is a schematic illustration if an off-axis quasar illumination arrangement;

FIG. 6 is a schematic illustration of an illumination system;

FIG. 7 is a schematic illustration of another illumination system;

FIG. 10a is a schematic illustration of a multipole mode generating element of the illumination system of FIG. 9;

FIG. 10b is a schematic illustration of a multipole mode generating element according to an another exemplary embodiment of the invention;

FIG. 11 is a schematic illustration of a multipole mode generating element according to another exemplary embodiment of the invention;

FIG. 21 is a table comparing DOF values for several illumination arrangements obtained with a commercial simulation software (Prolith™) and with the embodiment of the present invention that uses weighted dose and interpolated source measurements;

FIG. 41 shows the different illumination arrangements at the pupil plane of the illuminator that are used in the trial of FIG. 40, i.e. σ=0.25, σ=0.15, and small CQuad+σ=0.15;

FIG. 59 represents CD variation for several illumination arrangements and for various parameters;

FIG. 63c shows a superposition of the nominal printed pattern of FIG. 63b and the calculated pattern obtained with the SMO of FIG. 60 and the illumination source of FIG. 63a;

FIG. 64b shows a superposition of the nominal printed pattern of FIG. 63b and the calculated pattern obtained with the SMO of FIG. 60 and the illumination source of FIG. 64a;

FIG. 67 shows an angled rectangle pattern that is optimized during a SMO procedure;

FIGS. 68a–c shows various states of polarization in the illumination system;

DETAILED DESCRIPTION

Figure 1:
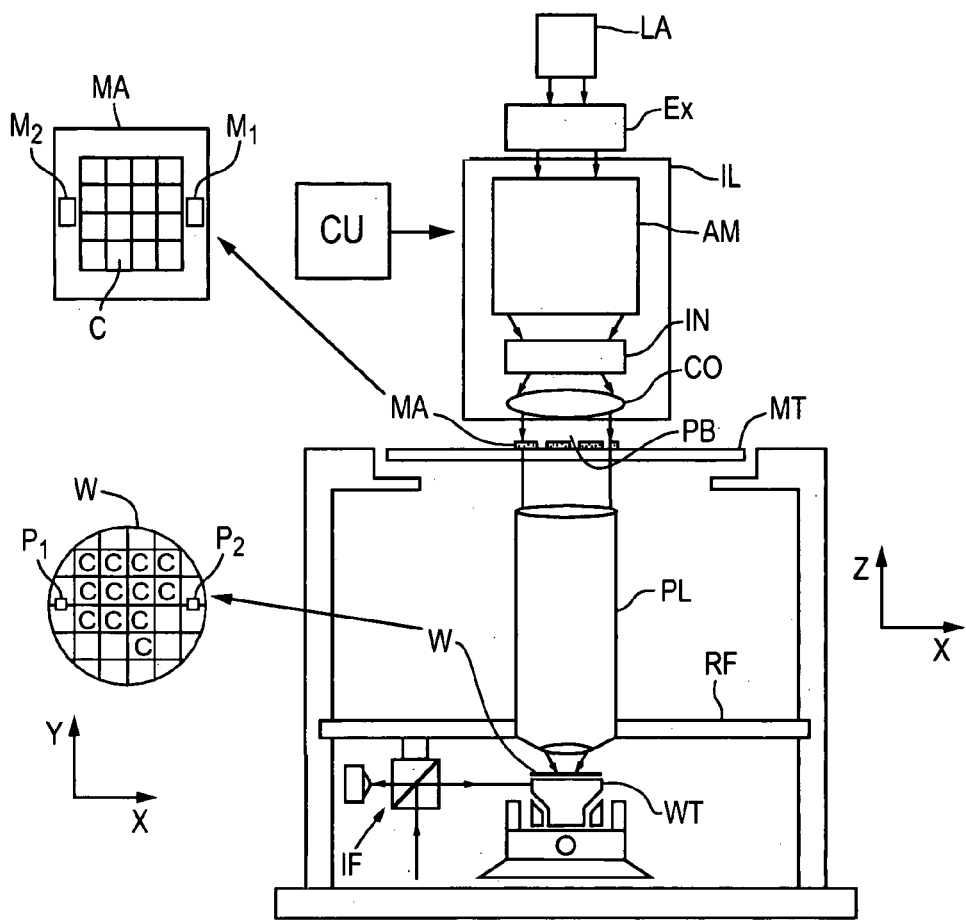
FIG. 1 is a schematic illustration of a photolithographic projection apparatus.

FIG. 1 schematically depicts a lithographic projection apparatus 1 according to an embodiment of the invention. The apparatus includes a radiation system Ex, IL constructed and arranged to supply a projection beam PB of radiation (e.g., UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object (mask) table MT provided with a mask holder constructed and arranged to hold a mask MA (e.g., a reticle), and connected to a first positioning device PM (not shown) to accurately position the mask with respect to a projection system or lens PL; a second object (substrate) table WT provided with a substrate holder constructed and arranged to hold a substrate W (e.g., a resist-coated silicon wafer), and connected to a second positioning device PW to accurately position the substrate with respect to the projection system or lens PL. The projection system or lens PL (e.g., a quartz and/or $CaF_2$ lens system or a refractive or catadioptric system, a mirror group or an array of field deflectors) is constructed and arranged to image an irradiated portion of the mask MA onto a target portion C (e.g., including one or more dies) of the substrate W. The projection system PL is supported on a reference frame RF.

As here depicted, the apparatus is of a transmissive type (i.e., has a transmissive mask). However, in general, it may also be of a reflective type, (e.g., with a reflective mask). Alternatively, the apparatus may employ another kind of patterning device, such as a programmable mirror array of a type as referred to above.

The source LA (e.g., a UV excimer laser, an undulator or wiggler provided around the path of an electron beam in a storage ring or synchrotron, a laser-produced plasma source, a discharge source or an electron or ion beam source) produces a beam PB of radiation. The beam PB is fed into an illumination system (illuminator) IL, either directly or after having traversed a conditioner, such as a beam expander Ex, for example. The illuminator IL may comprise a selectably variable beam controller or an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

Still referring to FIG. 1, the projection apparatus also includes a control unit CU which may be programmed to execute the method illustrated, for example, in FIGS. 14, 16, 18, 24, 37, 47, and 55, and may be configured to control the different components of the lithographic apparatus. In an embodiment of the invention, control unit CU may include a processor that is configured to control the adjusting device AM and to modify the cross-sectional intensity distribution in the projection beam exiting the illuminator IL.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention encompasses embodiments wherein the radiation system Ex, IL is adapted to supply a projection beam of radiation having a wavelength of less than about 250 nm, such as with wavelengths of 248 nm, 193 nm, 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW and interferometer IF, the substrate table WT can be moved accurately, e.g., so as to position different target portions C in the path of the beam PB. Similarly, the first positioning device PM (not shown) can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in the following preferred modes:

In step mode, the mask table MT and the substrate table WT are kept essentially stationary, while an entire pattern imparted to the projection beam is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

In scan mode, the mask table MT and the substrate table WT are scanned synchronously while a pattern imparted to the projection beam is projected onto a target portion C (i.e., a single dynamic exposure). The velocity and direction of the substrate table WT relative to the mask table MT is determined by the (de)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT is kept essentially stationary holding a programmable patterning structure, and the substrate table WT is moved or scanned while a pattern imparted to the projection beam is projected onto a target portion C. In this mode, generally a pulsed radiation source is employed and the programmable patterning structure is updated as required after each movement of the substrate table WT or in between successive radiation pulses during a scan. This mode of operation can be readily applied to maskless lithography that utilizes a programmable patterning structure, such as a programmable mirror array of a type as referred to above.

Combinations and/or variations on the above described modes of use or entirely different modes of use may also be employed.

Figure 9:
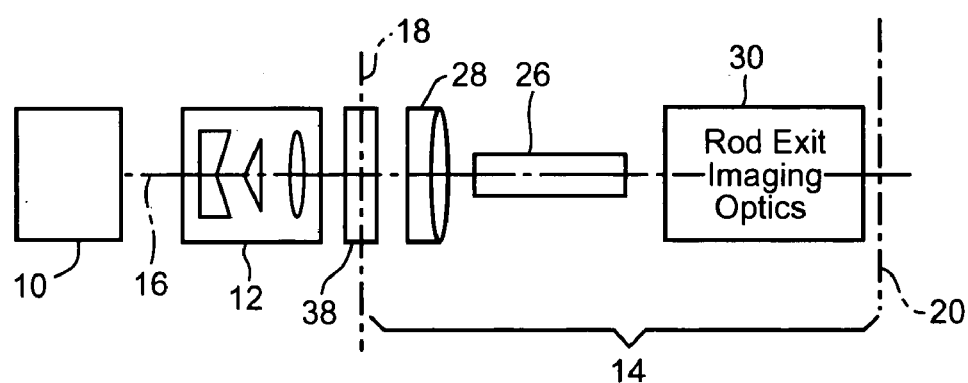
FIG. 9 is a schematic illustration of yet an illumination system.

Referring to FIG. 9, the illumination system may include light collecting/collimating optics 10; an axicon/zoom module 12; a multipole mode generating element 38; and light integrating and projecting optics 14. The components lie along optical axis 16 and are used to illuminate the mask MA located at a mask plane 20 which then produces an exposure pattern in resist on the wafer W via the projection system or lens PL. The illumination system illustrated in FIG. 9 includes a quartz rod light integrator 26. The optical axis 16 shown in FIG. 9 can be folded to produce a more compact illumination system.

An exemplary embodiment of the multipole mode generating element 38 is shown in FIG. 10a. The element 38 has four triangular blades 41, 42, 43, 44 insertable into the beam path at the pupil plane 18 and which form a Maltese cross 40, which is also referred to herein as a Maltese aperture blade (MAB). Each blade has an apex angle β. FIG. 10b shows the illumination intensity distribution resulting from the combination of an annular illumination mode produced by the axicon/zoom module 12 and the MAB 40. The distribution has four light beams or poles 45. This embodiment enables continuously variable quadrupole illumination modes to be produced. The radial position of each pole 45 can be varied by adjusting the axicon optics 22, the radial width of each pole can be varied by adjusting the zoom lens 24, and the tangential pole width can be changed by inserting another set of blades having a different apex angle β1, such as Maltese cross 40 shown in FIG. 11. By removing the blades altogether, the illumination system can be used for conventional and/or annular modes, again with continuous variation.

Interposing blades of a different apex angle permits the tangential pole width to be changed in discrete steps. According to another embodiment of the invention, the tangential pole width can be continuously varied by each arm of the Maltese cross comprising a stack of n blades, rotatable with respect to each other about the optical axis of the system where their vertices lie.

According to a further embodiment, just two blades are used as the multipole mode generating element 38 in an optical system which includes a light pipe, such as a rectangular quartz rod 26, as shown in the illumination system of FIG. 9. One of the blades is oriented parallel to the short side of the rectangular cross-section of the light pipe 26 and the other blade parallel to the long side. Due to the multiple reflections in the pipe 26, the resulting illumination mode is a mixture of annular and quadrupole. The two-blade system can produce an illumination mode including a quadruple component with lower energy-loss than the Maltese cross arrangement, as there are fewer blades obstructing the light beam. In one example the blades are triangular and are like two perpendicular arms of a Maltese cross, e.g., blades 41 and 42 shown in FIG. 10a. One or both of the blades in this embodiment can be a composite blade including a stack of smaller rotatable blades as described above.

Typically the blades are positioned along directions corresponding to orthogonal lines on the mask MA, so that the light poles 45 are located in each quadrant with centers 45° from the orthogonal lines. This orientation can produce optimal projection of the lines, particularly for dense structures, such as for DRAM-like structures. The orthogonal lines are generally referred to as horizontal and vertical. As pattern features decrease in size, light poles located in each quadrant with centers 90° from the orthogonal lines become more preferred. The optimal sigma for quadrupole illumination can be estimated from the formula:

$$\sigma=\lambda/(\sqrt{2}NA\bullet pitch),$$

and for dipole and 45° rotated quadrupole from:

$$\sigma=\lambda/(2NA\bullet pitch)$$

A further variation on the above embodiments using blades is to make all the blades rotatable about the optical axis 16 of the illumination system so that the position of the poles can be rotated.

Figure 12:
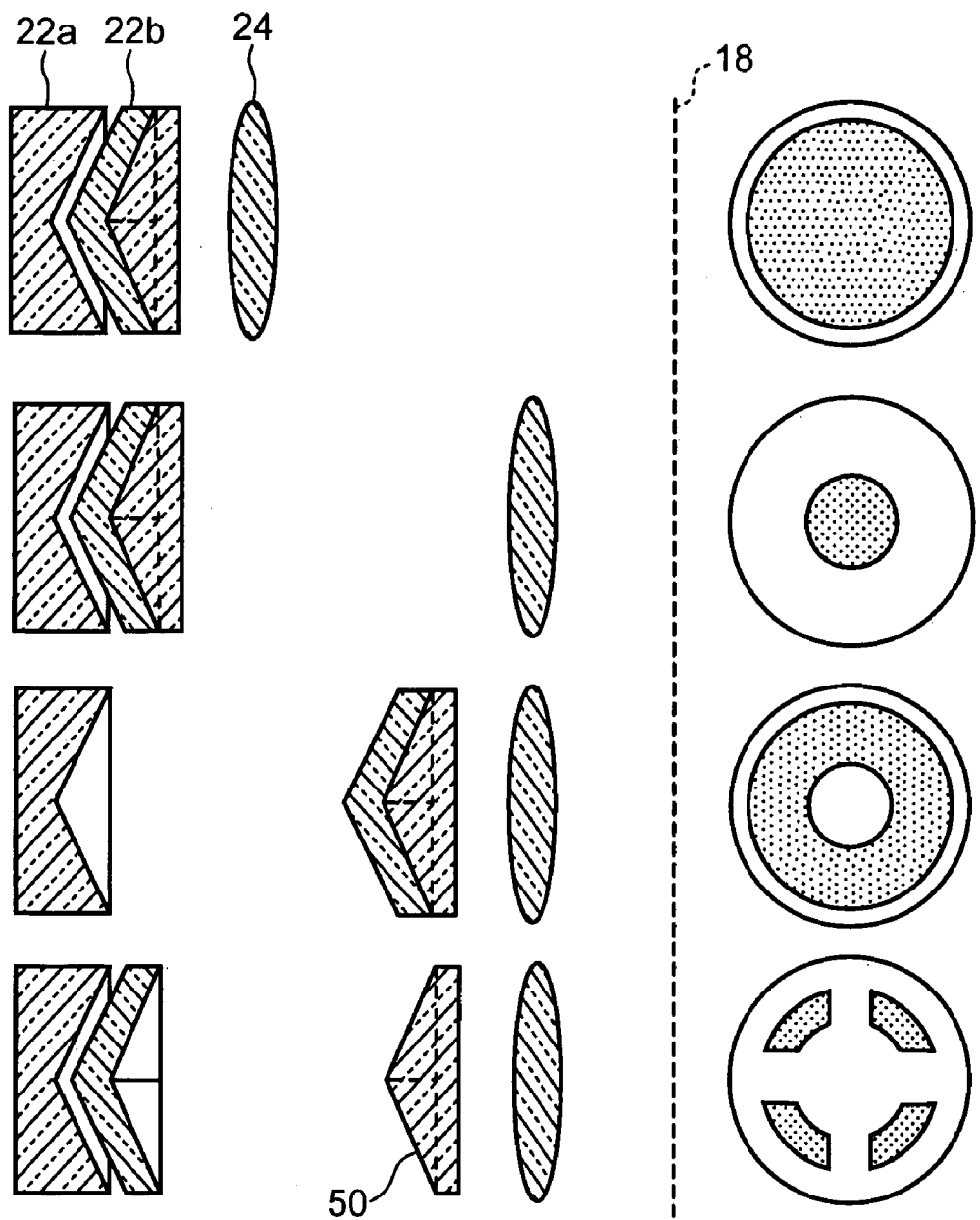
FIG. 12 is a schematic cross section illustration of another illumination system and the resulting illumination arrangements obtainable therewith.

Referring to FIG. 12, another exemplary embodiment of the present invention includes the axicon/zoom module with a pyramidal prism 50 as the multipole mode generating element. This also enables conventional, annular and quadrupole illumination to be produced with continuous variations of the modes. FIG. 12 shows the optical components of an axicon/zoom module. The right hand column in FIG. 12 shows the illumination intensity distributions at the pupil plane 18 for various positions of the axicon pair 22a, 22b and zoom lens 24. The axicon pair 22 comprises a pair of elements having conical surfaces, one concave 22a, one convex 22b, to produce circular and annular illumination patterns. The fourth row shows the effect of separating the pyramid-shaped prism 50 from convex element 22b. The side of the convex element 22b facing the pyramid 50 is concave pyramidal for receiving the pyramid 50. The convex element 22b and pyramid 50 comprise a second axicon also known as a pyramidal axicon or pyramidon. The pyramid-shaped prism 50 has a four-sided base, which consequently produces quadrupole mode illumination patterns, such as the four spots illustrated at the bottom in the right hand column in FIG. 12.

The axicon/zoom module of FIG. 12 allows the illumination mode to be varied continuously from conventional to annular or quadrupole. The zoom lens 24 sets the spot size or partial coherence factor, the axicon pair 22 determines the annularity, and the pyramid 50 determines the quadrupolarity. In addition, since light flux is redistributed rather than blocked, there is virtually no light loss, so that a high throughout can be maintained.

The method of the present invention allows for optimization of the illumination conditions of the lithographic apparatus by selecting an appropriate arrangement of the illuminator by computer simulation. In an embodiment of the invention, optimization of the conditions of illumination is achieved with a method including defining a lithographic pattern to be printed on the substrate, selecting a simulation model, selecting a grid of source points in a pupil plane of the illuminator, calculating separate responses for individual source points, each of the responses representing a result of a single or series of simulations using the simulation model, and adjusting an illumination arrangement of the illuminator based on analysis of accumulated results of the separate calculations.

Figure 13:
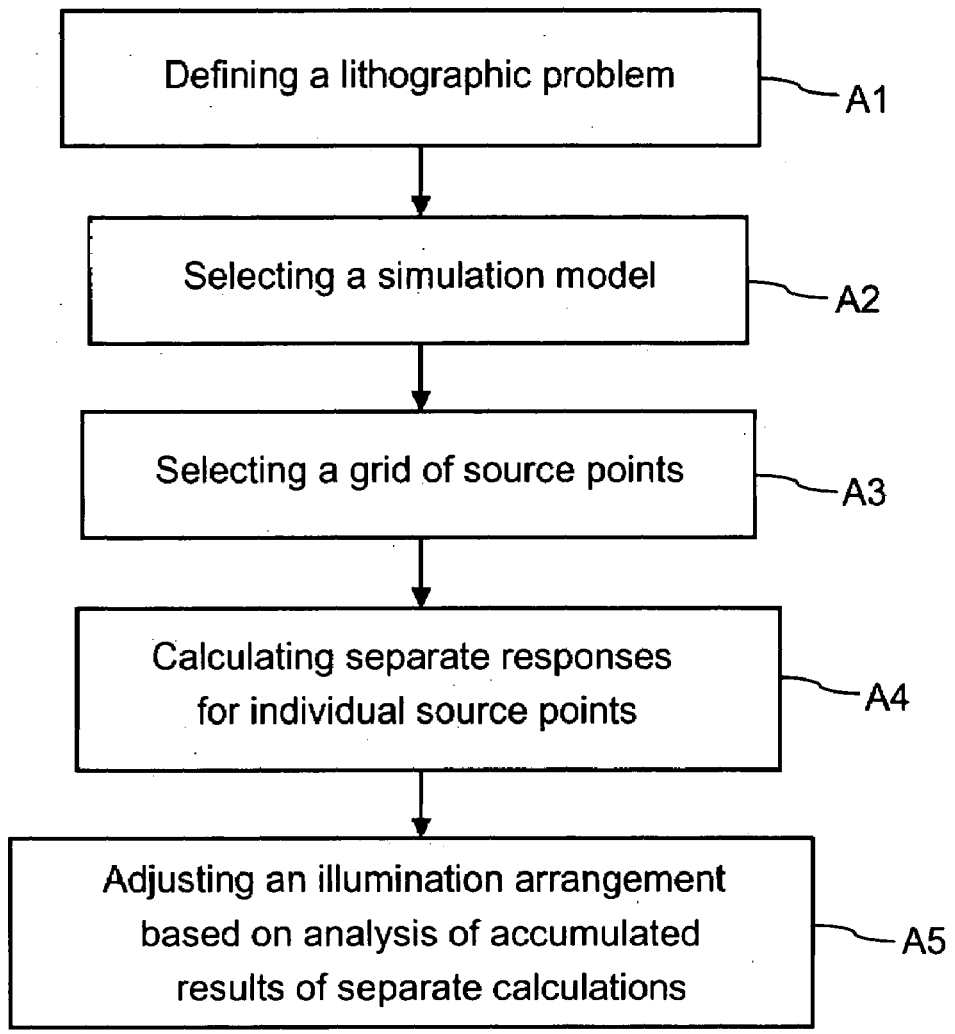
FIG. 13 is a flowchart illustrating a method for optimizing the illumination conditions of a lithographic projection apparatus in accordance with an embodiment of the present invention.

Referring to FIG. 13, an exemplary embodiment of a method for optimizing the conditions of illumination of a lithographic apparatus will now be explained.

The method begins in step (A1) where a lithographic problem is defined. The lithographic problem represents a particular pattern to be printed onto a substrate. This pattern, which is used to optimize the parameters of the lithographic apparatus and to choose a proper configuration of the illumination system, is preferably representative of an aggressive configuration included in the mask layout. This can be, for example, features with 1:1 to 1:20 line to space duty ratio or a pattern simultaneously grouping dense features and isolated features.

The method then proceeds to step (A2) where the simulation model that calculates the profile of the pattern is selected.

The simulation model may include in an embodiment of the invention an aerial image model. In that case, the distribution of the incident light energy distribution onto the photoresist will be calculated. Calculation of the aerial image may be done either in the scalar or vector form of the Fourier optics. Practically, this simulation may be carried out with the aid of a commercially available simulator such as Prolith™, Solid-C™ or the like. In this embodiment, the characteristics of the different elements of the lithographic apparatus, like the numerical aperture NA or specific patterns, may be entered as input parameters for the simulation.

The image calculated in this embodiment may be evaluated versus some predetermined criteria to judge whether the image has enough contrast to successfully print the desired feature in photoresist on the wafer. The aerial image can be analyzed, through a focus range, to provide estimates of the exposure latitude and DOF and the procedure can be performed iteratively to arrive at the best optical conditions. Practically, the quality of the aerial image may be determined by using a contrast or normalized aerial image log-slope (NILS) metric (normalized to the feature size). This value corresponds to the slope of the image intensity (or aerial image).

In this specific embodiment, key relevant parameters to run aerial image simulations may include the distance from the focal plane of the Gaussian image plane, meaning the distance to the plane where the best plane of focus exists, as determined by the geometrical ray optics, or the center wavelength of the quasi-monochromatic light source. These parameters may also include a measure of degree of spatial partial coherence of the illumination system, the numerical aperture of the lens system illuminating the semiconductor substrates, the aberrations of the optical system and a full description of the spatial transmission function representing the optical mask.

It should be understood that selection of the simulation model, in step (A2), is by no means limited to an aerial image model. Additional models like a Lumped Parameter Model or a Variable Threshold Resist model may also be used in other embodiments of the invention. In all these embodiments, the model is selected because it has been matched to experimental data.

It should also be understood that the use of simulation in step (A2) is not limited to the calculation of the resist profile and that simulations may be carried out to extract additional/complementary responses like process latitude, dense/isolated feature biases, side lobe printing and sensitivity to mask errors.

After defining the resist model and the key relevant parameters, the method then proceeds to step (A3) where a grid of source points, representing a discretization of the source beam, is defined in the pupil plane of the illuminator.

Figure 8:
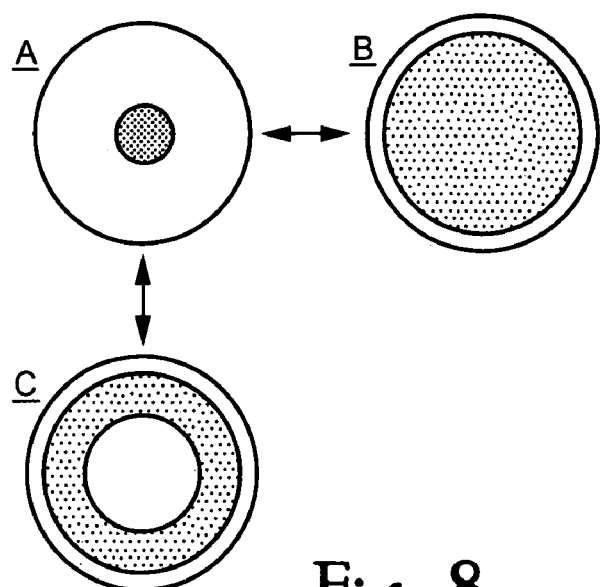
FIG. 8 is a schematic illustration of illumination arrangements obtainable with the illumination systems of FIGS. 6 and 7.
Figure 15:
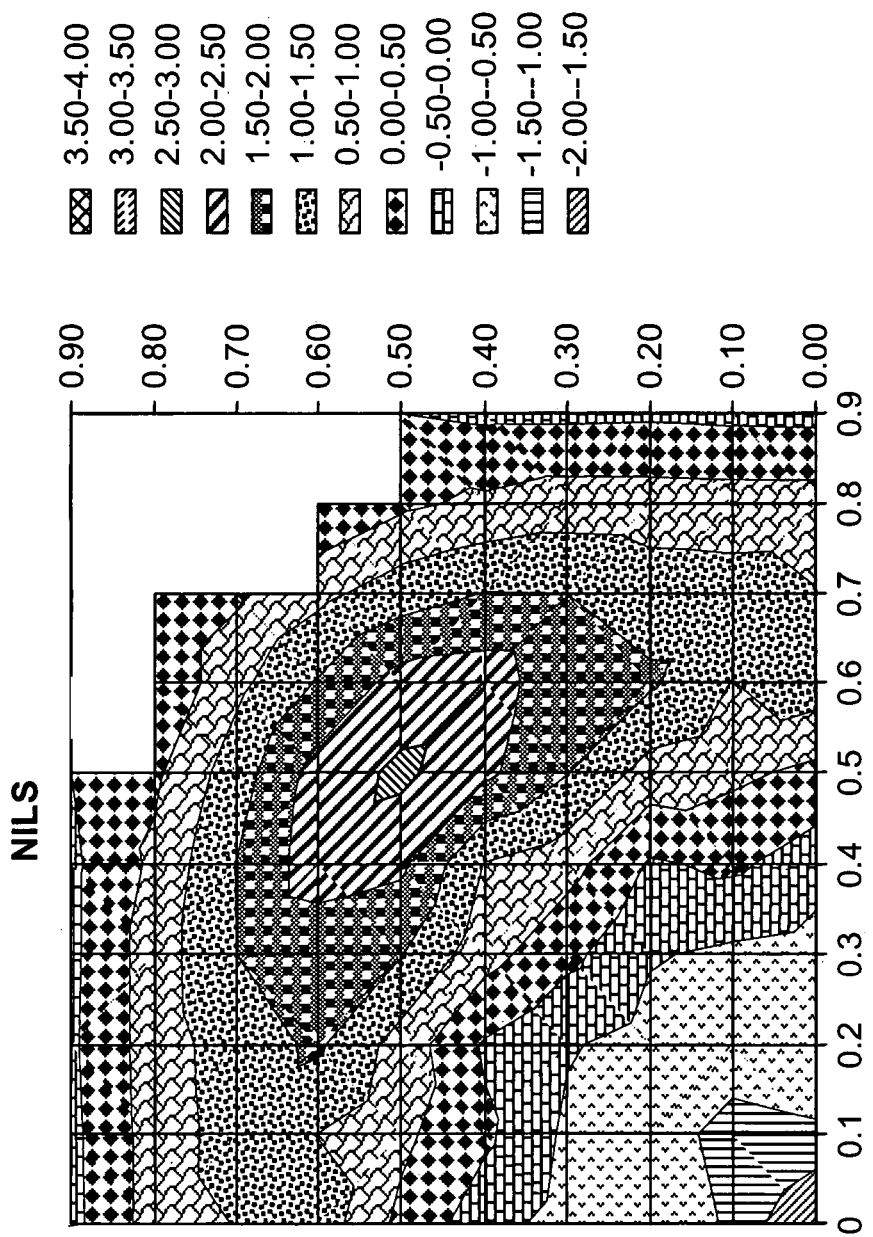
FIG. 15 is a contour map illustrating the value of the normalized aerial image log-slope (NILS) as a function of source point location for a specific lithographic pattern (65 nm isolated lines printed with a Chromeless Phase Lithography mask)

More specifically, illumination files, each representing an individual grid point, are generated and loaded in the simulation software. The light source points contained in the files form a light source point grid that spatially covers the entire cross-section of the illuminator at the pupil plane 18 of the illumination system shown in FIGS. 7–9. The response of the lithographic projection apparatus is calculated for each grid point. The results of the individual responses may be plotted on a contour map, such as shown in FIG. 15. Quantitative analysis of the individual source point results allows comparison of different trial illumination arrangements to determine an optimal illumination arrangement.

The physical location of each light source point relative to the full illuminator aperture is set in the individual source points file and can be varied depending on the degree of accuracy desired. A small spacing between each light source point will provide more detailed information on the source response but may notably increase the calculation time. Conversely, a large spacing between each light source point may provide less accurate information on the source response but will significantly decrease the calculation time. In an embodiment of the invention, the spacing of the grid relative to the full illuminator aperture is approximately 0.1. In other embodiments, the grid spacing is approximately 0.01 to 0.2.

Figure 14A:
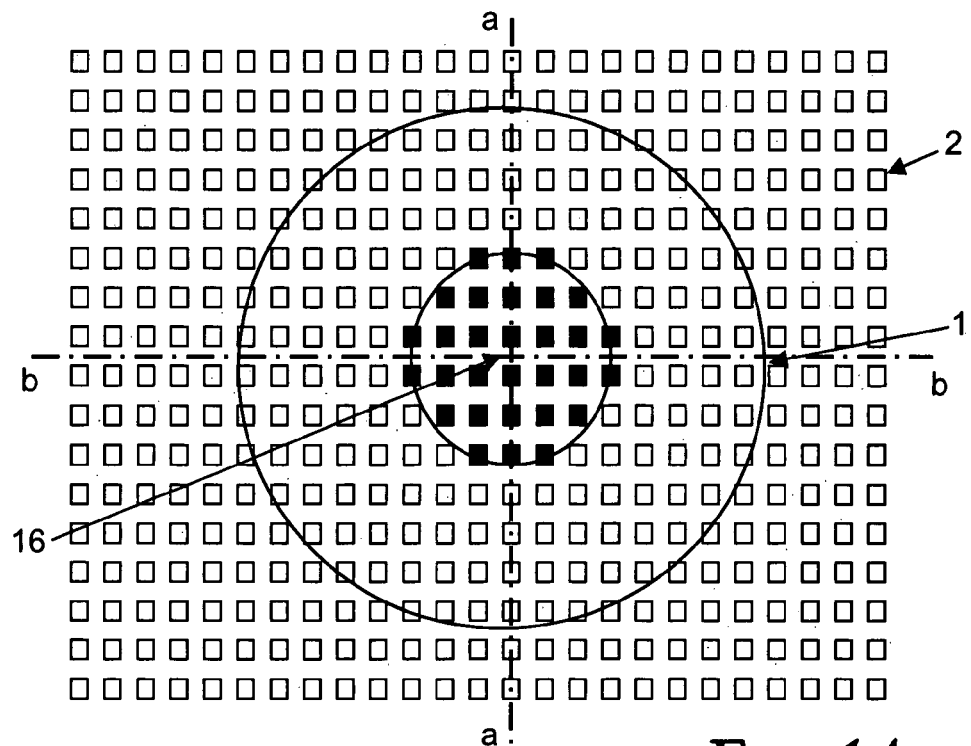
FIG. 14(a) is a schematic representation of a cross section of the illuminator with a low sigma illumination arrangement.
Figure 14B:
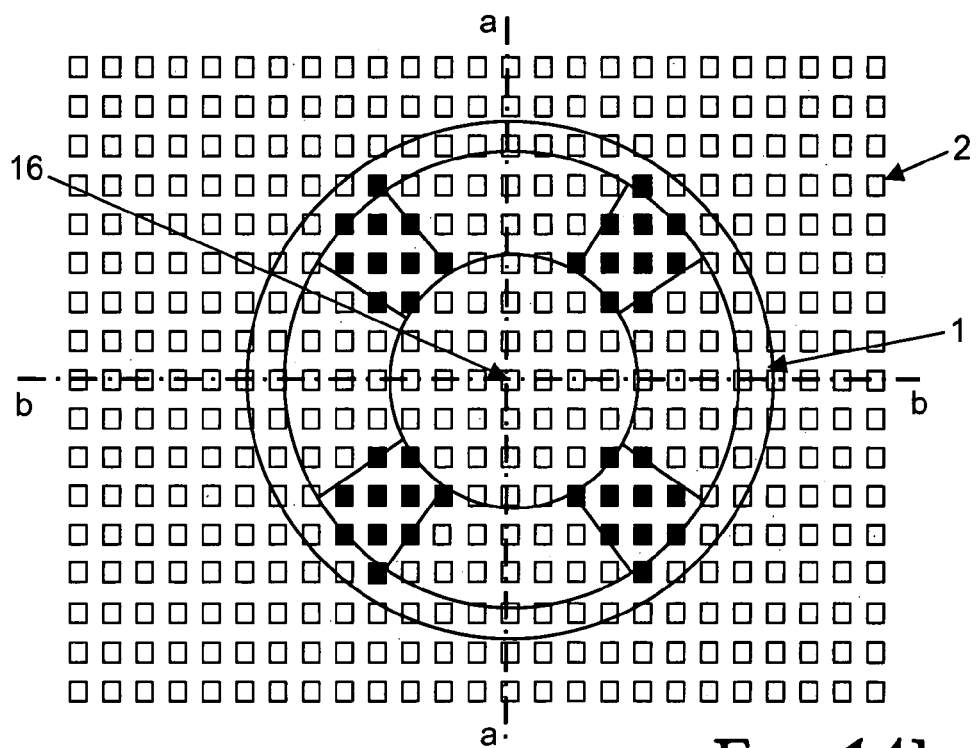
FIG. 14(b) is a schematic representation of a cross section of the illuminator with a quasar arrangement.

Referring to FIGS. 14(a) and 14(b), a schematic representation of a cross section of the illuminator on which a grid of source points has been overlaid is illustrated. In the present invention, the response of the projection lithographic apparatus is calculated for each grid point. The perimeter of the cross section of the illuminator is represented by circle 1, which delineates the contour of the full illuminator aperture (maximum numerical aperture). The light source grid 2 is also represented in these figures.

In an embodiment of the present invention, in order to estimate how a trial illuminator, i.e., an illuminator considered for use and configurable with the lithographic projection apparatus, will perform, the trial illuminator pattern is overlaid on the grid and the calculated responses are averaged in some way over the included grid points. FIG. 14(a) illustrates an intensity of a projection beam having a circular distribution while FIG. 14(b) illustrates an intensity of a projection beam having a quasar distribution.

It should be understood that the grid of source points may be defined differently in other embodiments of the invention. For example, as an alternative to illumination files, the grid of source points may be specified parametrically in the simulation software.

Still referring to FIG. 13, the method for optimizing an illumination source of a lithographic projection apparatus proceeds to step (A4) where separate responses are calculated for each grid source point.

More specifically, each of the separate responses will represent a result or series of results of simulations using the simulation models. Potential responses may include, for example, a critical dimension of the pattern studied or an intensity threshold necessary to define the target CD on the substrate. In another embodiment of the present invention, other responses may include the depth of focus (DOF), the exposure latitude (EL), the depth of focus at 8% EL (DOF@8% EL), the dose-to-size $E_{1:1}$, dense to isolated feature bias, arbitrary feature size biases, sidelobe printing, film loss, sidewall angle, mask error enhancement factor (MEEF), linear resolution, or absolute resolution.

In order to aid in the optimization of the illumination conditions, the results of the calculations can then be visualized by plotting the contour map of the responses as a function of source point location.

Referring to FIG. 15, an exemplary embodiment of a contour map obtained in accordance with the method of the present invention is provided. FIG. 15 corresponds to the upper right hand of the illuminator at the pupil plane 18. As can be seen in this figure, the source point grid has a 0.1:0.1 spacing relative to the full aperture of the illuminator. For symmetry reasons, only the upper right hand quadrant of the illuminator need be visualized.

The lithographic problem studied is a pattern of 65 nm isolated lines printed with a Chromeless Phase Lithography (CPL) mask. In this embodiment, the wavelength of the projection beam is 193 nm and the numerical aperture of the lithographic projection apparatus is 0.85 NA. Simulations are performed with a 0.2 μm defocus.

In the embodiment illustrated in FIG. 15, the response studied is the Normalized aerial Image Log Slope (NILS), which corresponds to the log of the slope of the intensity image (or aerial image). As can be seen in FIG. 15, the contour map represents the value of NILS obtained on the wafer as a function of the source point position in the illuminator. It is shown that only the source points located at approximately 45° (relative to the line orientation on the mask) and a radius of 0.7 to 0.8 have a significant contribution to greater value of NILS and, therefore, to the depth of focus. Illumination emanating from this region is favorable for printing the isolated lines and illumination from outside this region is not favorable. It is therefore expected that the process window for this particular lithographic problem will be maximized with a quasar arrangement. The performance of this quasar arrangement can then be determined, for example, by averaging the responses due to the individual source points captured by the illuminator.

Referring back to FIG. 13, the method for optimizing the conditions of illumination of a lithographic projection apparatus proceeds to step (A5) where the illumination conditions of the illuminator are adjusted based on analysis of the responses. In an embodiment of the present invention, this is done, for example, by varying the positions of the axicon pair 22a, 22b and zoom lens 24 shown in FIG. 12. The adjusting of the illuminator may be carried out, in an embodiment of the invention, with the control unit CU.

It should be understood that, in case the performance of a trial illuminator need be estimated, calculation of the responses is performed for the source points captured by the aperture of the illuminator. These source points are schematically represented by the black dots in FIGS. 14(a) and 14(b). In this particular case, the performance of the illuminator may be determined, for example, by averaging the responses due to these captured individual source points.

Figure 16:
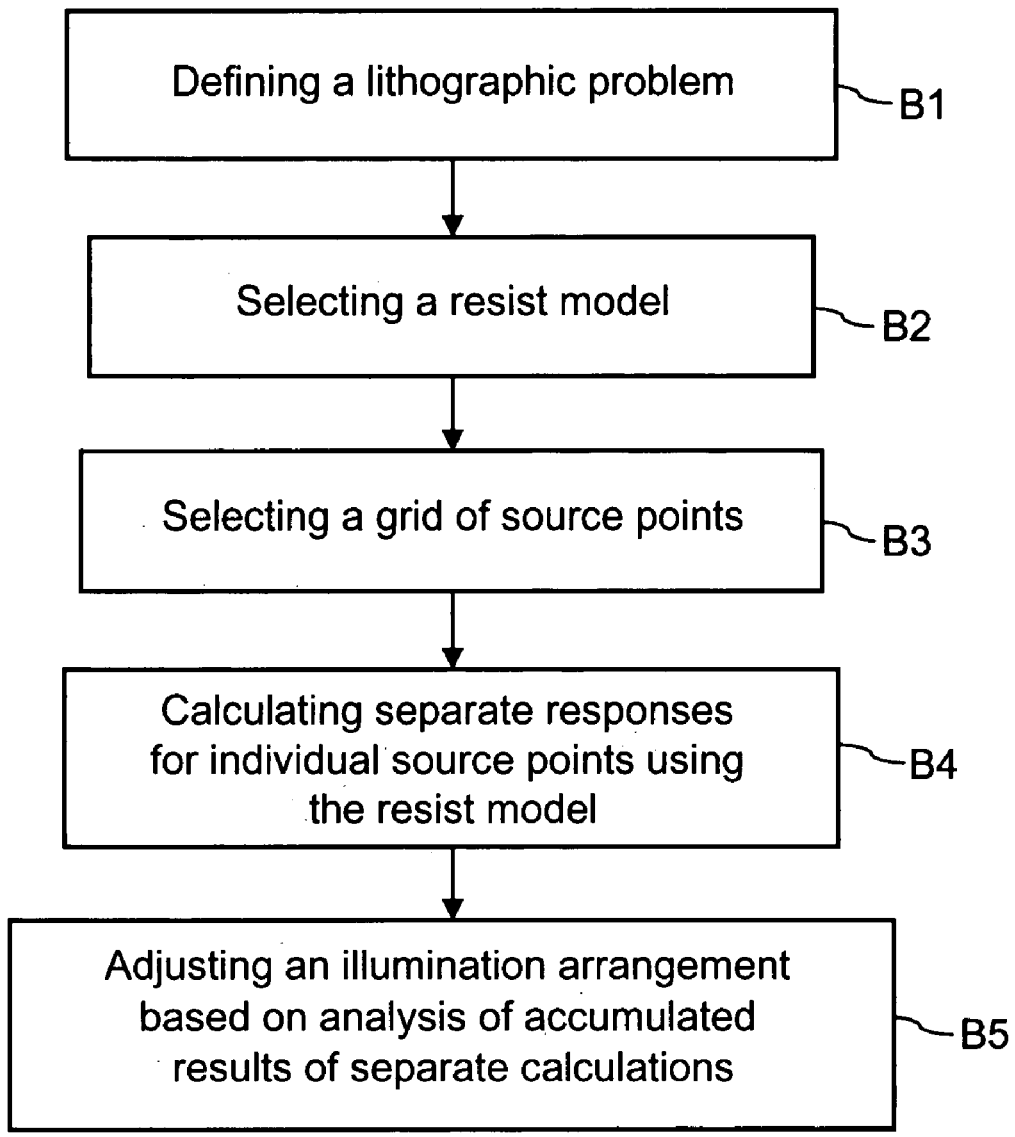
FIG. 16 is a flowchart illustrating a method for optimizing the conditions of illumination of a lithographic projection apparatus according to an embodiment of the invention.

Referring to FIG. 16, a method for optimizing the conditions of illumination of lithographic projection apparatus according to an embodiment of the invention will now be explained. In this embodiment of the invention, optimization of the conditions of illumination is achieved by computer simulation using full resist calculation with a method including defining a lithographic problem, selecting a resist model, selecting a grid of source points, calculating separate responses for individual source points, each of the responses representing a result of a single or series of simulations using the simulation model, and adjusting an illumination arrangement based on analysis of accumulated results of separate calculations.

As shown previously, it is possible to define the best illumination conditions of the illuminator and to select an appropriate design of aperture by simulating the incident light energy distribution onto the photoresist surface. This quantity is defined as aerial image, in reference to the fact that the intensity of the light is in a plane at the top of the photoresist, prior to entering into the resist. The calculated image can then be evaluated versus some predetermined criteria to judge whether the image has enough contrast to successfully print the desired feature in photoresist on the wafer. The aerial image can be analyzed to provide estimates of the exposure latitude and depth of focus and the procedure can be performed iteratively to arrive at the best optical conditions.

As also shown previously, the quality of the aerial image may be determined by using a normalized aerial image log-slope (NILS) metric (normalized to the feature size). This value corresponds to the log of the slope of the intensity image (or aerial image). In this approach, the best illumination setting or shape may be determined using an analysis of aerial image metrics (e.g., NILS or contrast) at some fixed defocus value. The best lithographic process latitude may be found when the aerial image quality is high.

In order to simulate the aerial image of the mask pattern, the parameters of the different elements of the photolithographic apparatus are required as input parameters in the simulation programs. These parameters typically include geometric parameters of the projection system and the illuminator, and optical parameters such as the numerical aperture NA of the projection system and the partial coherence factor σ of the photolithographic apparatus. Although many parameters may be required to adequately determine the profile of the aerial image at the top of the photoresist, the theory used to calculate the image is well developed and is based on the Fourier optics either in its scalar or vector form.

A "pure aerial image" approach may not, however, accurately predict the final image printed onto the substrate. This is due to the fact that this approach disregards the effects of the image receiver, i.e., the photoresist. The interaction of the electromagnetic field with the photoresist, also referred to as the vector effects, and the physical and chemical characteristics of the resist, for example, are not accounted for in the calculation. Basically, in order to match the predictions of the aerial image calculations that use a fixed intensity threshold to determine the printed CD, the photoresist would have to exhibit inifinite dissolution contrast with zero diffusion of the photo-generated species. Unfortunately, such photoresist processes do not exist. An accurate photoresist simulation model includes the effects associated with diffusion of the active species (which "smear" the projected optical image) and the finite dissolution contrast of the real photoresist, and gives predictions which match experiment. The reasons for differences between aerial image predictions and real resist processes, and some of their characteristics, is discussed in "The Resist Vector: Connecting the Aerial Image to Reality," Proc. SPIE, Vol. 4690, p. 366 (2002), the entire contents of which are incorporated herein by reference.

Therefore, in order to accurately predict the process window of a lithographic process or to select the best illumination arrangement, a full resist calculation may be desirable. Ideally, this calculation should take into account the steps of photoresist exposure, photoresist baking (PEB) and photoresist developing. Photoresist exposure occurs when the projection beam changes the chemical nature of the resist by activating the molecules of the resist material. Depending on the nature of the resist, i.e., conventional i-line resist or chemically amplified resist, different models can be used to simulate the interaction between the projection beam and the resist material and to calculate the change of the absorption coefficient of the resist material.

The method begins in (B1) where a lithographic problem is defined. The lithographic problem may represent a particular geometry of a pattern to be printed onto a wafer.

The method then proceeds to step (B2) where a resist process to be used to print the pattern is defined, modeled and loaded in the simulation software, such as Prolith™, Solid-C™ or the like. Preferably, the resist model should take into account, in the calculation of the resist's critical dimension (or size) and its variation with variables such as dose and focus, the photoresist exposure, the photoresist baking and the photoresist developing. Other responses, such as dense/isolated feature biases, side lobe printing and mask error enhancement factors, may be defined and modeled by the simulation software.

Likewise, the resist model chosen in (B2) may take into account, in an embodiment of the invention, the scattering of the electromagnetic field caused by the inhomogeneity of the resist, a nonplanar topography and the vector effects. The vector effects refer to the fact that the electromagnetic wave propagates obliquely when high numerical apertures are used. Although these vector effects can be accounted for when calculating the aerial image, a calculation of the vector effects in air greatly overestimates the contrast loss obtained on the wafer. This is due to the fact that the incident rays tend to be straightened when they propagate in the resist because of the resist's refractive index. Therefore, a resist model with a rigorous electromagnetic calculation may be preferable to accurately determine the resist response.

The choice of the resist model in (B2) may also take into account, in an embodiment of the invention, the photoresist baking. A post exposure bake may be used prior to developing the resist pattern. Besides removing the solvent, this allows the regions of high concentration in the photoactive compound to be diffused into the regions of low concentration, thereby smoothing out standing wave patterns. A classical diffusion process may be used to model this baking process. Alternatively, other models accounting for the non-linear diffusion effects may also be used in another embodiment of the invention.

The method then proceeds to step (B3) where illumination files, each representing an individual grid point, are generated and loaded in the simulation software. The light source points contained in the files form a light source point grid that spatially covers the entire cross-section of the illuminator at the pupil plane 18 of the illumination system shown in FIGS. 7 and 9.

The method then proceeds to step (B4) where separate responses are calculated for individual source points using a full resist calculation. In the embodiment of the invention represented in FIG. 16, each of the separate responses may represent a result or series of a single or series of simulations using the simulation model. The responses studied may include, for example, the Depth of Focus (DOF), the Exposure Latitude (EL), Depth of Focus at 8% of Exposure Latitude (DOF@8% EL), the dose-to-size $E_{1:1}$, dense to isolated feature bias, arbitrary feature biases, sidelobe printing, film loss, sidewall angle, Mask Error Enhancement Factor (MEEF), linear resolution, or absolute resolution. These responses can also be visualized by plotting the contour map of the results as a function of the source location.

Figure 17:
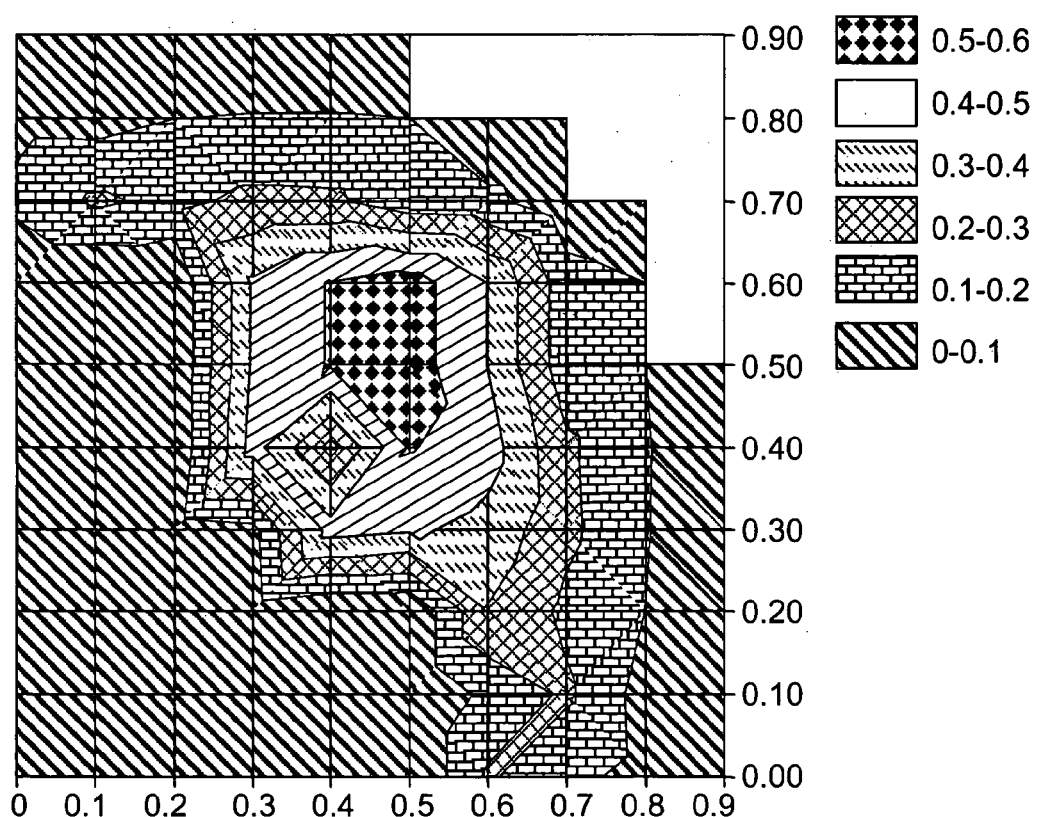
FIG. 17 is a contour map obtained with the method described in FIG. 16.

Referring to FIG. 17, an example of a contour map obtained with this method is shown. This figure represents the upper right hand quadrant of the illuminator at the pupil plane 18. The response visualized is the depth of focus in microns. As shown in FIG. 17, the source point grid has a 0.1:0.1 spacing relative to the full aperture of the illuminator. The lithographic problem studied was a pattern of 65 nm isolated lines printed with a chromeless phase lithography (CPL) mask, a 0.85 NA and 193 nm radiation. For symmetry reasons, only the upper right hand quadrant of the illuminator need be visualized. This contour map represents the depth of focus obtained on the wafer as a function of the source point position in the illuminator. It is shown that only the source points located at approximately 45° (relative to the line orientation on the mask) and a radius of approximately 0.5 to 0.8 have a significant contribution to the depth of focus. Illumination emanating from this region is favorable for printing the isolated lines and illumination from outside this region is not favorable. It is also shown that a maximum depth of focus of about 0.5 to 0.6 μm is expected with the best quasar arrangement. Similar contour maps may be obtained for the exposure latitude and the dose-to-size $E_{1:1}$.

After calculating the separate responses for the individual source points, the method then proceeds to step (B5) where the illumination arrangement is adjusted based on an analysis of the accumulated results of the separate calculations. The performance of the best arrangement can be determined, for example, by averaging the responses captured by the actual illuminator being considered.

Figure 18:
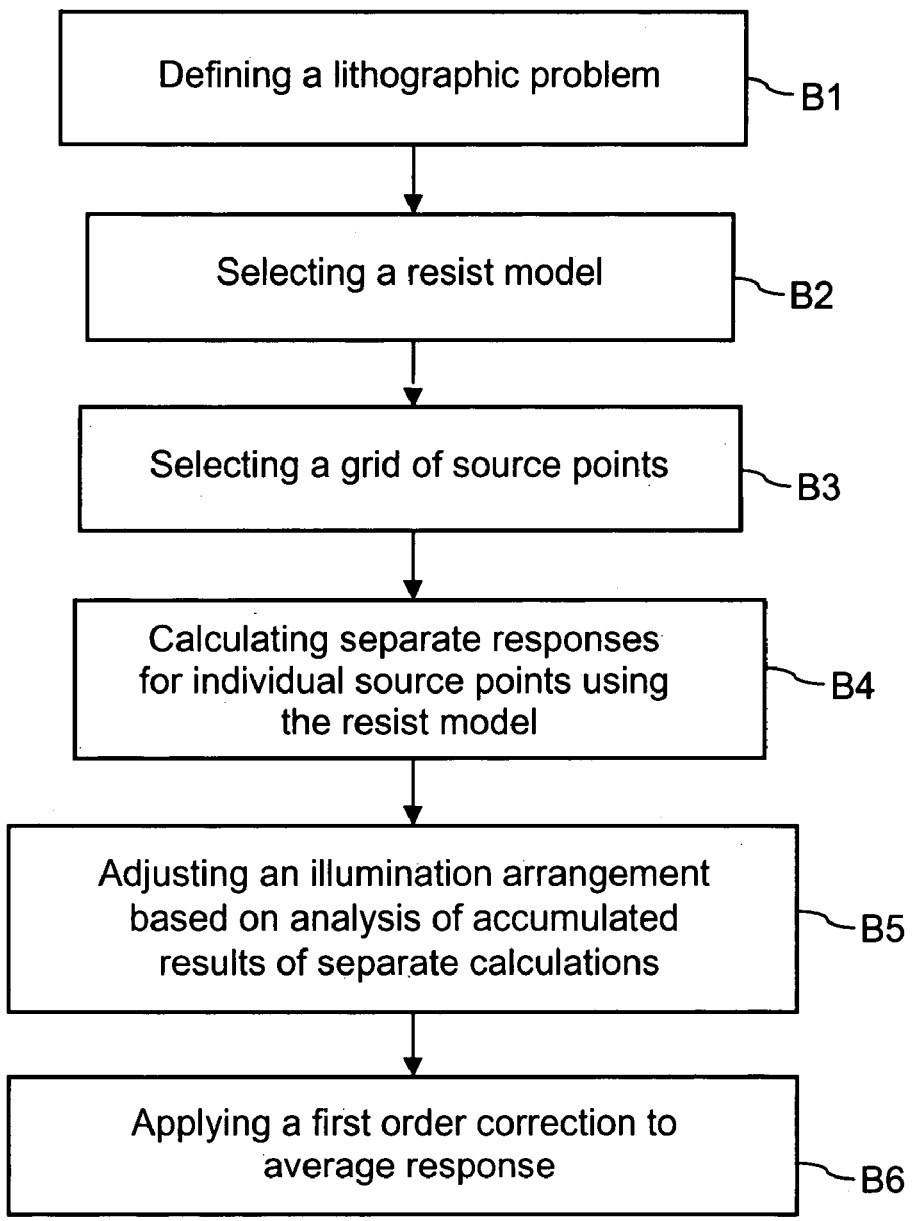
FIG. 18 is a flowchart illustrating a method for optimizing the conditions of illumination according to an embodiment of the invention.

Referring to FIG. 18, an exemplary embodiment of a method for obtaining a refined process window of a lithographic problem will now be explained. In this embodiment, the method begins in (B1) and proceeds to step (B5) in the same way as in the embodiment shown in FIG. 16. The method then proceeds to (B6) where a first order dose correction is applied to the average value of the responses. The first order correction may be done by a simple average, i.e., by counting the points included in the circle 1. The first order correction may also be done by interpolation to make extra grid points. In a preferred embodiment, the first order correction may still also be done by a weighting of the points based on their calculated sizing doses, i.e., by dose weighted averaging. The lithographic projection apparatus may use only one dose. The calculations, however, may determine a best dose for each individual grid point. Even if a point included in the circle 1 provides a good individual response, if its dose is not close to the one provided by the lithographic projection apparatus it does not contribute favorably to the response obtained with the real illuminator. Individual points may thus be weighted on the basis of the difference between their individual dose and the dose of the lithographic projection apparatus. Those points having smaller differences are weighted higher than points having larger differences. The first order correction may also be done by a combination of interpolation and dose weighted averaging.

In an embodiment of the invention, the refined values are obtained by increasing the number of points contained within the aperture. This is done by diminishing the spacing between the source points. In another embodiment of the invention, a linearly interpolated grid may be used in combination with a smaller grid spacing. The interpolated grid provides a smoother averaging process by providing a "higher resolution" grid that reduces numerical errors caused by slight movement of the trial illuminator changing the specific source points captured.

While a first order correction has been applied to the average response calculated with the method illustrated in FIG. 16, i.e., using a full resist calculation, it should be understood that a similar approach may be pursued in the method illustrated in FIGS. 13, 24, 37, 47 and 55.

Figure 19:
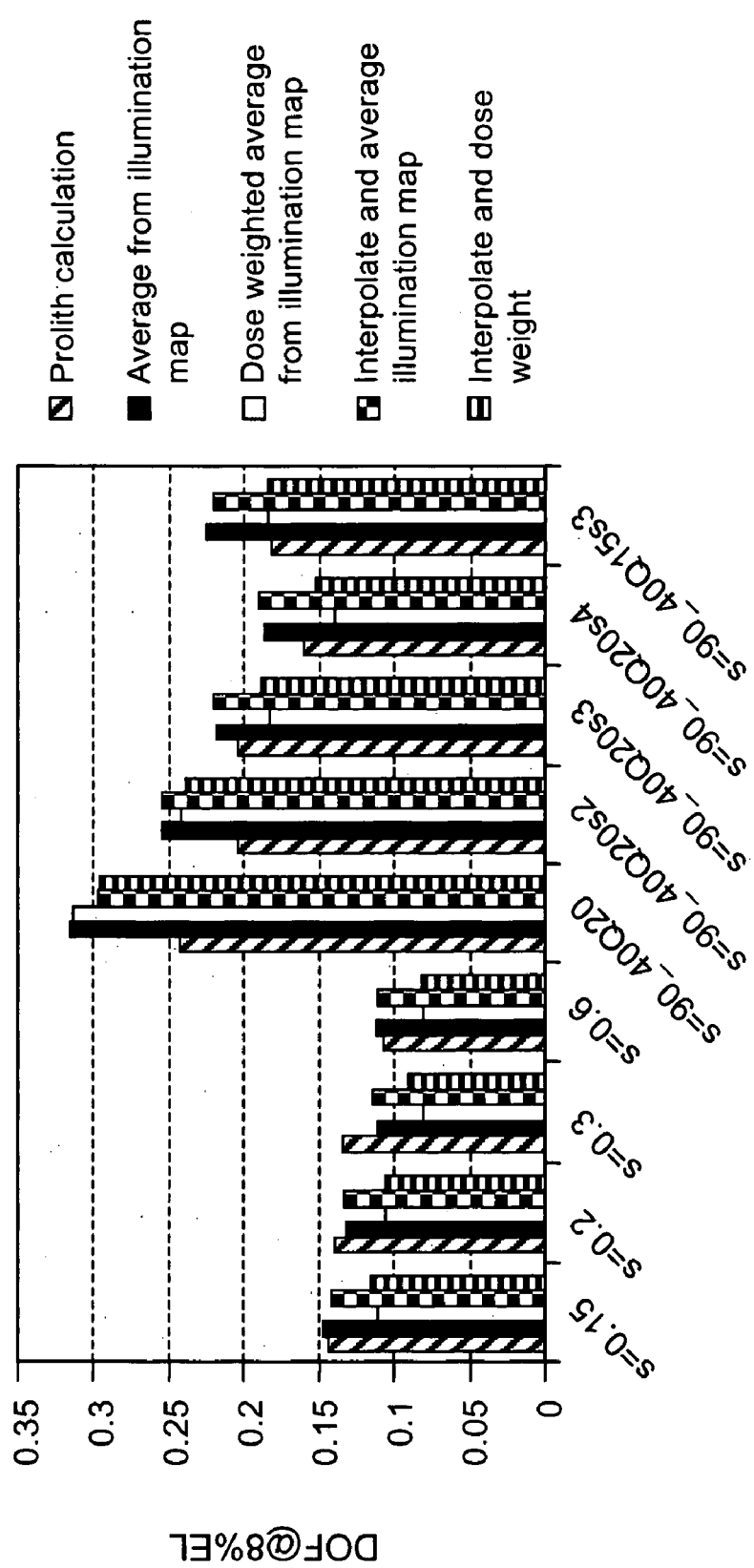
FIG. 19 is a diagram comparing Depth of Focus (DOF) values simulated with various trial illumination conditions to DOF values obtained with the methods described in FIGS. 16 and 18.

Referring to FIG. 19, simulations obtained with a commercial simulation software using a full resist calculation are compared to calculations obtained with the methods described in FIGS. 16 and 18. Calculation is done for several embodiments set forth above. That is, the depth of focus is calculated either using the DOF value of individual source points (method of FIG. 16, "average from illum. map"), a first order dose correction ("dose weighted avg. from illum. map"), an interpolated grid ("interpolated and avg. illum. map") or a combination of an interpolated grid and a first order dose correction ("interpolate and dose weight").

Figure 20:
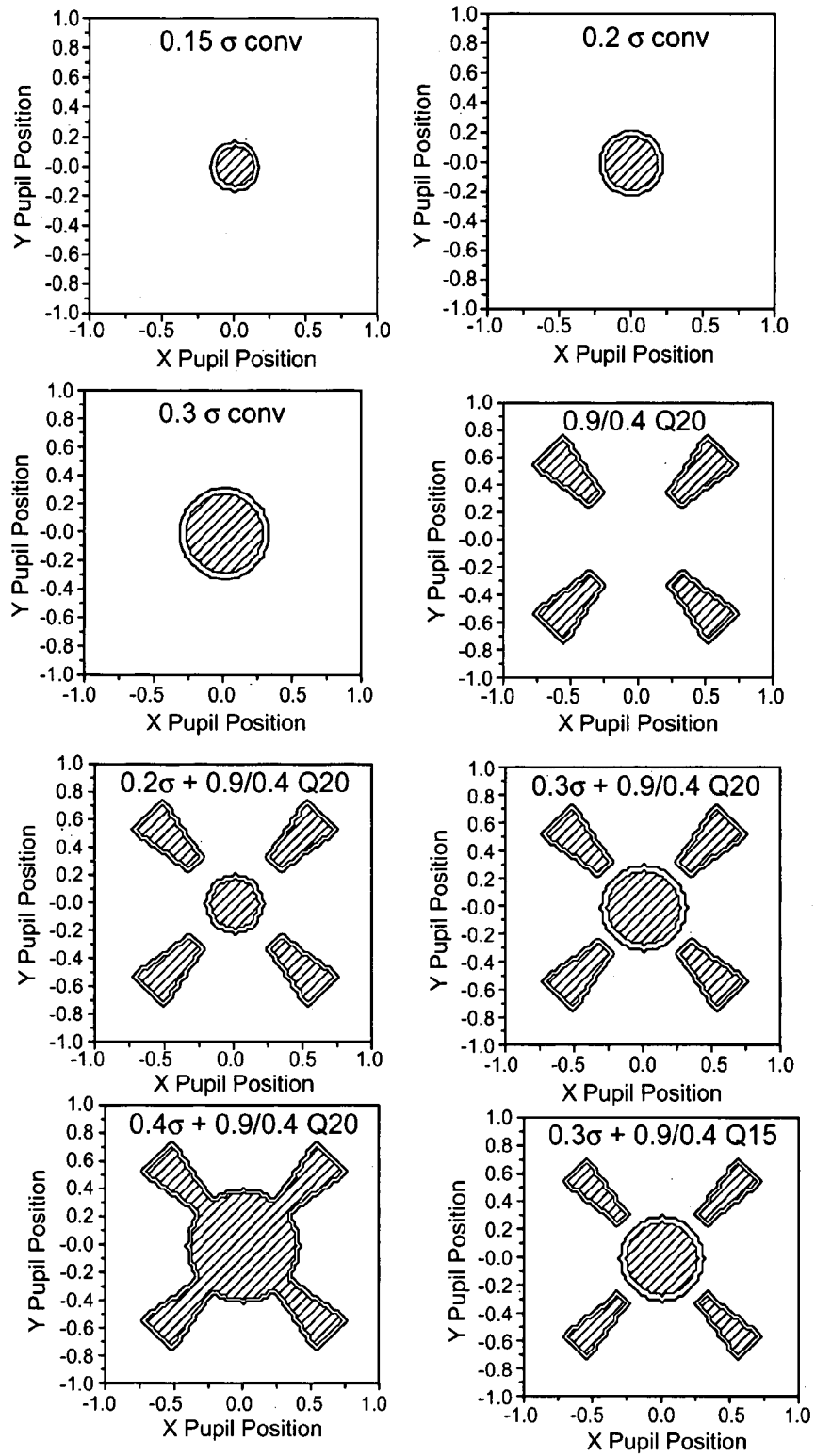
FIG. 20 is a schematic representation of the several illumination arrangements used in FIG. 19.

The bars in the diagram represent the value of the depth of focus (with a simultaneous 8% exposure latitude constraint) obtained with several arrangements of illuminator. FIG. 20 represents the different arrangements used in this trial. The cross section of the projection beam at the pupil plane 18 is shown for each illuminator. These different illumination arrangements can be obtained, for example, by appropriate adjustment of the multipole generating element 38 in FIG. 9.

The lithographic problem studied in this trial corresponds to a pattern of 80 nm holes with a 200 nm pitch. Simulations of the hole size in resist are made with a commercial software (Prolith™) using full illuminator calculations and the results are compared to the averaged results of the grid simulations. The comparison of the different averaging approaches discussed above to the calculations obtained with the trial illuminator allow a quantitative analysis of the accuracy of the averaging methods and selection of the best illuminator. As averaging calculated grid points requires less time than running simulations of various trial illuminators, the present invention can more quickly determine the best illuminator for a particular lithographic problem.

FIG. 19 indicates that both the lengthy Prolith™ calculation and the calculations obtained with the methods described in FIGS. 16 and 18 concur in the choice of dose weighted interpolation for the best illuminator.

Referring to FIG. 21, predictions of the DOF value (simultaneously constrained to at least 8% exposure latitude) based on the weighted and interpolated source measurements are compared to the prediction obtained with Prolith™. The comparison is made for several trial illuminators (shown in FIG. 18). Data indicate that predictions obtained with the method of the present invention satisfactorily match the prediction obtained with Prolith™. These results point out that the method of the present invention favorably match the predictions obtained with the actual illuminator and used for source selection, optimization, and design.

Figure 22:
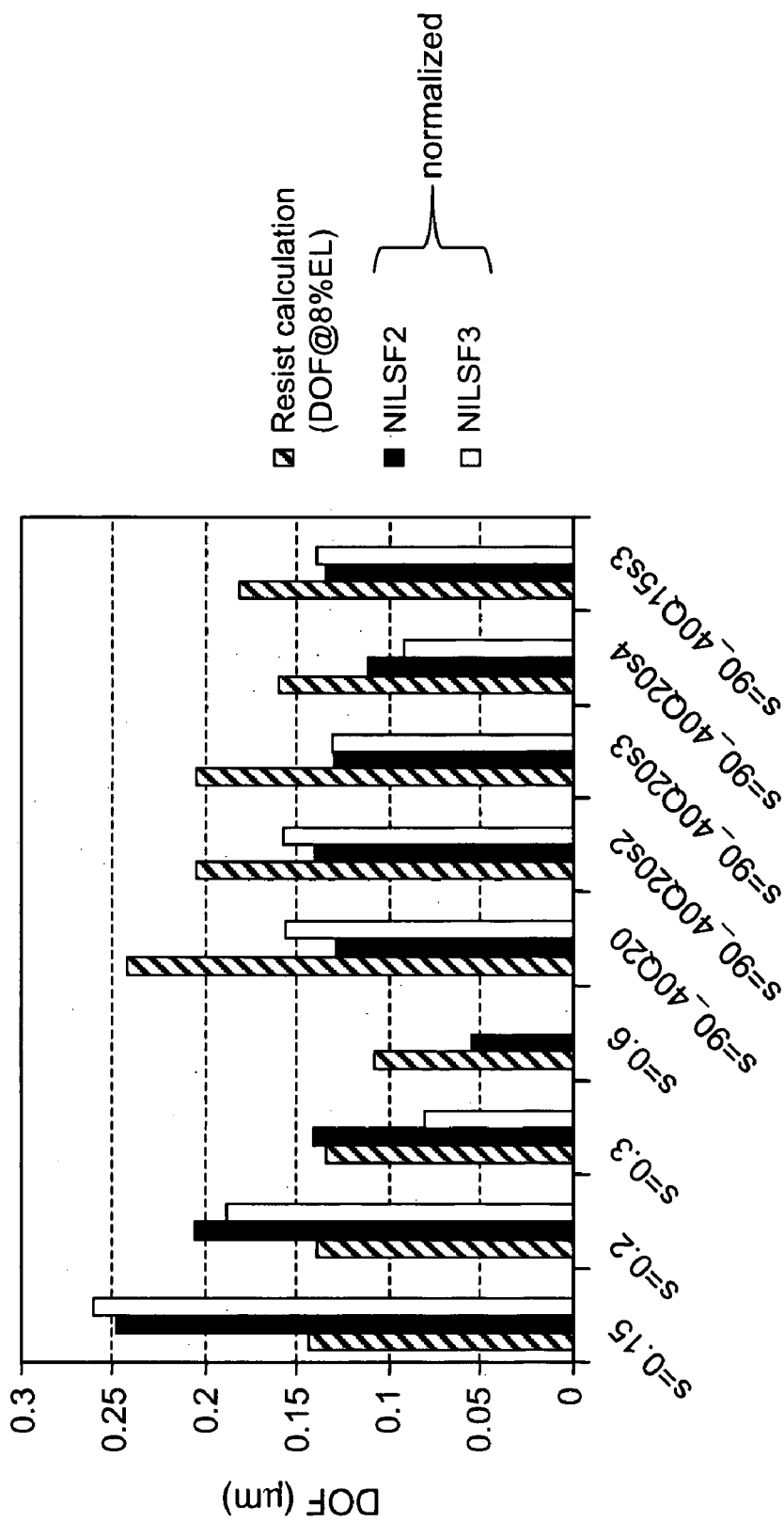
FIG. 22 is a diagram comparing DOF values obtained with a commercial simulation software using full illuminator calculation to DOF values obtained with the methods described in FIGS. 16 and 18 for the illumination arrangements shown in FIG. 20.

Referring to FIG. 22, predictions obtained with a full resist calculation (according to the method described in FIG. 16) are compared to the predictions obtained with a scalar aerial image metric at different defocus values (NILSF2 and NILSF3). The defocus used for maximizing the process window and determining the best illumination conditions are 0.2 μm (NILSF2) and 0.3 μm (NILSF3). The lithographic problem studied is the same as above and corresponds to a pattern of 80 nm holes with a 200 nm pitch and the trial illuminators used are identical to those described in FIG. 20. Results indicate that the aerial image metrics predict the best illuminator to a lesser extent.

Figure 23:
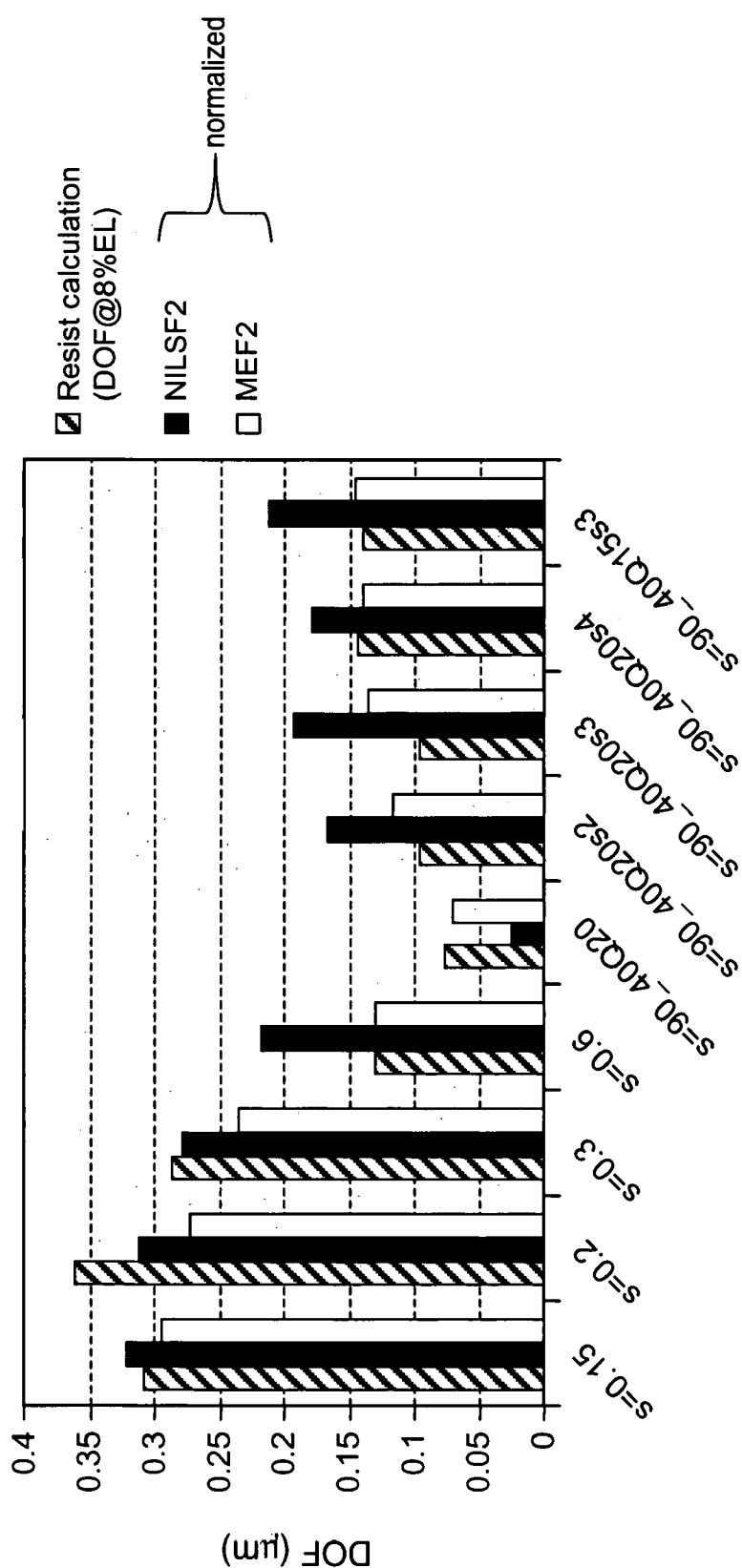
FIG. 23 is a diagram comparing DOF values obtained with a commercial simulation software using full illuminator calculation to DOF values obtained with the methods described in FIGS. 16 and 18 for the illumination arrangements shown in FIG. 20.

Referring to FIG. 23, a similar trial as in FIG. 22 is carried out for a different lithographic problem. The lithographic problem studied in this trial corresponds to a pattern of 80 nm holes with a 300 nm pitch. Both NILS and aerial image intensity at the mask edge MEF2 (i.e., with a 0.2 μm defocus) miss the best illuminator predicted by the full resist simulations.

Results in the trials described in FIGS. 22 and 23 indicate that NILS measurements, which may be used to maximize the process window, less precisely predict the best illumination conditions and further do not quantitatively predict the process window. The fall off in accuracy is expected to be worse as NA increases (stronger vector effects) and for certain processes which have moderate contrast and print far away from the aerial image limit.

Figure 24:
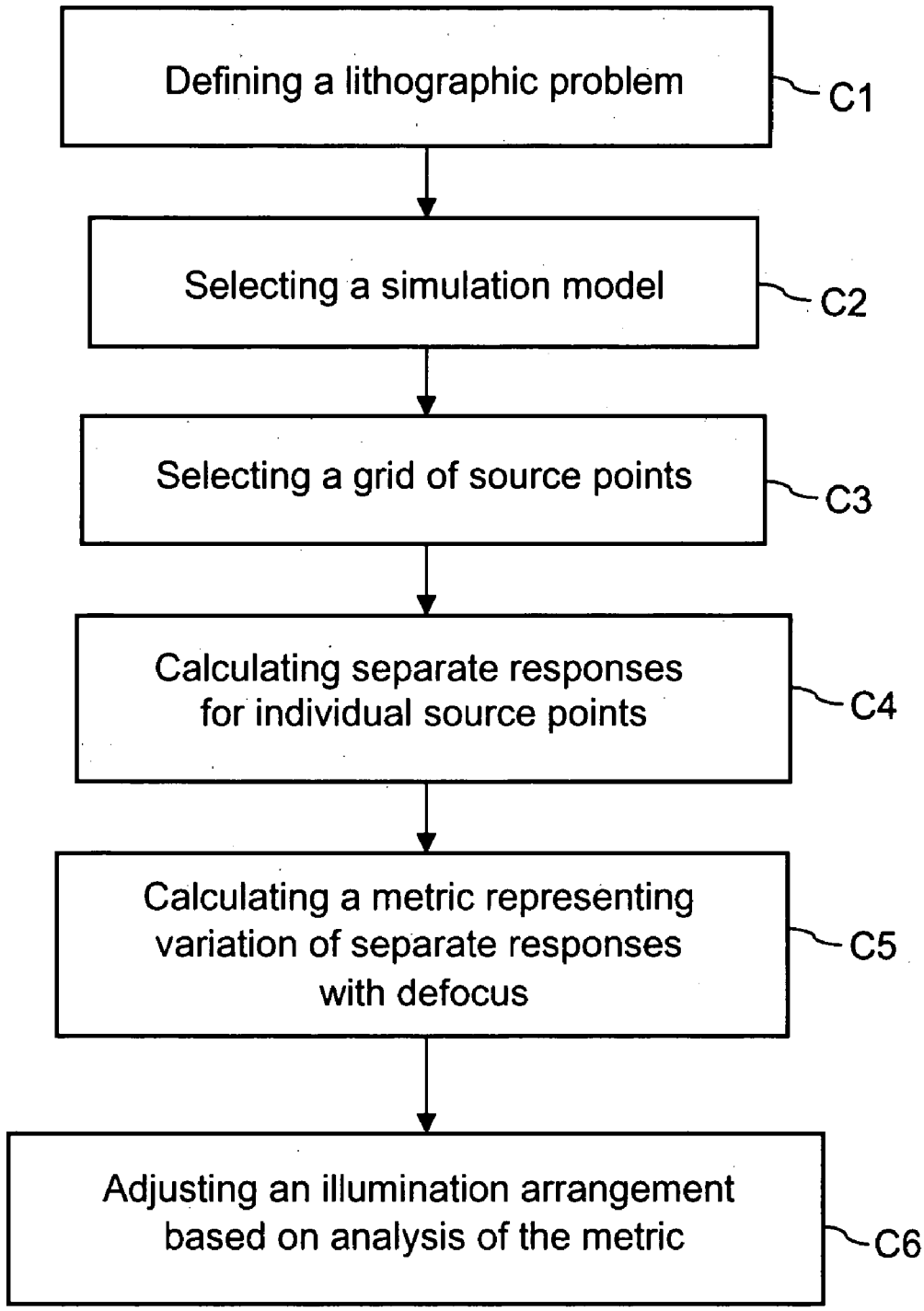
FIG. 24 is a flowchart illustrating a method for optimizing the illumination using isofocal compensation in accordance with an embodiment of the invention.

Referring now to FIG. 24, a method for optimizing the conditions of illumination of lithographic projection apparatuses according to an embodiment of the invention will now be explained. In this embodiment, selection of the illuminator arrangement is done so that the lithographic process obtained is substantially isofocal over a predetermined range of defocus. In an embodiment of the invention, isofocal compensation is achieved with a method including: defining a lithographic pattern to be printed on a substrate; selecting a simulation model; selecting a grid of source points in a pupil plane of the illuminator; calculating separate responses for individual source points, each of the responses representing a result of a single or series of simulations using the simulation model; calculating a metric representing variation of the separate responses for individual source points with defocus; and adjusting an illumination arrangement based on analysis of the metric.

Figure 25:
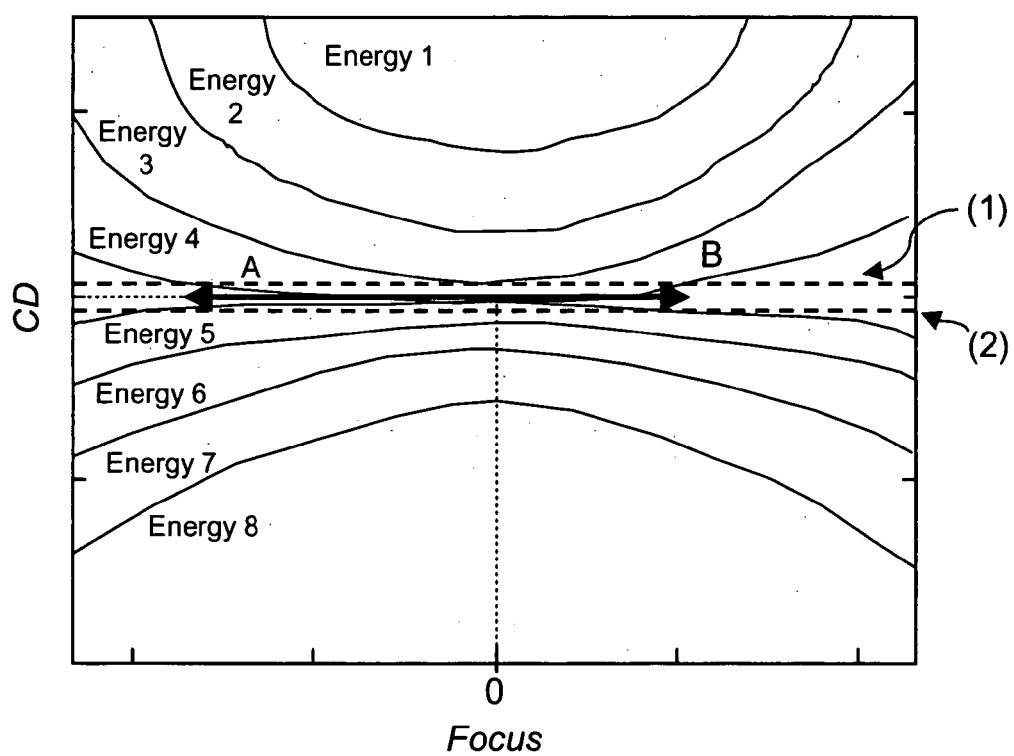
FIG. 25 is a Bossung plot showing multiple CD vs. defocus curves, each curve at a different exposure.

In the method illustrated in FIG. 24, optimization of the illumination conditions is based on the fact that for many lithographic problems two opposite failure mechanisms in defocus exist. This principle is illustrated in FIG. 25, which represents a focus exposure matrix at fixed CD on the mask. This matrix, also called a Bossung plot, captures important lithographic information, and more specifically the variation of the CD as a function of focus for different exposure energies.

In FIG. 25, the lithographic useful dose and focus are defined by their ability to equally print structures of the desired size. In this graph, the lithographic process will be deemed robust if a large variation in focus and dose minimally impacts the target CD. Practically, this requires to keep the printed CD within a range of acceptable CDs. This range is schematically illustrated in FIG. 25 by the CDs comprised between dotted lines (1) and (2). Ideally, this robust process will be portrayed by the "isofocal" segment AB in the Bossung plot.

As can be seen in this graph, errors in focus and dose can lead to two opposite effects, which can trigger a failure mechanism for the lithographic process. The first effect is characterized by a CD increase outside the range (corresponding to "smiling curves") of acceptable CDs while the second effect is characterized by a CD decrease outside this range (corresponding to "frowning curves").

Therefore, in order to render the lithographic process substantially isofocal (i.e., insensitive to focus errors) optimization of the lithographic process is performed in an embodiment of the invention by compensating one effect with another. More particularly, this is achieved, in an embodiment of the invention, by balancing the regions in the illuminator producing failure due to high CDs with defocus with the regions producing failure due to small CDs, with defocus. By doing so, CD variations within the process window are drastically decreased, a substantially isofocal process over the predetermined range of focus may be obtained, and the focus range (DOF) over which the CDs remain acceptable is augmented.

More specifically, the method for optimizing the illumination conditions of a lithographic apparatus provides in an embodiment of the invention a new metric that accounts for the variations of the target CD with defocus. The metric in this embodiment calculates, for each source point situated in the illuminator, the CD at a given defocus and compares this result with the CD obtained at the best focus. This computation is subsequently reiterated for all the source points located in the illuminator. Adjustment of the illumination conditions is then performed on the basis of the comparison of the results obtained for each source point. More specifically, adjustment of the illumination conditions is performed by selecting an illumination arrangement combining areas of the illuminator producing, in the defocused condition, high CDs on the substrate with areas of the illuminator producing small CDs on the substrate.

The method of the present invention allows for calculation of the CDs of the pattern and more generally of the response for each source point by computer simulations.

In an embodiment of the invention an aerial image model may be used to calculate the separate responses. In this embodiment, the incident light energy distribution onto the photoresist surface is simulated. Simulation of the aerial image may be done with the aid of commercially available simulators such as Prolith™ or the like. As mentioned previously, the models used in such a case are well known and are based on the Fourier optics either in its scalar or vector form. In this embodiment, the characteristics of the different elements of the photographic apparatus, like the numerical aperture NA or specific patterns, may be entered as input parameters for the simulation.

Also, in this embodiment, the calculated image may be evaluated versus some predetermined criteria to judge whether the image has enough contrast to successfully print the desired feature in photoresist on the wafer. The aerial image can be analyzed, through a focus range, to provide estimates of the exposure latitude and DOF and the procedure can be performed iteratively to arrive at the best optical conditions. Practically, the quality of the aerial image may be determined by using a contrast or normalized aerial image log-slope (NILS) metric (normalized to the feature size). This value corresponds to the slope of the image intensity (or aerial image).

In this embodiment, the response studied for each source point may be the variation with defocus of the intensity threshold of the aerial image giving the target CD. Alternatively, in another embodiment of the invention, the response studied may be the variation of the CD with defocus at fixed intensity threshold (i.e., at the intensity threshold of the aerial image giving the target CD).

In another embodiment of the present invention, simulation of the responses for each source point can be performed using a full resist calculation. In this approach, the effect of the image receiver, i.e., the photoresist, and more specifically the effects due to the interaction of the electromagnetic field with the photoresist will be accounted for in the computation. The full resist process simulation may also take into account the steps of photoresist baking and photoresist developing, thereby considering the effects due to non-zero diffusion of active physical species or finite dissolution contrast.

In this model, input parameters may comprise dissolution parameters ($R_{min}$, $R_{max}$; Mack4 n and $M_{th}$; notch model n, $n_{notch}$, and $M_{th}$), bake parameters (diffusion length, quencher concentration (Q), amplification rate constant [$K_{amp}$]), and optical parameters (Dill B).

Referring back to FIG. 24, an exemplary embodiment of a method for optimizing the illumination conditions of a lithographic apparatus using isofocal compensation will now be explained.

The method begins in step (C1) where a lithographic problem is defined. The lithographic problem represents a particular pattern to be printed onto a substrate. This pattern, which is used to optimize the parameters of the lithographic apparatus and to choose a proper configuration of the illumination system, is preferably representative of an aggressive configuration included in the mask layout.

The method then proceeds to step (C2) where the simulation model that calculates the profile of the pattern is selected.

The simulation model may include in an embodiment of the invention an aerial image model. In that case, the distribution of the incident light energy distribution onto the photoresist will be calculated. Calculation of the aerial image may be done either in the scalar or vector form of the Fourier optics. Practically, this simulation may be carried out with the aid of a commercially available simulator such as Prolith™, Solid-C™ or the like.

As mentioned previously, key relevant parameters to run aerial image simulations may comprise the distance from the focal plane of the Gaussian image plane, meaning the distance to the plane where the best plane of focus exists, as determined by the geometrical ray optics, or the center wavelength of the quasi-monochromatic light source. These parameters may also include a measure of degree of spatial partial coherence of the illumination system, the numerical aperture of the lens system illuminating the semiconductor substrates, the aberrations of the optical system and a full description of the spatial transmission function representing the optical mask.

Alternatively, the simulation model may be based in another embodiment of the invention on a full resist calculation. In such a case, the simulation may take into account the scattering of the electromagnetic field caused by the non-homogeneity of the photoresist, a non-planar topography or the vector effects. The resist model should also preferably take into account the photoresist exposure, the photoresist baking and the photoresist developing.

Naturally, in the event that a full resist calculation is used, essential parameters to run the simulation will be defined and loaded in the simulator. These parameters may include, besides the set of parameters used in the aerial image simulation, the dissolution and the bake parameters.

It should be understood that selection of the simulation model, in step (C2), is by no means limited to an aerial image model or a full resist calculation model. Additional models like a Lumped Parameter Model or a Variable Threshold Resist model may also be used in other embodiments of the invention. In all these embodiments, the model is selected because it has been matched to experimental data.

It should also be understood that the use of simulation in step (C2) is not limited to the calculation of the resist profile and that simulations may be carried out to extract additional/complementary responses like process latitude, dense/isolated feature biases, side lobe printing and sensitivity to mask errors.

The method then proceeds to step (C3) where a grid of source points, representing a discretization of the source beam, is defined in the pupil plane of the illuminator.

More specifically, illumination files, each representing an individual grid point, are generated and loaded in the simulation software. The light source points contained in the files form a light source point grid that spatially covers the entire cross-section of the illuminator at the pupil plane 18 of the illumination system shown in FIGS. 7–9. As mentioned in the foregoing discussion, it should be understood that the grid of source points may be defined differently in other embodiments of the invention. For example, as an alternative to illumination files, the grid of source points may be specified parametrically in the simulation software.

Still referring to FIG. 24, the method for optimizing an illumination source using isofocal compensation proceeds to step (C4) where separate responses are calculated for each grid source point.

More specifically, each of the separate responses will represent a result or series of results of simulations using the simulation models. Potential responses may include, for example, a critical dimension of the pattern studied or an intensity threshold necessary to define the target CD on the substrate.

After calculation of the separate responses for individual source points, the method then proceeds to step C5 to estimate the variations of the separate responses for individual source points with defocus.

In an embodiment of the invention, this is achieved by a metric that calculates another set of responses for the individual source points at a given defocus. The metric will then compare the responses obtained at defocus with the responses calculated at best focus, and generate a metric-response for each source point. In the event that the response is a critical dimension, the CD obtained at defocus will be subtracted from the CD calculated without defocus, or vice versa. Alternatively, if the response studied is the intensity threshold, the intensity threshold obtained at defocus will be subtracted from the intensity threshold determined without defocus. In doing so, the variation of the CD or the intensity threshold with defocus may be established. The value of the defocus may be set within or outside the range of depth of focus initially sought. In an embodiment of the invention, the value of the defocus may be within a range from 0.02 to 0.4 μm.

In order to aid in the optimization of the illumination conditions, the results of the metric can then be visualized by plotting the contour map of the metric-responses as a function of source location.

Figure 26A:
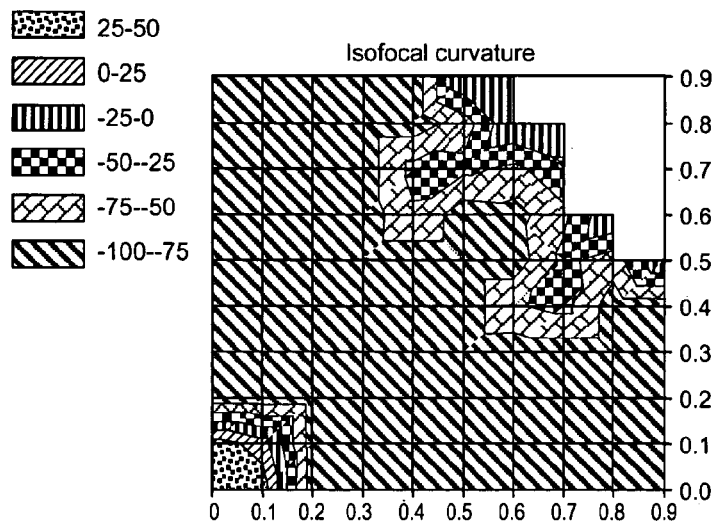
FIGS. 26a and 26b represent isofocal curvature maps obtained with resist calculation and aerial image calculation.
Figure 26C:
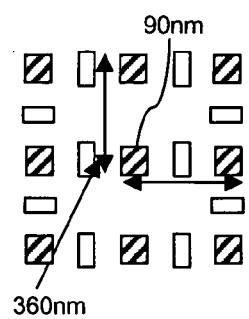
FIG. 26c represents the lithographic problem studied in FIGS. 26a and 26b, corresponding to a pattern of 90 nm holes in a 360 nm pitch.
Figure 26B:
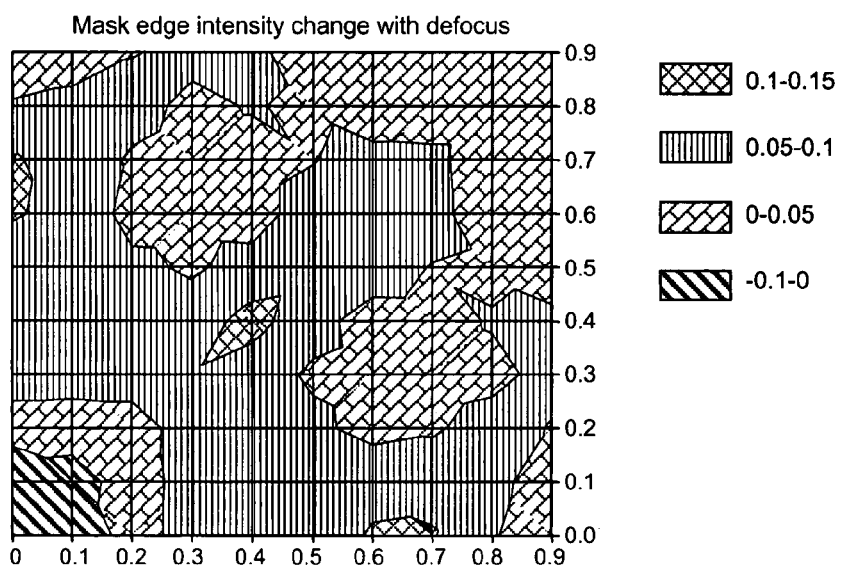

Referring to FIGS. 26a and 26b, exemplary embodiments of a contour map obtained in accordance with the method of the present invention are provided. FIGS. 26a–b correspond to the upper right hand of the illuminator at the pupil plane 18. As can be seen in these figures, the source point grid has a 0.1:0.1 spacing relative to the full aperture of the illuminator. For symmetry reasons, only the upper right hand quadrant of the illuminator need be visualized.

The lithographic problem studied was a pattern of 90 nm holes in a 360 nm pitch (See FIG. 26c). FIG. 26a represents a contour map of the metric-responses obtained with resist calculation. In that case, the metric calculates and compares the critical dimension of the pattern obtained at best focus and defocus (i.e., CD(best focus+0.2 μm)−CD(best focus)). FIG. 26b is an example of a contour map, which is obtained with aerial image simulation. In this example, the metric compares the intensity threshold at best focus and the intensity threshold for a 0.2 μm defocus (i.e., thresh(best focus)−thresh(best focus+0.2 μm). In this embodiment, it should be noted that a variation of the threshold intensity in an aerial image simulation is equivalent to a CD variation.

These contour maps indicate the regions of the illuminator that generate an increase or a decrease in the hole CD with defocus, and the magnitude of the size offset. Each area of the illuminator gives a CD change with defocus compared to the CD obtained at best focus. In FIG. 26a, the CD variation is calculated in nanometers and in FIG. 26b, the intensity threshold variation where an intensity value of 1.0 represents the open frame value.

Referring now in more detail to FIG. 26a, the regions of the illuminator producing an augmentation of the CD are concentrated in the extreme bottom left of the quadrant (i.e., CD(best focus+0.2 μm defocus) is greater than CD(best focus). They reflect a CD augmentation of around 25–50 nm. This corresponds in a Bossung plot to a "smiling" curve. By contrast, the areas of the illuminator creating a diminution of the CD are located in the center of the map. In that case, the curves in the Bossung plot will "frown" severely and holes will be closed (CD=0) when out of focus. Areas where curves in the Bossung plot will frown less severely are located in the upper right portion of the contour maps.

Similar information may be obtained in the contour map illustrated in FIG. 26b. As can be seen in this graph, the areas of the illuminator where an augmentation of the CDs is the most significant are located in the bottom left portion of the quadrant. Conversely, the center of the quadrant will be representative of the region in the illuminator producing a diminution of the intensity threshold and the CD.

Figure 27A:
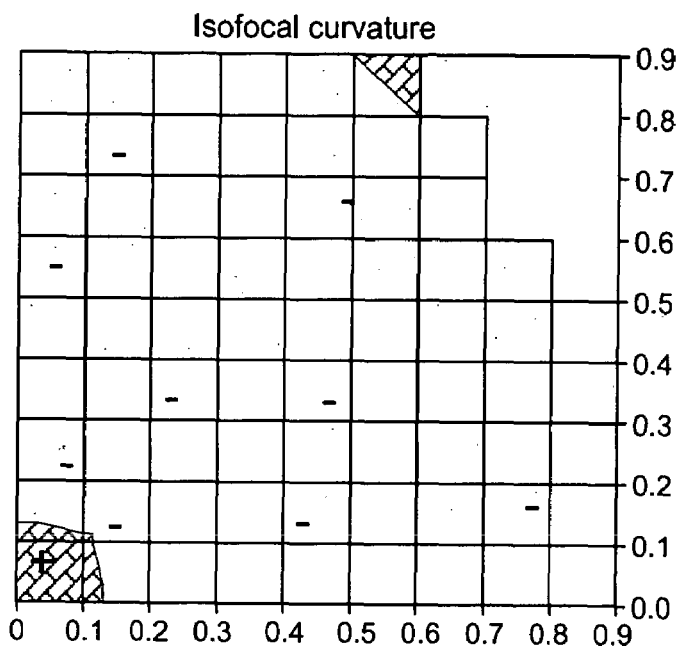
FIGS. 27a and 27b are isofocal curvature maps obtained with resist calculation and aerial image calculation and illustrating opposite isofocal behaviors within the illuminator.
Figure 27B:
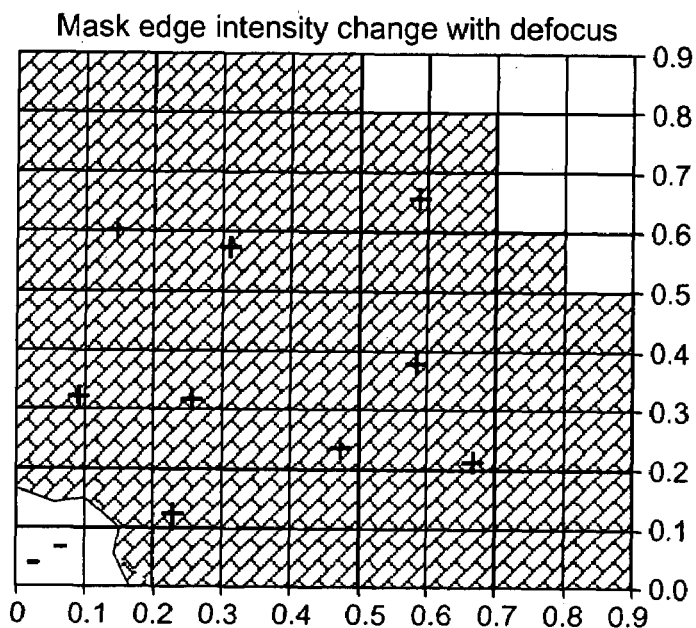

These contour maps may be reduced in one embodiment of the invention to contour maps representing opposite isofocal behaviors, as shown in FIGS. 27a–b. FIG. 27a represents a contour map of the metric-responses obtained with FIG. 26a (i.e. CD(best focus+0.2 μm)−CD(best focus)). FIG. 27b shows a contour map obtained with results of FIG. 26b (i.e., thresh(best focus)−thresh(best focus+0.2 μm).

In these maps only two regions are depicted. The first one corresponds to the region of the illuminator creating an augmentation of the CD, which is represented respectively by the positive sign region in the full resist model and the negative sign region in the aerial image calculation. Conversely, the second area corresponds to the region of the illuminator creating a diminution of the CD and is represented by an opposite sign region.

Referring back to FIG. 24, the method for optimizing the illumination conditions using isofocal compensation proceeds to step (C6) where the illumination conditions of the illuminator are adjusted based on the analysis of the metric.

In an embodiment of the invention, the optimization of the illumination conditions is carried out by selecting a type of illumination that combines regions producing an augmentation of the value of the responses (CD or intensity threshold) with regions producing a diminution of the value of the responses. Practically, this means that, in FIGS. 27a–b, positive sign regions are balanced with negative sign regions, or vice versa.

Figure 28:
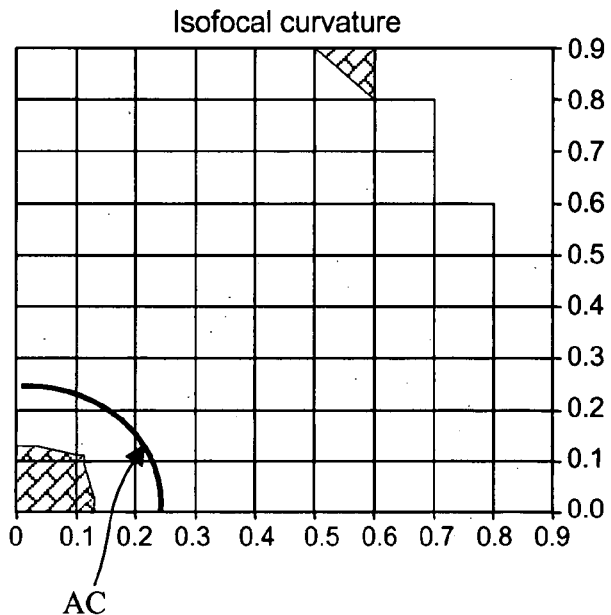
FIG. 28 is a contour map showing opposite isofocal behavior and indicating the best illumination arrangement for the specific pattern studied (90 nm holes/360 nm pitch)

The balancing of the regions may be done in an embodiment of the invention by selecting some source points in the positive regions and in the negative regions, as shown in FIG. 28. In FIG. 28, circle AC that delineates a 0.25 sigma on axis illumination captures source points that produce a CD augmentation and source points that produce a CD reduction. Practically, selection of these source points should take into account the aptitude of these source points to print the target CD. In other words, in this embodiment of the invention, a weight may be attributed to each source point. In the case of an aerial image simulation, the weight of a source point will depend on the intensity of the aerial image obtained from this source point. In the case of a full resist calculation, the weight of a source point will be inversely proportional to the dose required to print the target CD (i.e., CD to size) at best focus. As a result, if the required dose is low for this source point, then that point may potentially counterbalance a relatively larger area in the region of opposite sign. Naturally, if the source points have substantially the same weight, the balancing of the regions is done by selecting an equal number of source points in the positive regions and in the negative region. In FIG. 28, this results in selecting a 0.25-σ illumination arrangement (i.e., the arrangement that defines an aperture corresponding to the arc shown in FIG. 28). In so doing, the lithographic process is rendered substantially isofocal over the range of defocus studied. At σ=0.25, the lithographic process is approximately isofocal. The depth of focus is good but the dose latitude is low.

Figure 29:
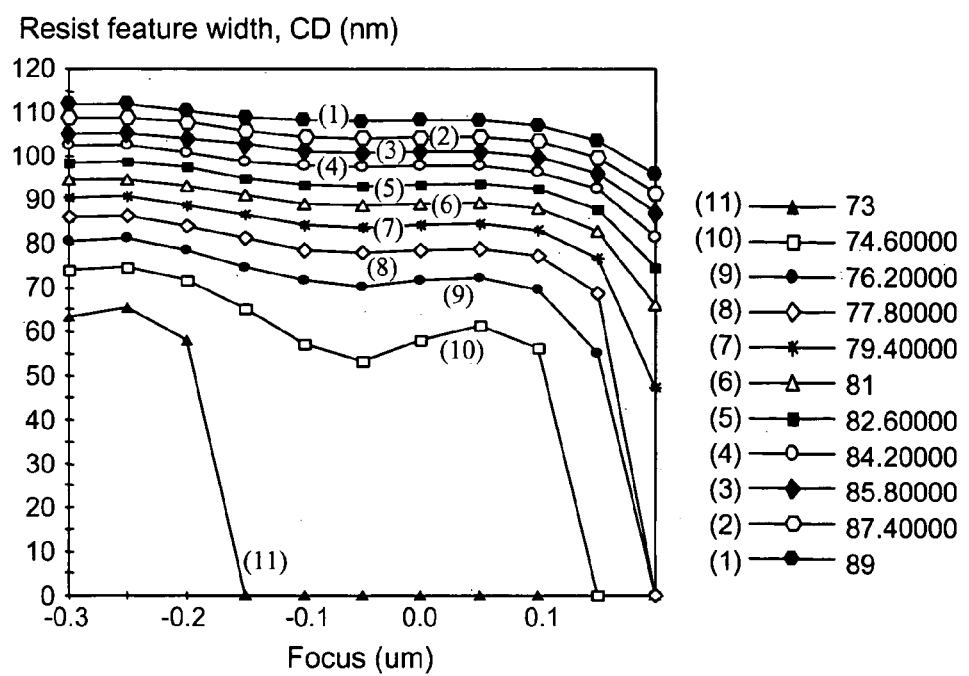
FIG. 29 shows the variation of the CD as a function of defocus for several exposure energies after optimization of the illumination conditions.

Results in terms of CD variation with a 0.25-σ illumination arrangement are shown in FIG. 29. This graph corresponds to a matrix exposure that illustrates the variation of the critical dimension of the 90 nm holes as a function of the focus for several exposures. As can be seen in this graph, there is almost no variation of the CD over the range of focus studied, regardless of the exposure energies.

It should be understood that supplementary responses may also be taken into account in selecting the best illumination conditions. These responses may include in an embodiment of the invention the Exposure Latitude EL, the dose-to-size E1:1, the depth of focus at 8% EL (DOF@8% EL), dense-iso bias, or MEEF.

These responses may carry additional information that may be pertinent in the determination of the optimal arrangement of the illuminator. Calculation of the responses may be based on the same principles set forth in the present invention. That is, separate responses for individual source points may be calculated, each of the responses representing a result of a single or series of simulations using the simulation model. Naturally, simulations for each of these responses may be run with an aerial image model or a full resist calculation.

Figure 30A:
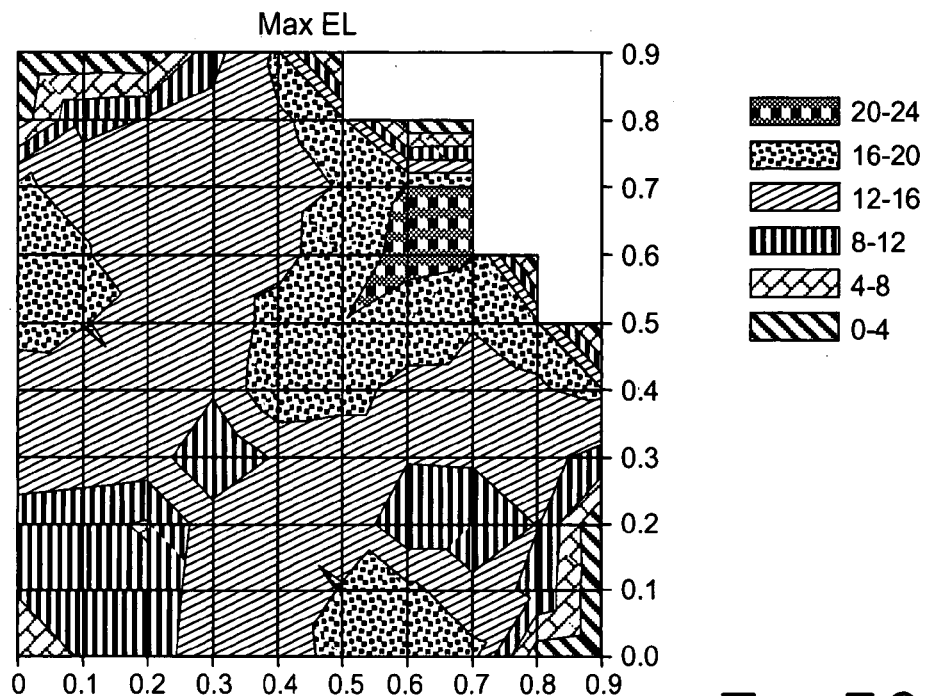
FIG. 30a is a contour map illustrating the contribution of each source point located in the illuminator to the maximum exposure latitude max-EL.
Figure 30B:
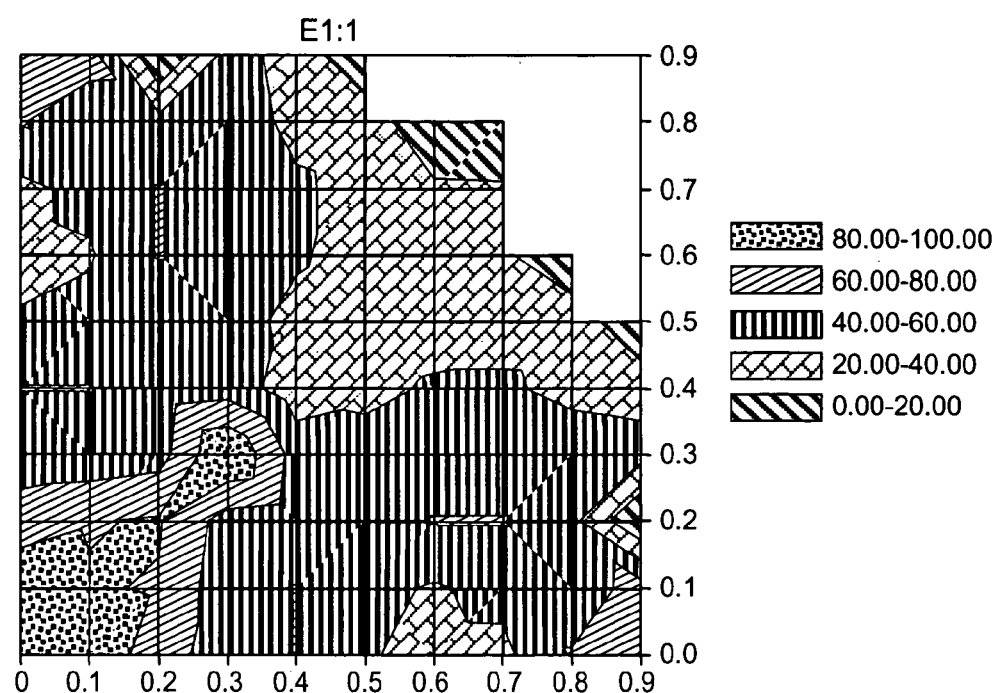
FIG. 30b is a contour map illustrating the contribution of each source point located in the illuminator to the dose-to-size E1:1.

FIGS. 30a–b illustrate contour maps obtained with a full resist calculation. In the first graph, the response studied is the maximum exposure latitude. In the second graph, the dose-to-size E1:1 response is analyzed. As can be seen in these graphs, different areas of the illuminators give different values for these responses and will contribute to an optimization of the illumination conditions. For example, the areas of the illuminator that will enhance the exposure latitude are located in the upper right portion of the quadrant. These areas define a quadrupole off-axis illumination including poles arranged at +/−45° relative to the horizontal axis of the illuminator (this illumination may be referred to as "quasar" type illumination). Similarly, useful areas that lead to a favorably low E1:1 are also situated in the upper right portion in the contour map (strong aerial image). In contrast, areas located proximate the lower left portion of the map (corresponding to a low sigma on-axis illumination) provide poor exposure latitude and require high doses to print (weak aerial image).

Figure 31:
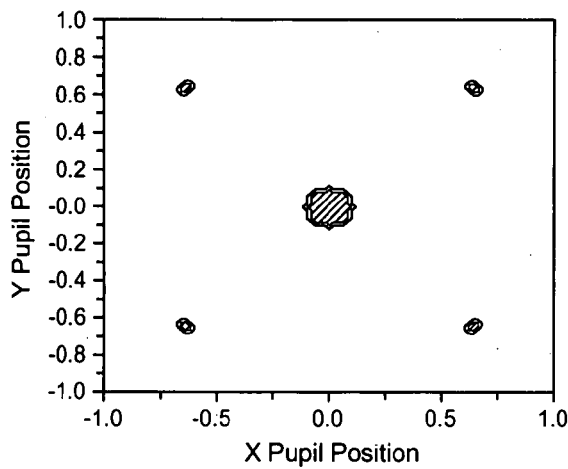
FIG. 31 is an illumination arrangement at the pupil plane of the illuminator that combines information related to isofocal compensation, exposure latitude and dose-to-size.
Figure 32:
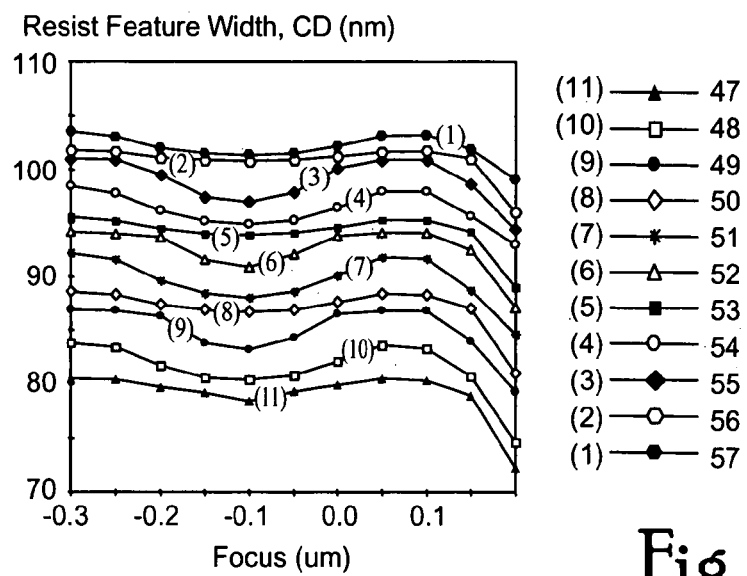
FIG. 32 is a focus exposure matrix obtained with the illumination arrangement shown in FIG. 31.
Figure 33:
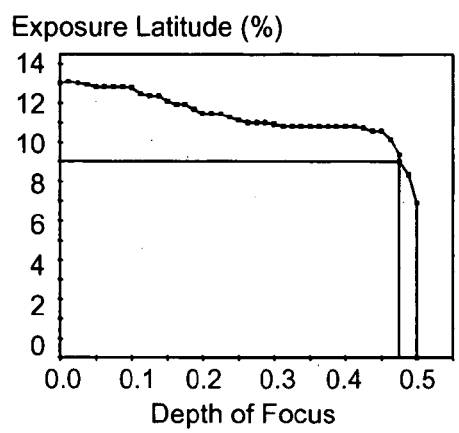
FIG. 33 shows the exposure latitude obtained with the illumination arrangement shown in FIG. 31.

It is therefore expected that the best illumination conditions to print the 90 nm holes in a 360 nm pitch will be provided by an illumination arrangement as shown in FIG. 31. This figure indicates the profile of the projection beam in the pupil plane of the illuminator. The sigma range along the X-axis and Y-axis of FIG. 31 is from −1 to +1. This arrangement combines a on-axis illumination and off-axis quasar illumination. Specifically, the arrangement includes a 0.1 on axis sigma illumination and a quadrupole illumination having four off-axis poles arranged at +/−45° relative to the horizontal axis of the illuminator (this illumination may be referred to as quasar type illumination). The poles have a 5° opening angle, a 0.88 inner radius and a 0.92 outer radius (this illumination may be referred to as σ(0.1 conv)+ (0.92/0.88Q5°). Simulated results in terms of depth of focus and exposure latitude obtained with the illumination arrangement shown in FIG. 31 are provided respectively in FIGS. 32 and 33. As can be seen in these graphs, there is almost no variation of the CD and the exposure latitude through defocus.

Figure 34:
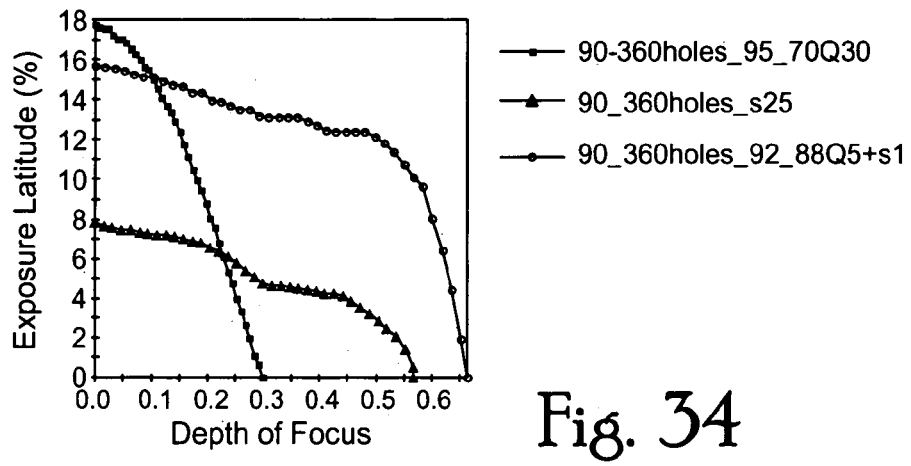
FIG. 34 shows the variation of the exposure latitude with defocus for different illumination conditions.
Figure 35A:
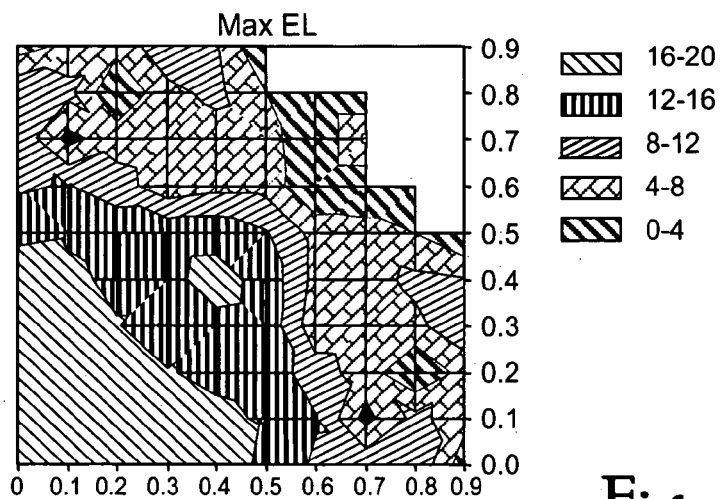
FIGS. 35a–d represent, respectively, simulation results obtained for the exposure latitude, depth of focus, depth of focus at 8% of the exposure latitude and the isofocal curvature for a pattern corresponding to 75 nm holes located in a 400 nm pitch.
Figure 35B:
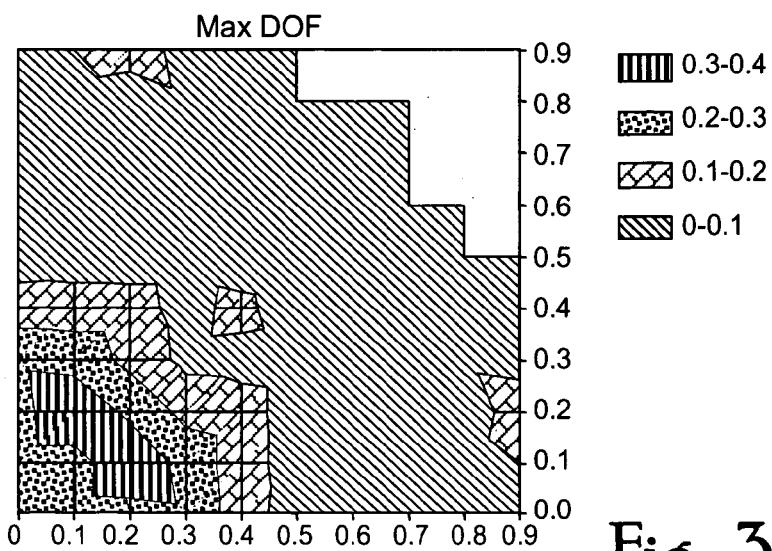
Figure 35C:
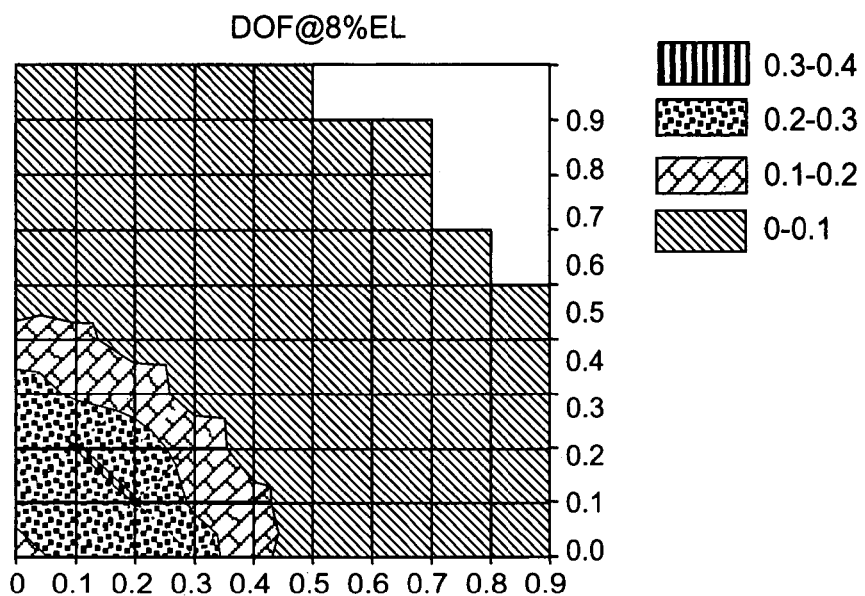
Figure 35D:
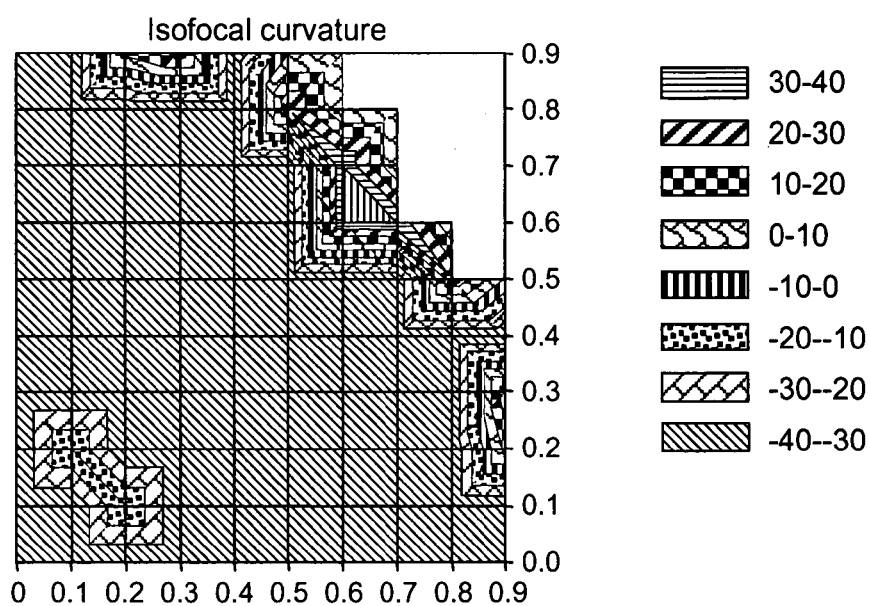

FIG. 34 compares variation of the exposure latitude with defocus for a process optimized with (1) standard calculation (in that case a full resist calculation) which maximizes depth of focus at a fixed dose latitude (with off-axis qua-drupole illumination having four poles arranged at +/−45° relative to the horizontal axis that each have a 30° opening angle, a 0.7 inner radius and a 0.95 outer radius–0.95/0.70Q30°), (2) isofocal compensation based on a simple illuminator design (having a 0.25 σ on-axis illumination) or (3) isofocal compensation using a complex illuminator and targeting maximum dose latitude (the illuminator combines a 0.1 σ on-axis illumination and a quadrupole off-axis illumination having four poles, arranged at +/−45° relative to the horizontal axis, that each have a 5° opening angle, a 0.88 inner radius and a 0.92 outer radius–0.92/0.88Q5°+0.1 conv). Results in terms of maximum exposure latitude (max EL), maximum depth of focus (max DOF), depth of focus at 10% of exposure latitude (DOF@10% EL) and depth of focus at 5% of exposure latitude (DOF@5% EL) are shown in table (a)

TABLE (a)

| optimization method | illumination | max EL | max DOF | DOF @ 10% EL | DOF @ 5% EL |
| --- | --- | --- | --- | --- | --- |
| standard | 0.95/0.70Q30° | 18% | 0.3 | 0.18 | 0.24 |
| simple isofocal compensation | 0.25 conv | 8% | >0.55 | 0 | 0.29 |
| high EL isofocal compensation | 0.92/0.88Q5° + 0.1conv | 16% | >0.65 | 0.57 | 0.63 |

This figure shows that isofocal compensation substantially increases the DOF. This figure also shows that the exposure latitude can be greatly increased while maintaining high DOF by combining appropriate parts of the illuminator. Therefore, large improvement in the process window may be possible with appropriate use of the illuminator to compensate for isofocal curvature. Note that the same enhancement could be obtained by analyzing aerial image calculations including information on the NILS at best focus. Because NILS is proportional to exposure latitude, such an analysis would also lead to a combination of on-axis and off-axis illumination to give isofocal performance with high dose latitude.

A similar approach was used to optimize the illumination conditions for another lithographic problem. Examination of a case where a wide range of contact hole pitches must be printed simultaneously using an attenuated phase shift mask leads to a conclusion that a combination of quasar illumination (for dense pitches) and small sigma (for isolated pitches) gives best results. More careful analysis of an "isolated pitch", in this case, the lithographic pattern studied corresponds to 75 nm holes in a 400 nm pitch illuminated with a 193 nm source under a 1.1 numerical aperture, provides new information. FIGS. 35a–d show simulation results obtained, respectively, for the exposure latitude (max-EL), the depth of focus (max DOF), the depth of focus at 8% of the exposure latitude (DOF@8% EL) and the isofocal curvature.

The first three responses obtained with full resist calculation indicate that a small sigma illumination would be best for this isolated pitch, as expected. By contrast, isofocal curvature simulation shows that addition of a small quasar arrangement at the very edge of the pupil, would add isofocal compensation to the lithographic performance. It was therefore concluded that the best illumination arrangement would extend the quasar plus small sigma illumination beyond that normally needed to print the dense pitches.

Figure 36A:
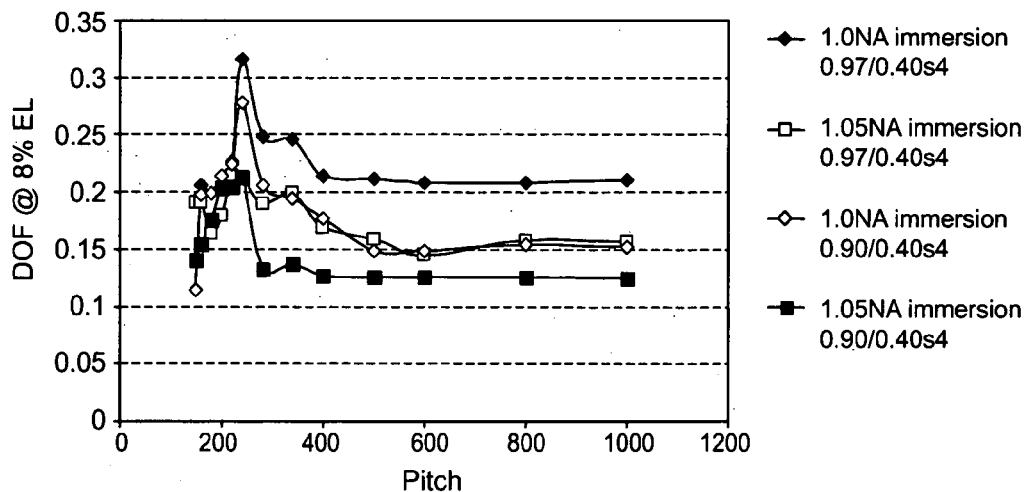
FIG. 36a shows simulation results showing the variation of the depth of focus at 8% of the exposure latitude (DOF@8% EL) as a function of the pitch for different types of illumination arrangement, which are shown in FIGS. 36b and 36c, for a pattern corresponding to 75 nm holes.
Figure 36B:
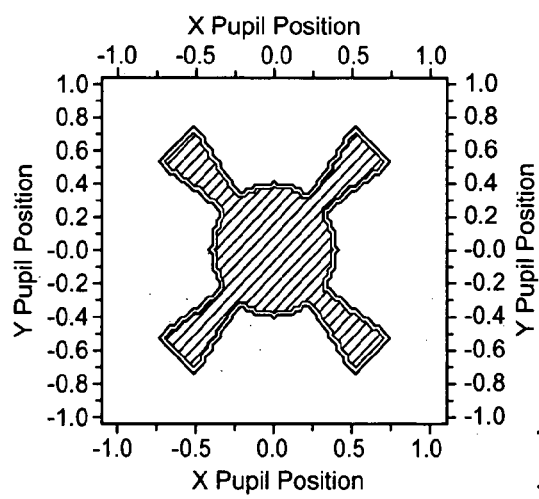
FIG. 36b is an illumination arrangement at the pupil plane of the illuminator that combines information related to isofocal compensation, exposure latitude and dose-to-size and having a 0.4σ+0.90/0.4 quasar illumination.
Figure 36C:
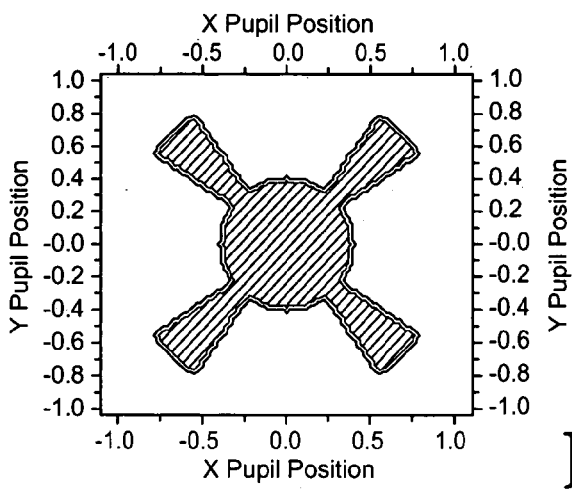
FIG. 36c is an illumination arrangement at the pupil plane of the illuminator that combines information related to isofocal compensation, exposure latitude and dose-to-size and having a 0.4σ+0.97/0.4 quasar illumination;.

Simulated results in terms of depth of focus measured at 8% of the exposure latitude (DOF@8% EL) are illustrated in FIG. 36a for the types of illumination arrangement predicted with the method of the present invention. This graph shows the variation of DOF@8% EL as a function of the pitch. For reference, FIGS. 36b and 36c illustrate the source shape with two types of arrangement (in terms of NA and quasar illumination) at the pupil plane of the illuminator. The sigma range along the X-axis and Y-axis of FIGS. 36b–c is from −1 to +1. FIG. 36b shows a 0.90/0.40+0.4σ illumination arrangement that includes a 0.4 σ on-axis illumination and a quadrupole illumination including four off-axis poles that are arranged at +/−45° relative to the horizontal axis of the illuminator. Each off-axis pole has a 0.4 inner radius and a 0.9 outer radius. FIG. 36c shows a 0.97/0.40+0.4σ illumination arrangement that includes a 0.4 σ on-axis illumination and a quadrupole illumination including four off-axis poles that are arranged at +/−45° relative to the horizontal axis of the illuminator. Each off-axis pole has a 0.4 inner radius and a 0.97 outer radius.

As can be seen in this graph, the DOF@8% EL remains stable, regardless of the pitch. More importantly, this figure indicates that a small variation of the quasar illumination may lead to a significant increase in the depth of focus. In that case, isofocal compensation showed that a 0.97 quasar illumination was better than a 0.90 quasar illumination, particularly for the isolated pitches. Simulation of the variation of the DOF@8% EL as a function of pitch clearly corroborates this result. This notable increase in DOF, which could not be predicted with standard calculations, clearly indicates that isofocal compensation calculations are extremely useful to optimize the lithographic process.

Figure 37:
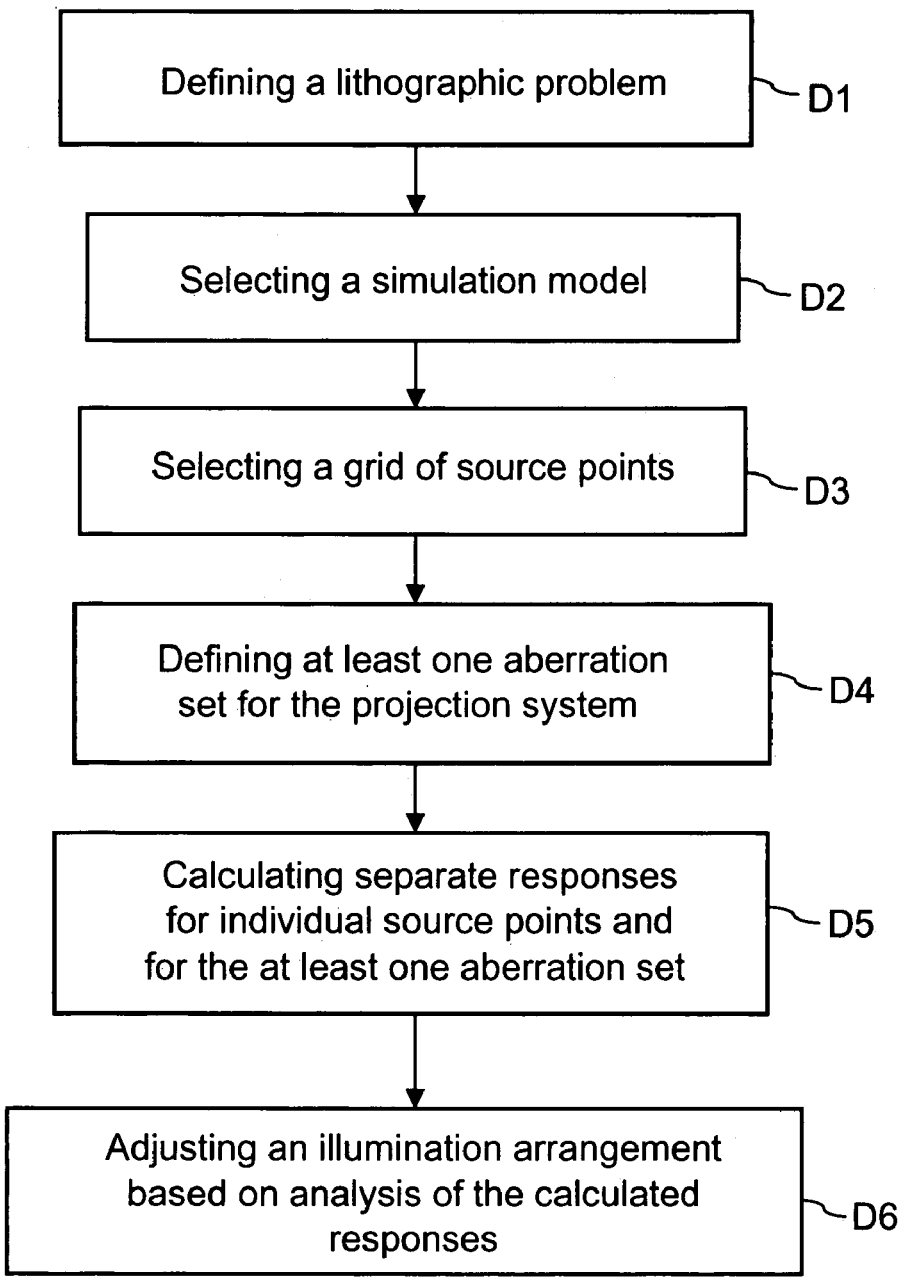
FIG. 37 is a flowchart illustrating a method for optimizing the conditions of illumination in accordance with an embodiment of the invention.

Referring now to FIG. 37, a method for optimizing the conditions of illumination of a lithographic projection apparatus according to an embodiment of the invention will now be explained. In this embodiment of the invention, the effects of lens aberrations are accounted for in optimizing the conditions of illumination. More particularly, the aberration sensitivity to the illumination conditions is calculated as a function of the source point location, and that information is then used to select the best condition of illumination.

In this embodiment of the invention, the optimization of the source for minimizing aberration sensitivity is achieved with a method including: defining a lithographic pattern to be printed on the substrate; selecting a simulation model; selecting a grid of source points in a pupil plane of the illuminator; defining at least one aberration set for the projection system; calculating separate responses for individual source points and for the at least one aberration set, each of the responses representing a result of a single or series of simulations using the simulation model; and adjusting an illumination arrangement of the illuminator based on analysis of accumulated results of the separate calculations.

A major source of CD variations in lithography is caused by lens aberrations. Therefore, regardless of the light source utilized in the fabrication process, the fabrication of devices having critical dimensions of 150 nm or less requires that the near-diffraction-limited lens utilized in the fabrication process be substantially aberration free. As is known in the industry, aberrations can be caused by various sources, such as a defective lens or an aging laser which emits a beam having a frequency shifted from the desired value. Accordingly, it is desirable to verify lens performance (i.e., qualify the lens) prior to installation, and then to subsequently monitor the lens performance during use (e.g., in an IC fabrication process).

During the lens manufacturing process, the lens performance can be fully tested interferometrically. Typically, the lens is first qualified at the factory and then again during the initial installation in the field. One common practice utilized for lens qualification is to print wafers and then measure the dimensions of the minimum feature width, or the critical dimension (CD). During this qualification process, both "vertical" and "horizontal" features are measured (i.e., features extending in two orthogonal directions on the substrate plane). In some instances, the CD for 45-degree features is also measured. In order to verify lens performance, a sufficient number of CD measurements are required across the entire exposure field. The results of the CD measurements are then analyzed to determine whether or not the lens performance is acceptable.

Figure 38A:
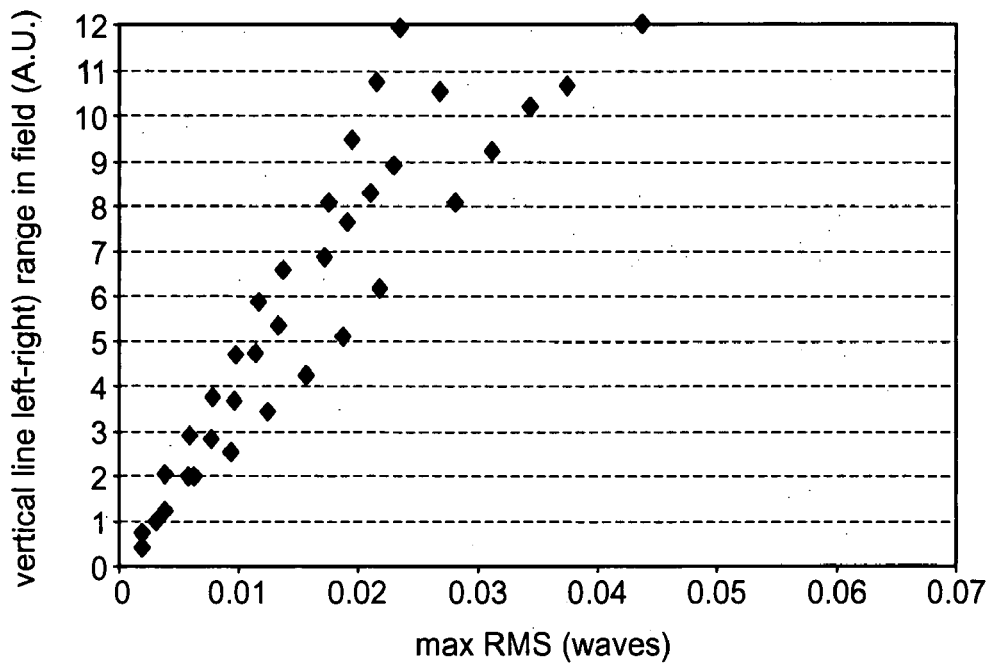
FIG. 38a shows the CD variation of a double line pattern for three lenses as a function of wavefront aberration created by lens aberrations.
Figure 38B:
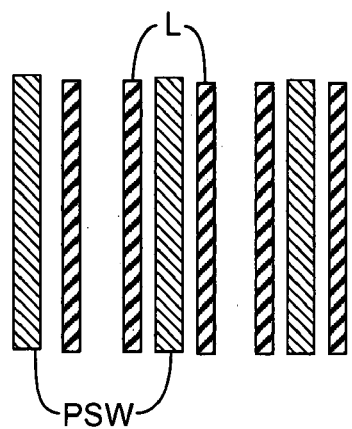
FIG. 38b is a schematic illustration of the double line structure used to simulate the CD variation due to lens aberrations.

An example of CD variations generated by lens aberration is shown in FIG. 38a. This figure illustrates simulated CD variations (in arbitrary units) of a double line structure and more particularly, the difference in width between the left and right line (of this double line structure) as a function of lens aberration. This structure was selected in this trial for its good sensitivity to lens aberrations. For reference, the double line structure is depicted in FIG. 38b. As can be seen in this figure, this structure includes two lines (identified as "L" in FIG. 38b) having a width of 50 nm. The pitch of the lines is 230 nm and the pair repeats at a larger pitch. A transparent 180° phase shift window PSW is also placed between the lines (See FIG. 38b).

In this trial, simulations of CD variations are performed for three similar lenses with a lithographic projection apparatus having a numerical aperture of 0.75 NA, an illumination condition of 0.25σ and a radiation of 157 nm (TI 180/230/800). For each lens, the RMS (Root Mean Square) values of an aberration set, which correspond to aberrations on several points of the lens field, are known and have been extracted using conventional measurement techniques (by interferometry, for example). Each RMS value, each corresponding to an aberration measured at a specific point in the field, represents the quadratic sum of the (Zernike) coefficients of the Zernike polynomial, which is used to model the wavefront aberration at this specific point in the lens. More specifically, this RMS value represents the departure of the wavefront of the propagating wave from sphericity. It should be noted that, in this trial and in the embodiment of the method illustrated in FIG. 37, the aberrations are considered together as an overall wavefront error rather than as specific aberrations. In other words, each RMS aberration value may represent different types of aberrations (like the Seidel aberrations, which include coma, astigmatism, field curvature, distortion or spherical aberrations).

As can be seen in these graphs, the double line structure is very aberration sensitive. A small aberration of 10 milliwaves, for example, may generate a left/right vertical line CD variation in the field of about 10%.

Figure 39A:
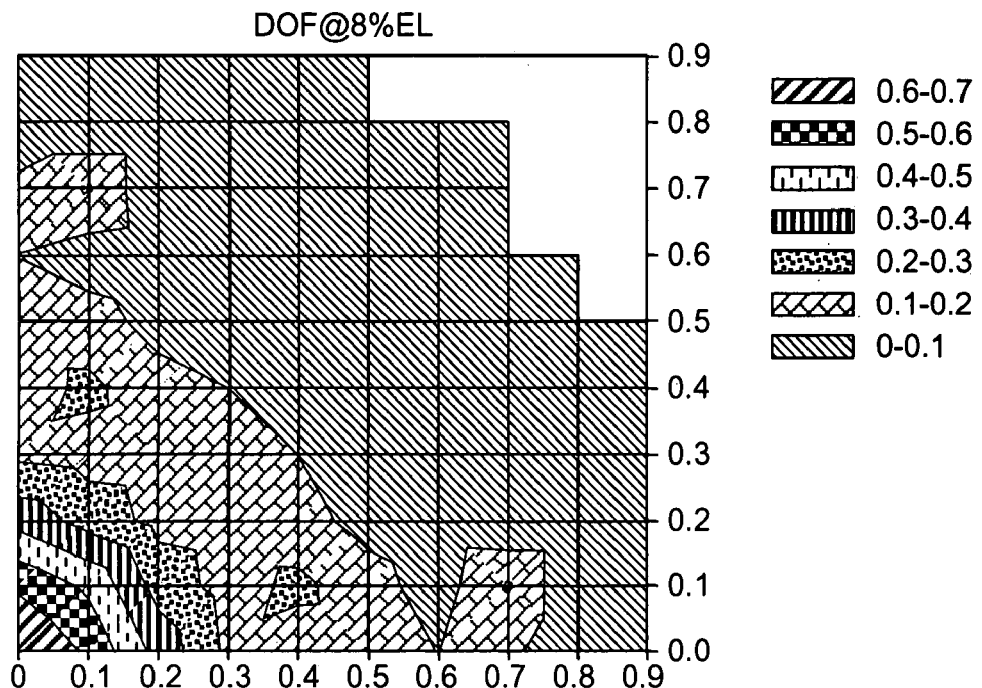
FIG. 39a is a contour map illustrating the contribution of each source point located in the illuminator to the depth of focus calculated at 8% of exposure latitude (DOF@8% EL) and calculated for the double line structure shown in FIG. 38b.
Figure 39B:
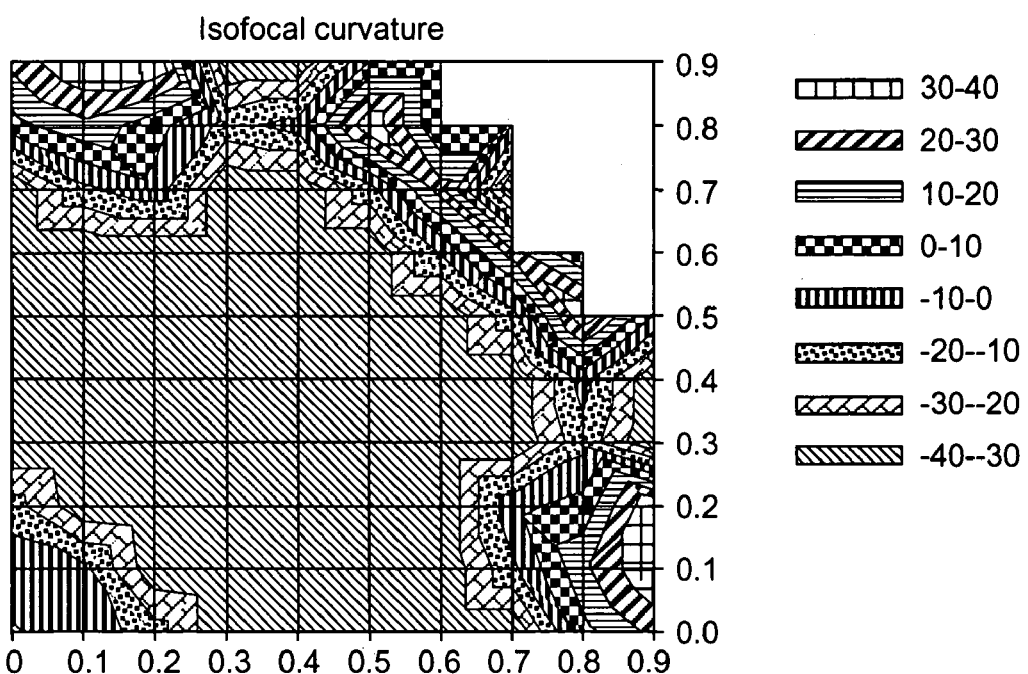
FIG. 39b is a contour map illustrating isofocal curvature and calculated for the double line structure shown in FIG. 38b.

FIGS. 39a and 39b show the contour maps of the DOF@8% EL and isofocal curvature response simulated for the double line structure. Simulations were done using a full resist calculation and for the same conditions of illumination as before (075 NA and 157 nm). As can be seen in FIG. 39a, the contour map of DOF@8% EL shows that a small portion of the center of the illuminator favorably contributes to a high depth of focus. By contrast, the isofocal curvature map indicates that illumination from the edge of the illuminator may favorably increase the process window. It is therefore expected that a combination of a small sigma and wide quasar illumination will greatly improve the lithographic process.

Figure 40:
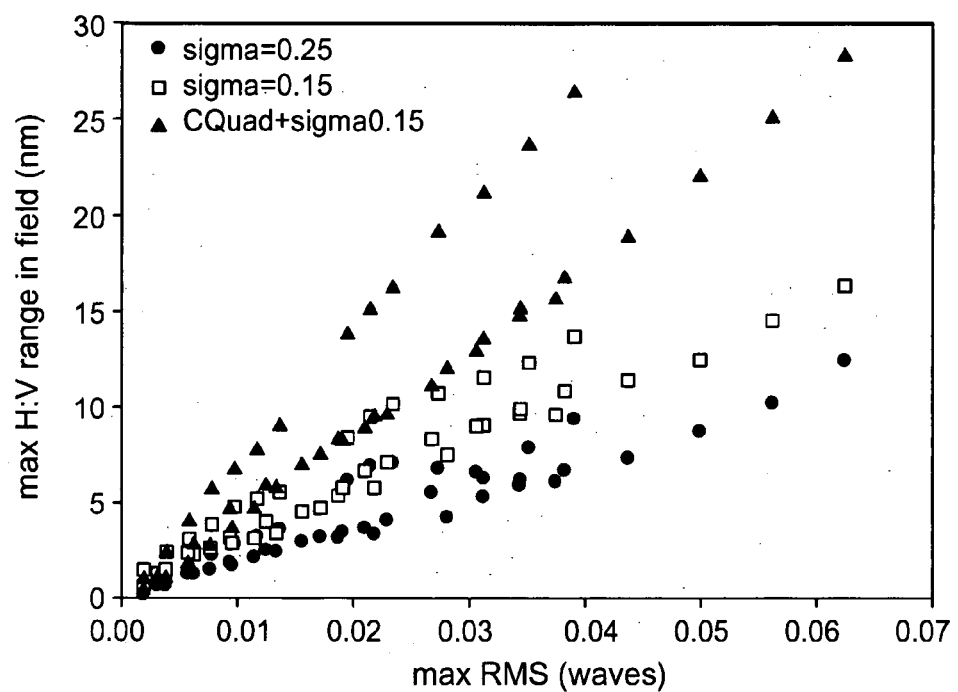
FIG. 40 represents the CD variation of the double line structure for three lenses and for three types of illumination (σ=0.25, σ=0.15, and small CQuad+σ=0.15) as a function of wavefront aberration.

In order to validate the choice of the illumination arrangement (i.e., a small sigma and wide quasar illumination, see FIG. 41), a trial similar to the one illustrated in FIG. 38a is conducted. FIG. 41 shows an illuminator comparison for the double line structure. The sigma range along the X-axis and Y-axis of FIGS. 41(a)–(c) is from −1 to +1. In FIG. 41, the illuminator (a) corresponds to a 0.25 σ on-axis illumination, the illuminator (b) corresponds to a 0.15 σ on-axis illumination, and the illuminator (c) corresponds to an arrangement that combines a 0.25 σ on-axis illumination and an off-axis illumination having small off-axis poles that are arranged on the horizontal and vertical axis of the illuminator (this illumination may be referred to as "cquad type illumination"). Results of this trial are shown in FIG. 40. As can be seen in this figure, it is indicated that the alternate settings have higher sensitivity aberrations and that an illumination with σ=0.25 remains favorable to limit CD variation of the double line structure. These results clearly show that it is desirable to take into account the lens aberrations to optimize the conditions of illumination.

Referring back to FIG. 37, the method for optimizing the conditions of illumination by reducing aberration sensitivity begins in step (D1) and proceeds to step (D3) in the same way as in the embodiments of the present invention shown, for example, in FIGS. 13 and 24. The method then proceeds to step D4 where at least one aberration set for the projection system is defined. As explained before, this aberration set contains aberrations corresponding to different locations in the field. In an embodiment of the present invention, the aberration set consists of 13 individual points. However, it should be understood that this aberration set may include more or fewer points depending on the degree of accuracy sought. It should be noted, in this respect, that a lens is conventionally specified by the manufacturer on 13 points. In addition, it should be understood that several aberration sets, corresponding to several similar projection systems or lenses, may be defined in step (D4). In that way, it may be possible to model the drift of lens aberrations over time and to account for this drift in optimizing the conditions of illumination. More importantly, it may also be possible with this embodiment of the present invention to account for the distribution of lithographic apparatuses (and therefore aberrations) in the fab (or those coming from the factory), and therefore to develop a more robust lithographic process.

As also explained previously, each point of the aberration set will have a corresponding RMS value. This value represents the quadratic sum of the coefficients of the Zernike polynomial that is used to simulate the wavefront aberration at this specific point in the field.

Although the set(s) of aberration(s) in step (D4) correspond(s) to aberrations extracted with one or several lenses, it should be understood that the set(s) may be defined differently. In an embodiment of the present invention, the set of aberrations may be defined, for example, to estimate the sensitivity of a particular aberration to the illumination conditions. In that case, the set will include typical values of that aberration. In another embodiment, the set may include interesting/important aberrations that specifically influence a particular lithographic process (for example, the lithographic pattern to be printed or the illumination conditions).

The method then proceeds to step (D5), where separate responses are calculated for the individual source points in the grid and for each RMS value of the aberration set. Calculations may be done either with a full resist model, an aerial model or with the other models discussed above. Practically, these simulations may be run with any commercially available simulators such as Prolith™, Solid-C™ or the like. In step (D5), the CD of the studied lithographic pattern is calculated for each source point and for the individual points/aberrations in the field lens (or projection lens). In doing so, a set of CDs for each source point is calculated, each of these CDs corresponding to one aberration. Next, the CDs (obtained with the several points in the field lens) of the calculated pattern are compared to one another in order to estimate the total CD range or, alternatively, the highest CD variation relative to the target CD for each source point. In cases where additional aberration sets (corresponding to other lenses or to aberrations of specific interests as discussed in the previous paragraph) are defined in step (D4), the highest range or the highest CD variation in any of the lenses may be taken into account to determine aberration sensitivity and to select the best conditions of illumination.

It should be understood that it is up to the user of the present invention to select a method of weighting aberrations in order to find the best conditions of illuminations. Therefore, other ways of weighting aberration sensitivity and selecting the best conditions of illumination may be used in other embodiments of the invention. For example, in an embodiment of the invention the average value of the CD variations may be calculated and used to estimate the aberration sensitivity.

In order to aid in the optimization of the illumination conditions, the results of the calculations may then be visualized by plotting the contour map of the responses as a function of source location.

Figure 42:
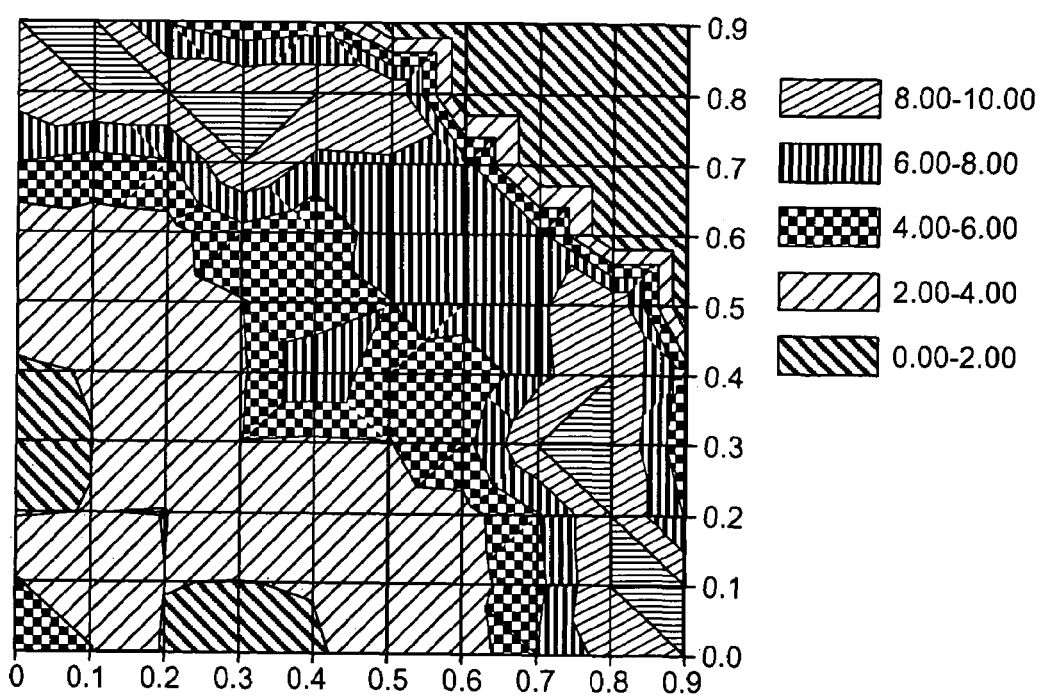
FIG. 42 is a contour map representing CD variation due to aberrations as a function of source point location in accordance with an embodiment of the present invention.

Referring to FIG. 42, an exemplary embodiment of a contour map obtained in accordance with the embodiment of the present invention shown in FIG. 37 is provided. FIG. 42 corresponds to the upper right of the illuminator at the pupil plane 18. This contour map represents the CD variation due to aberrations as a function of source location. For each source point, the highest CD variation is plotted. In the embodiment of the present invention shown in FIG. 42, calculations are done for three similar lenses and the highest CD variation in any of the lenses is plotted for each source point.

As can be seen in FIG. 42, the area of the illuminator that minimizes aberration sensitivity is located in the lower left part of the illuminator. However, it is also shown that a small σ illumination will increase the CD variation due to aberrations. It is expected, therefore, that the best illuminator arrangement will combine a σ illumination of at least 0.25, in order to reduce aberration sensitivity, and a CQuad illumination (in order to increase the depth of focus). In this particular trial, an augmentation of the small σ illumination can drastically reduce the aberration sensitivity to the illumination conditions while still maintaining a robust process window.

This approach was successfully applied to select the best conditions of illumination for the same lithographic pattern (i.e., a double line structure) printed with a Chromeless Phase Lithography (CPL) mask.

Figure 43:
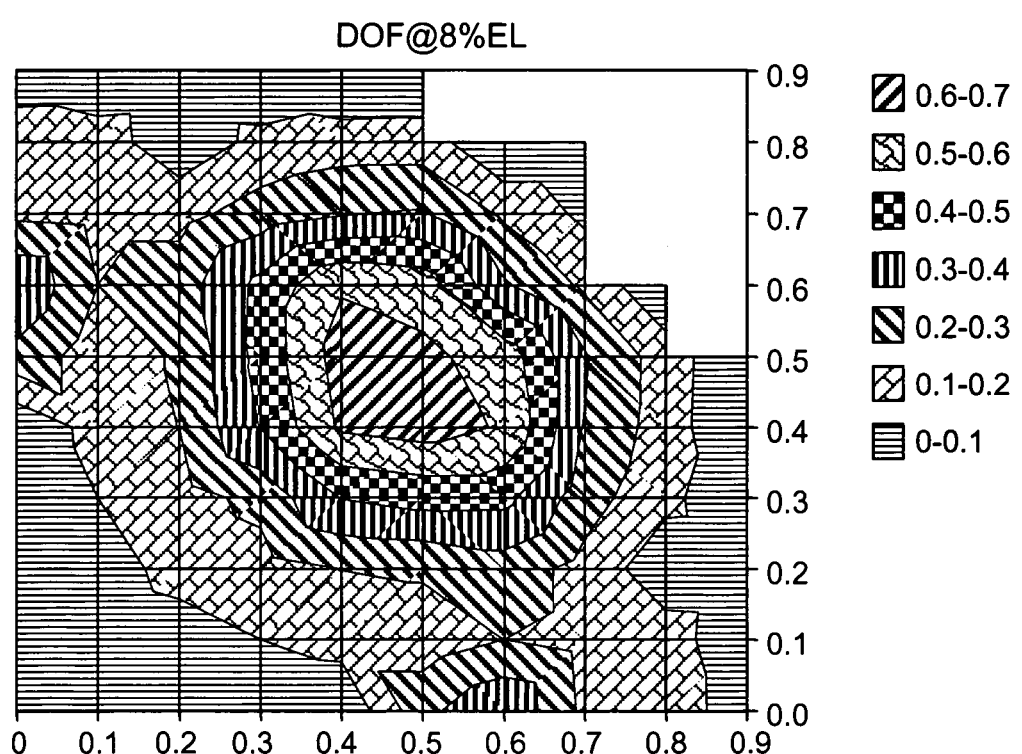
FIG. 43 is a contour map representing the variation of Depth of Focus measured at 8% of Exposure Latitude as a function of source point location for simulations done for the same double line structure depicted in FIG. 38b and for a Chromeless Phase Lithography mask.

Referring to FIG. 43, this figure shows the variations of DOF@8% EL as a function of source point location. This contour map is obtained using embodiments of the invention illustrated, for example, in FIGS. 13 or 24. The illumination optimization is done with a 0.75 numerical aperture. As can be seen in this graph, an illumination arrangement providing a tight quasar illumination notably increases the depth of focus of the lithographic process. Specifically, the optimized illumination arrangement (0.80/0.55Q30°) includes a quadrupole off-axis illumination including off-axis poles arranged at about +/−45° relative to the horizontal axis of the illuminator. Each pole has a 30° opening angle, a 0.55 inner radius and a 0.8 outer radius.

Figure 44:
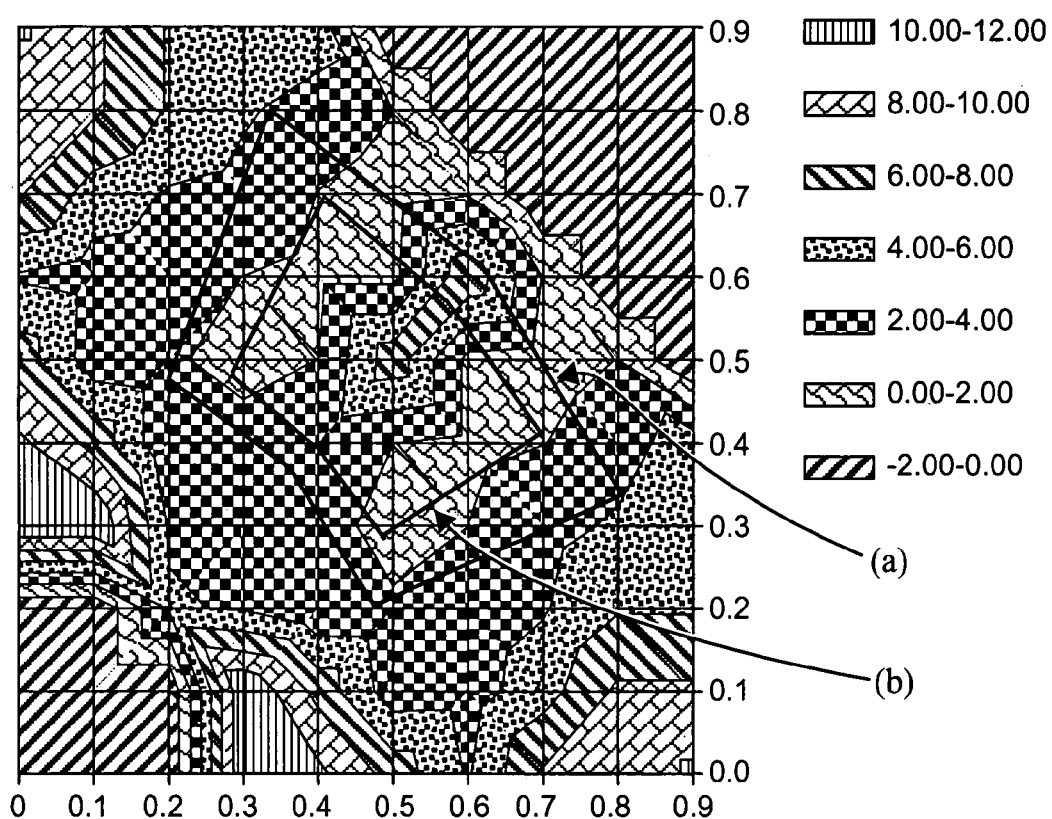
FIG. 44 is a contour map representing CD variation due to aberrations as a function of source point location in accordance with an embodiment of the present invention.

Results in terms of CD variation due to aberrations (aberration sensitivity) obtained with the embodiment of the present invention shown in FIG. 37 are represented in FIG. 44. The contour map indicates that a quasar arrangement favorably reduces the CD variation due to aberrations. However, FIG. 44 also shows that there is a high aberration sensitivity (6–8 nm variation) for poles arranged at exactly +/−45° relative to the horizontal axis of the illuminator. Sensitivity drops (0–2 nm) for source points that are outside the +/−45° position. Aberration sensitivity can be reduced by enlarging poles to dilute the unfavorable on-axis sensitivity. However, a reduction in process window is expected. The contour map in FIG. 44 also suggests that a quasar illuminations having poles larger (0.85/0.50Q45°) (identified as "(a)" in FIG. 44) than those initially selected in FIG. 43 (0.80/0.50Q30°) (identified as "(b)" in FIG. 44) may give better results (as it encompasses a larger area where CD variation is zero).

Figure 45:
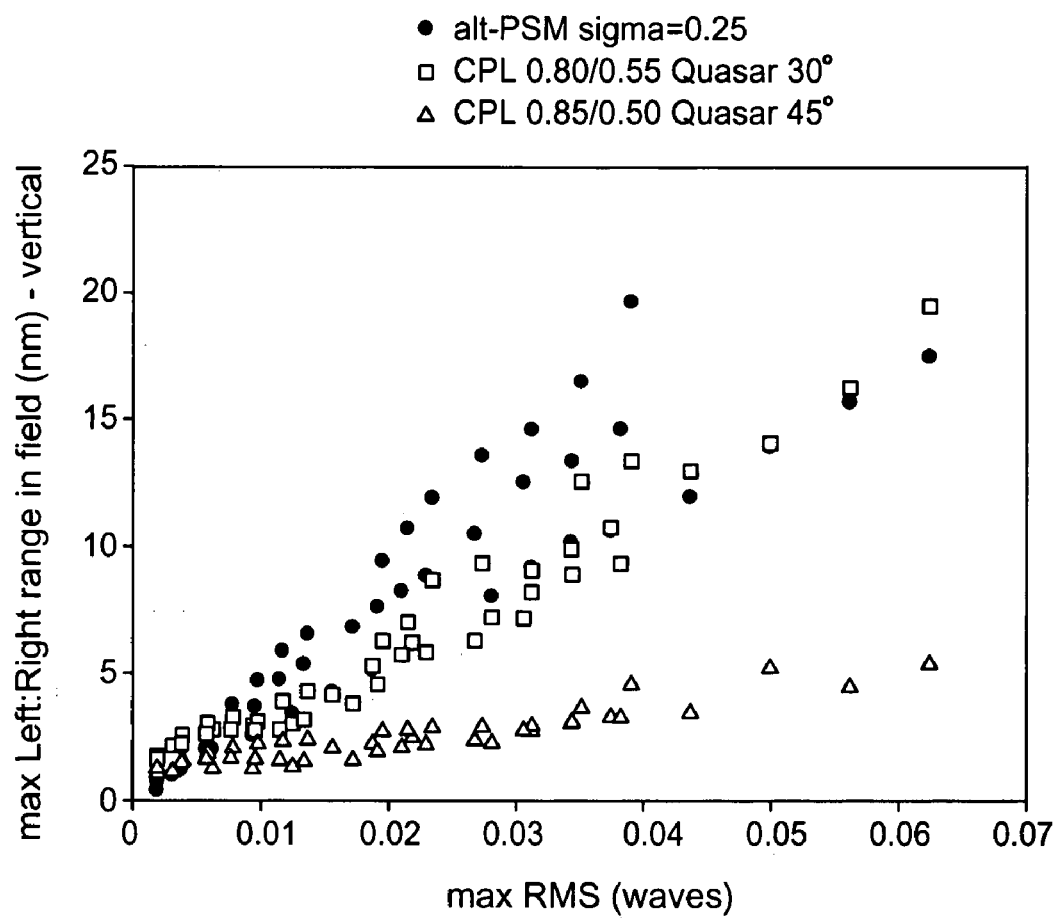
FIG. 45 represents the CD variation of the double line structure for three lenses and for three types of illumination (Phase shift mask σ=0.25, CPL mask 0.80/0.55 Quasar 30°, and CPL mask 0.85/0.50 Quasar 45°) as a function of wavefront aberration.

This assumption is corroborated in FIG. 45, which represents the CD variation of the double line structure as a function of wavefront aberration (in RMS) for different illumination arrangements. This figure clearly indicates that aberration sensitivity is notably reduced by using a 0.85/0.50 quasar 45° illumination arrangement. For this illumination configuration, CD variation lower than 5 nm can still be obtained even with lens aberrations of up to 60 milliwaves.

Figure 46:
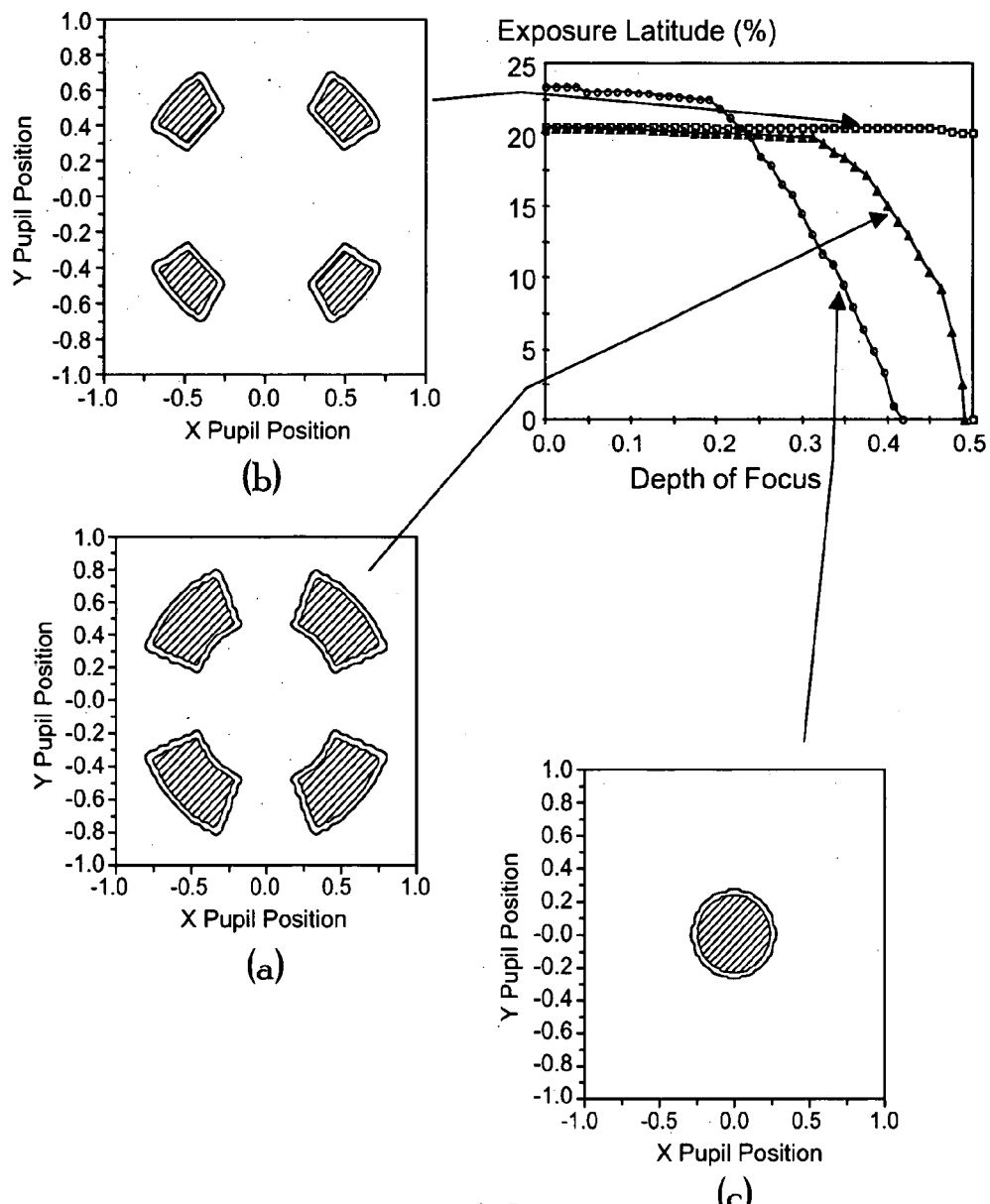
FIG. 46 shows the variation of the Exposure Latitude as a function of the depth of focus for the three types of illumination arrangement shown in FIG. 44.

FIG. 46 illustrates the variation of the Exposure Latitude as a function of depth of focus for the illumination arrangements used in FIG. 44 (illumination (a) 0.85/0.50Q45° and (b) 0.80/0.50Q30°) and for an on-axis 0.25 sigma illumination (identified as "(c)" in FIG. 46). In each illumination arrangement of FIGS. 46(a)–(c), the sigma range along the X-axis and Y-axis is from −1 to +1. The 0.25 sigma illumination (c) is used in combination with an alternating phase shift mask (alt-PSM). The illuminations (a) and (b) are used in combination with a chromeless phase lithography (CPL) mask. As can be seen in this graph, an illumination arrangement having larger poles (0.85/0.50 quasar 45°) may still give a favorable process window. This arrangement represents a good compromise because it favorably reduces CD variation due to aberrations while still maintaining a good process window. Furthermore, a CPL mask gives improved process window.

Figure 47:
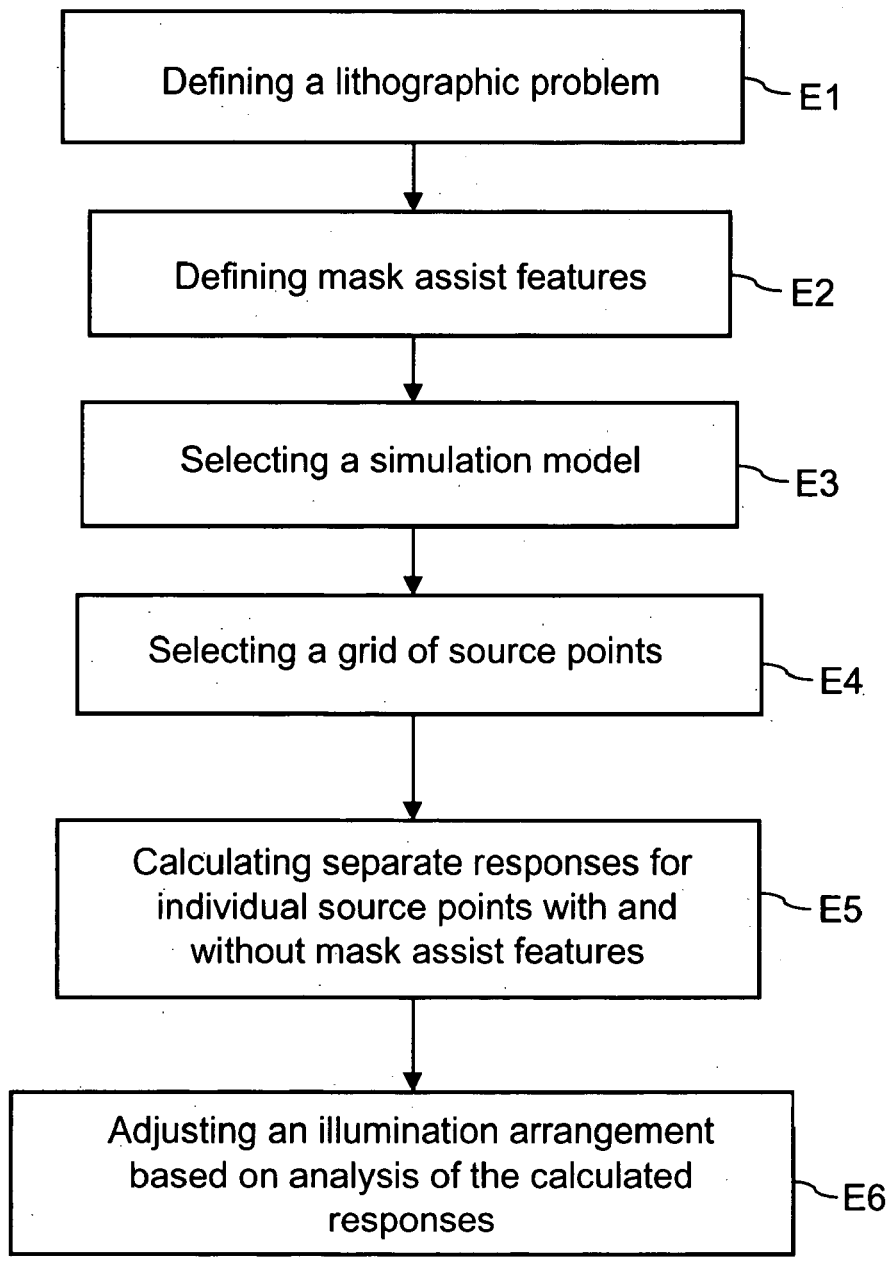
FIG. 47 is a flowchart illustrating a method for optimizing the conditions of illumination in accordance with an embodiment of the invention.

Referring now to FIG. 47, a method for optimizing the conditions of illumination of a lithographic projection apparatus according to an embodiment of the invention will now be explained. In this embodiment of the invention, optimization of the conditions of illumination is done in order to match the results generally obtained with mask assist feature techniques. In an embodiment of the invention, there is provided a method for optimizing an illumination arrangement providing similar results to those obtained with complex Optical Proximity Correction (OPC). With the embodiment of the present invention represented in FIG. 47, low DOF features can be significantly improved by combining disparate areas of the illuminator without using complex and expensive mask assist features.

Mask assist features or reticle enhancement techniques (RET) have been used extensively to improve the fidelity and manufacturing of small dimension features in integrated circuits. They generally include optical proximity correction (OPC) and phase shift masks (PSM).

OPC involves modification to the design pattern to compensate for changes in feature shape and size that occur during pattern transfer from the reticle to the wafer. When the pattern is transferred from the reticle to the wafer, several effects introduce distortion into the pattern. These distortions include line-width variations dependent on pattern density, corner rounding, and line-end shortening. The changes to the pattern can create bad connections or cause devices to operate at less than optimal speed. Causes for the distortion include reticle pattern infidelity, optical proximity effects, diffraction and interference, and diffusion and loading effects during resist and etch processing.

OPC makes small changes to the IC pattern that are designed to anticipate and correct for these distortions. For example, line end shortening can be corrected by extending the line using a hammerhead shape that results in a line in the resist that more closely resembles the originally intended layout. Corner rounding is corrected by adding (or subtracting) serif shapes from corners.

Phase shift masks take advantage of the interference effect in a coherent or partially coherent imaging system to reduce the spatial frequency of a given object, to enhance its edge contrast, or both. It is possible to control locally the type of interference, destructive or constructive, at critical locations in a design by adding an additional patterned layer of transmitting material on the mask. This technique results in a combination of higher resolution, larger exposure latitude, and larger depth-of-focus. In phase shift lithography, a transparent coating is placed over a transparent area. The light waves passing through the coated region are delayed 180° out of phase with the light waves passing through the uncoated region. At the edge of a phase-shifted area, the light waves from the phase-shifted and clear areas will cancel out producing a more sharply defined interface.

The extension of phase shift windows and optical proximity correction to more complex designs results in a large increase in the complexity of the mask layout. Determining exactly what corrections to make (with OPC or phase shift windows) is an extremely complicated process that depends on neighboring geometries and process parameters. For example, when laying out phase shift windows on dense designs, phase conflicts may occur. In addition, millions of features may be laid out in the design of a single integrated circuit. The burden of data processing resources for iterative operations over such large numbers of features can be huge, and in some cases makes the iterative operation impractical.

In an embodiment of the invention, optimization of the source is achieved with a method including: defining a lithographic pattern to be printed on the substrate; defining mask assist features configured to help print the lithographic pattern on the substrate; selecting a simulation model; selecting a grid of source points in a pupil plane of the illuminator; calculating separate responses for individual source points with and without the mask assist features, each of the responses representing a result of a single or series of simulations using the simulation model; and adjusting an illumination arrangement of the illuminator based on analysis of accumulated results of the separate calculations.

Figure 48:
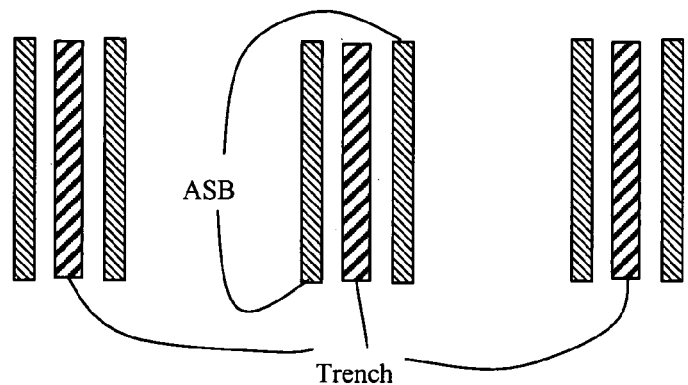
FIG. 48 is a schematic illustration of a pattern of trenches with mask assist features (anti-scatterring bars) disposed on both sides of each trench.

Referring back to FIG. 47, the method for optimizing the conditions of illumination begins in step (E1) where a lithographic problem is defined. The method then proceeds to step (E2) where mask assist features are defined and loaded in the simulator. These mask assist features, which are configured to help printing the pattern on the mask, may include in an embodiment of the present invention Optical Proximity Correction. They may also include in another embodiment of the invention phase shift windows. An example of a mask assist feature is shown in FIG. 48. In this figure, the mask assist feature corresponds to 50 nm anti-scatterring bars (ASB) disposed on each side of a 75 nm trench.

Next, the method proceeds from step (E3) to step (E4). In these steps, a model is chosen to perform the simulations and a grid of source points is selected in the pupil plane of the illuminator.

The method then proceeds to step (E5) where separate responses for individual source points are calculated with and without the mask assist features, each of the responses representing a result of a single or series of simulations using the simulation model. Responses may include depth of focus (DOF), the exposure latitude (EL), the depth of focus at 8% EL (DOF@8% EL), the dose-to-size $E_{1:1}$, dense to isolated feature bias, arbitrary feature size biases, sidelobe printing, film loss, sidewall angle, mask error enhancement factor (MEEF), linear resolution, or absolute resolution.

The method ends in step (E6) where an illumination arrangement of the illuminator is selected based on analysis of accumulated results of the separate calculations. More specifically, optimization of the conditions of illumination is performed in an embodiment of the invention by comparing the responses calculated with mask assist features to the responses calculated without mask assist features. Then, the illuminator arrangement is selected by determining the area(s) of the illuminator that give(s) responses as good as or substantially similar to the best responses calculated with mask assist features. This ensures that the resulting illuminator arrangement, which is used to expose the pattern without mask assist feature, will give results at least comparable to those obtained with mask assist features. In this way, it is possible to produce some of the advantages generally obtained via, for example, reticle OPC by applying "assist features" at the illuminator level. Thereby, the need for costly and complex reticles may greatly be reduced.

It should be understood that optimization of the illumination conditions according to the embodiment of FIG. 47, may also be done including some mask assist features of specific interests. In that case, optimization of the illumination arrangement is done by comparing simulation results obtained with and without these mask assist features of specific interests.

It should also be understood that optimization of the illumination conditions is done to make the most cost effective process. Specifically, it should be kept in mind that mask or source "enhancement" is undertaken to produce a reasonable manufacturing yield. Therefore, one may attempt to use a relatively simple illumination with a complicated mask, or alternatively a complex illumination arrangement with a simple mask. In some cases, these two options could be combined (i.e., for a very difficult process). The present invention provides a useful tool to help in deciding the avenue to follow in order to obtain the most cost effective process.

Figure 49A:
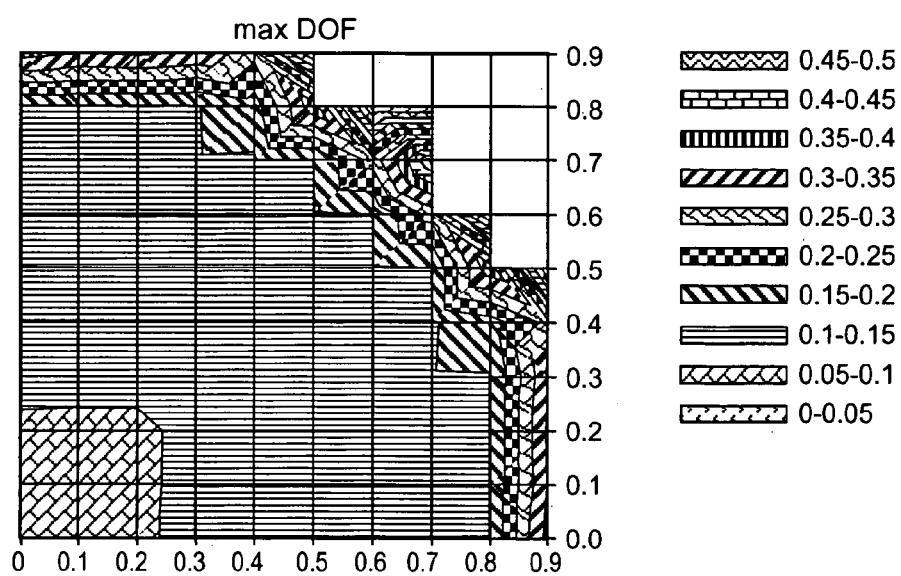
FIGS. 49a and 49b are two contour maps representing the variation of Depth of Focus and Exposure Latitude as a function of source point location for simulations done for the structure depicted in FIG. 48 and for a 6%-attenuated phase shift mask.
Figure 49B:
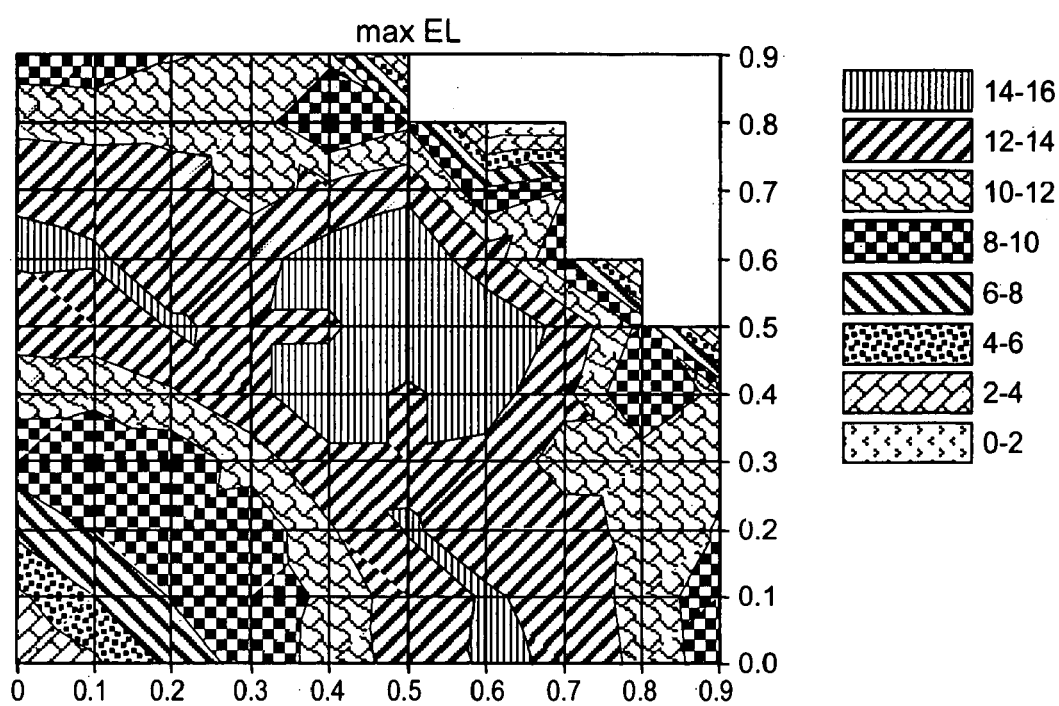

This approach was successfully pursued to select an illumination arrangement that provides similar results to those obtained with the anti-scatterring bars in FIG. 48. FIG. 48 shows a pattern of 75 nm trenches arranged on a 6% attenuated phase shift mask (6% att-PSM). The pattern includes a 50 nm anti-scattering bar on each side of the trenches. The pitch between the anti-scattering bars (on each side of the trenches) is 150 nm. As explained above, optimization of the conditions of illumination was first done by selecting the best illumination arrangement using the responses calculated with mask assist features. Selection of the best arrangement was performed with the max DOF and max EL responses. For reference, the variation of these two responses as a function of source point position is represented in FIGS. 49a and 49b. In this trial, the reticle used is a 6% attenuated phase shift mask, the radiation has a 193 nm wavelength and the exposure is done with a 0.93 numerical aperture. A 15 nm positive bias is applied on the mask and the trenches have a 90 nm size on the mask.

Figure 50:
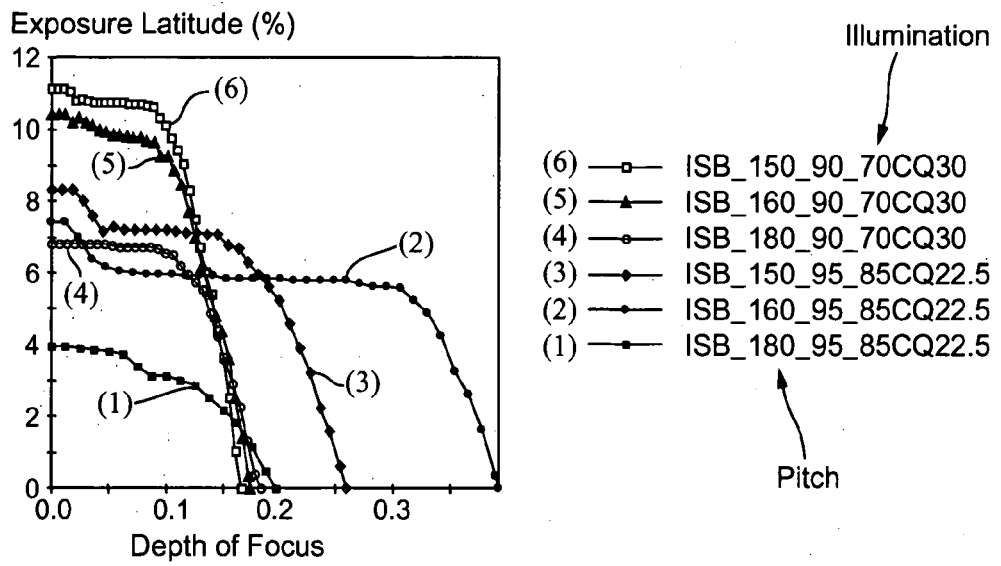
FIG. 50 shows the variation of the exposure latitude as a function of depth of focus for various Anti-Scatterring bar pitches and for various size and length of CQuad poles.

As can be seen in FIGS. 49a and 49b, a very wide CQuad or quasar arrangement may be desirable to obtain the best condition of illumination. Results for these types of illumination arrangement in terms of Exposure Latitude are represented in FIG. 50. The pattern is the same as that of FIG. 48 (i.e., 75 nm trenches with 50 nm side bar per side (1SB/side)). This graph shows the variation of EL as a function of depth of focus for various lengths and sizes of CQuad poles (the length being expressed in arc degree) and for various Anti-Scatterring Bar pitches (varying from 150 nm to 180 nm). This graph shows that the best illumination arrangement and the best lithographic process may be attained with ASB disposed in a 160 nm pitch and exposed with 22.5° CQuad poles. In this trial, a 10 nm and 20 nm positive bias, corresponding to a size of the trench of 85 nm and 95 nm respectively, is applied on the mask.

Figure 51A:
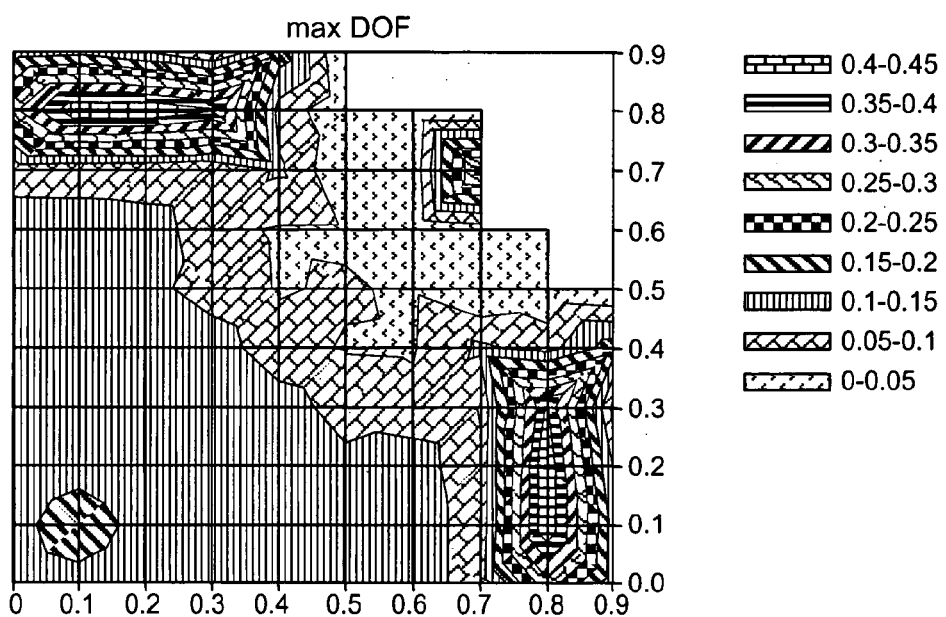
FIGS. 51a and 51b are two contour maps representing the variation of Depth of Focus and Exposure Latitude as a function of source point location for simulations done for the structure depicted in FIG. 48 (without anti-scattering bars) and for a 6%-attenuated phase shift mask.
Figure 51B:
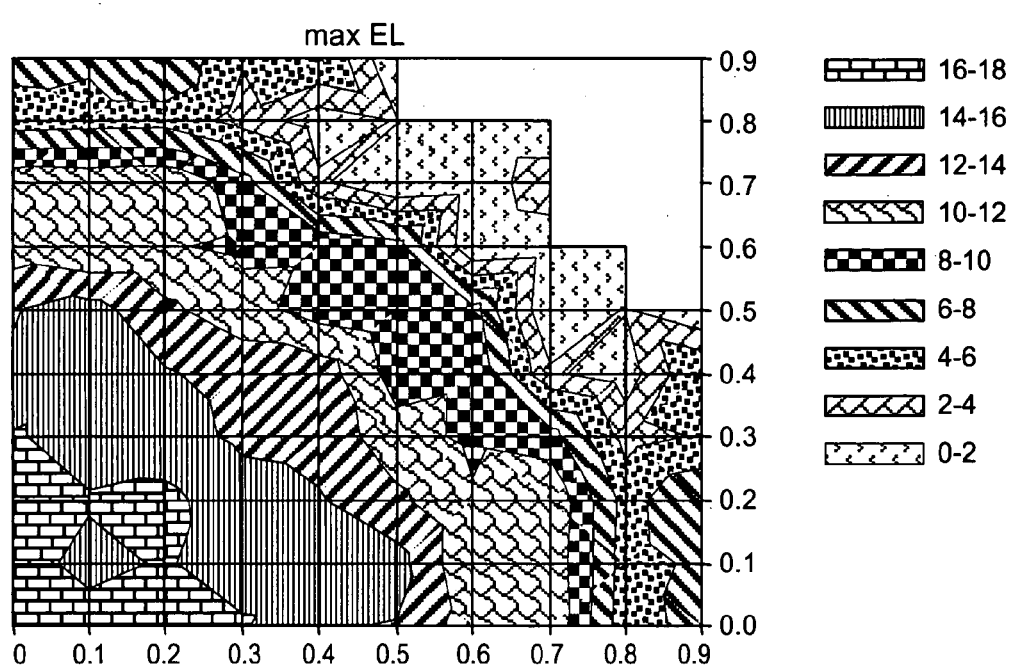

After finding the best illumination and ASB arrangement, the optimization of the condition of illumination according to an embodiment of the invention shown in FIG. 47 proceeds by calculating the same responses without mask assist features. These results are illustrated in FIGS. 51a and 51b, which represent the variation of these responses as a function of source point location. Calculations are performed with a 6% attenuated phase shift mask (6% att-PSM). A 6% att-PSM generally requires small sigma on-axis pole for dose latitude. Calculation of the separate responses for individual source points and determination of the contour map may be done with the embodiments of the present invention represented, for example, in FIGS. 13 and 18. As can be seen in these figures, the DOF response suggests that a CQuad illumination may be desirable to obtain a good process window. By contrast, the EL response indicates that a small sigma illumination may be best for this lithographic problem. It is therefore expected that a small sigma illumination combined with a wide CQuad illumination would constitute the best illumination arrangement to obtain a large process window.

In this particular case, selection of the size of the poles in the CQuad illumination and the size of the σ illumination was determined by isofocal compensation analysis according to the embodiment of the present invention illustrated in FIG. 24. That is, the sizes of the CQuad and σ spots are selected so that the resulting lithographic process is rendered substantially isofocal. By doing so, CD variations within the process window are drastically reduced, a substantial isofocal process over the predetermined range of focus may be obtained, and the focus range (DOF) over which the CDs remain acceptable is augmented.

Figure 52:
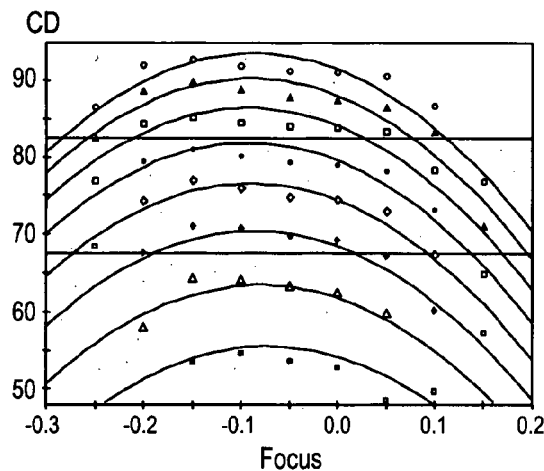
FIG. 52 shows the CD variation of the trench as a function of defocus with the trench exposed with a 35° CQuad and $0.1\sigma$ illumination that has been selected using isofocal compensation analysis.
Figure 52:
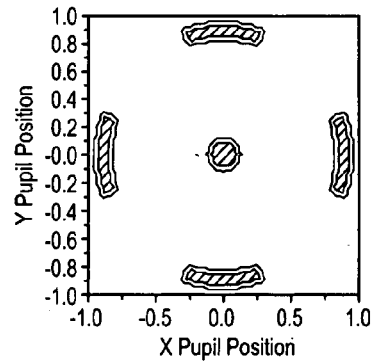

Using isofocal compensation analysis, it is concluded that one can match at least the results obtained with mask assist features by selecting a 35° CQuad illumination with a 0.1σ illumination. As can be seen in FIG. 52, the CD variation of the trench with this illumination arrangement is relatively stable over a predetermined range of focus. For reference, the cross section of the resulting beam intensity at the pupil plane of the illuminator is represented in this figure (identified by "(a)").

It should be noted that it may be desirable in some cases to reduce the intensity of the illumination from small poles in order to optimize the conditions of illumination. For example, it is possible to obtain the required "isofocal balance" without resorting to unrealistic small pole sizes. This may be achieved by reducing the intensity of the pole while increasing its size.

Figure 53:
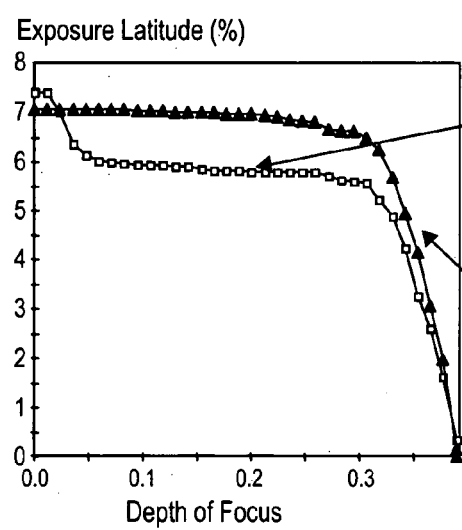
FIG. 53 represents the variation of Exposure Latitude as a function of Depth of Focus for the two illumination arrangements selected with the embodiment of the invention represented in FIG. 47.
Figure 53:
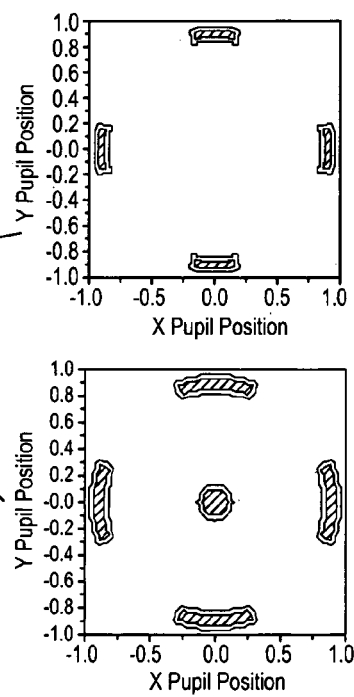

Referring now to FIG. 53, this graph shows the variation of exposure latitude as a function of depth of focus for the best lithographic process determined with mask assist features (same pattern as in FIG. 48) and for an alternative process that does not use assist features but which has been developed to give very good results (same pattern as in FIG. 48 without assist features). As can be seen in this graph, the lithographic process developed without mask assist features gives better results than the process developed with mask assist features. This results show that it is possible to replicate the positive effects obtained with mask assist features by selecting an appropriate illumination arrangement in accordance with the method of the present invention shown, for example, in FIGS. 13 and 18. It is therefore concluded that by selecting an appropriate illuminator arrangement with the embodiment of the present invention shown in FIG. 47, one can quickly develop a lithographic process that gives good results without using mask assist features. With the embodiment of the invention shown in FIG. 47, the "assist features" are applied in the illuminator and the need of complex and expensive reticles to print sub 150 nm patterns may be obviated.

Figure 54:
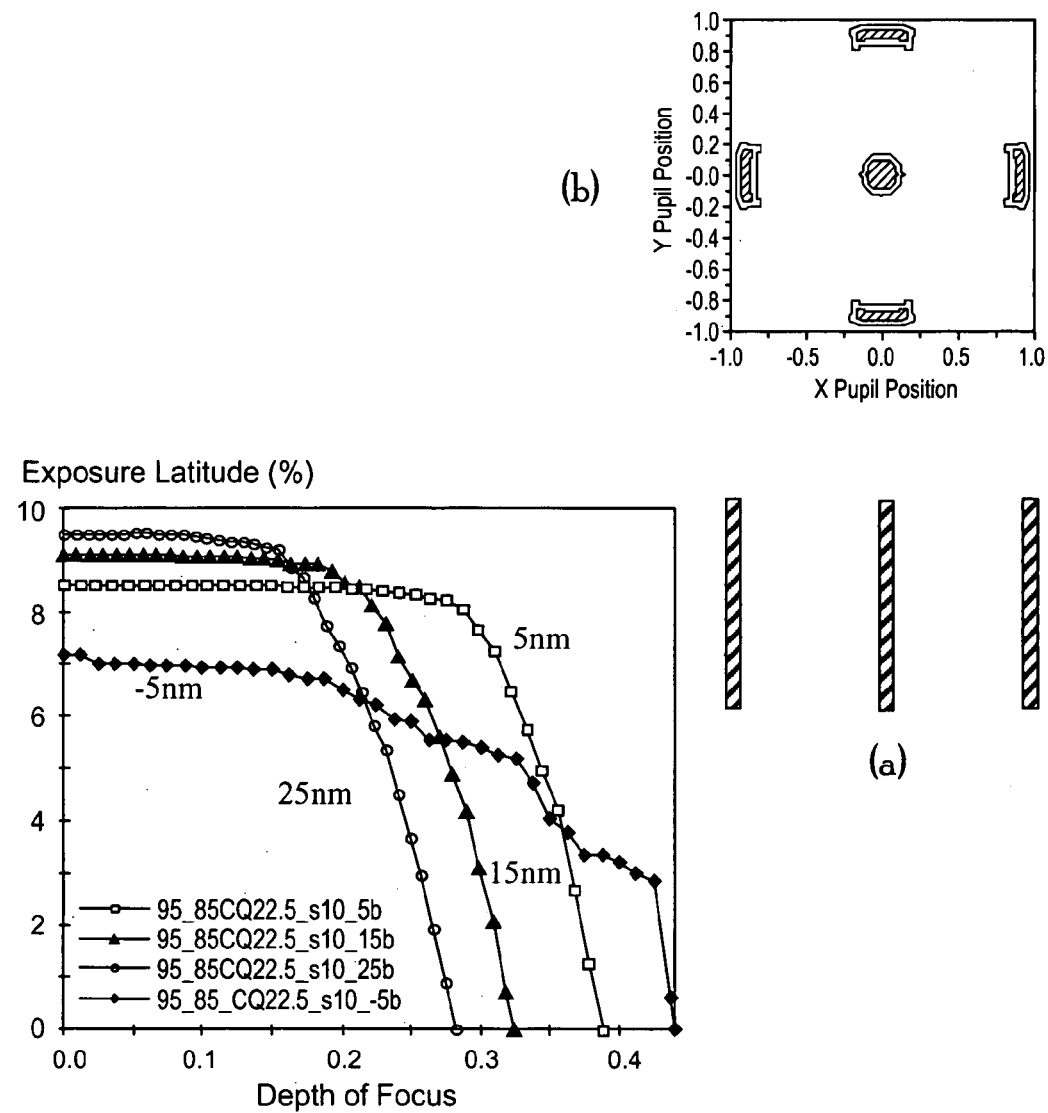
FIG. 54 represents the variation of Exposure Latitude as a function of Depth of Focus showing the effect of bias on Exposure Latitude.

It should be noted that by using a "simple mask/complex illuminator" approach as shown in FIG. 47, it is possible to reduce the pattern bias on the mask and, therefore, to increase the depth of focus of the lithographic process. Thus, as there are no assist features present on the mask, there is no risk of opening them by using high exposure energies. It is therefore now possible to use high doses with low bias to improve the process window. To illustrate this principle, reference is made to FIG. 54. This graph shows the variation of the exposure latitude as a function of depth of focus for various biases. Calculations are done with 75 nm trenches, a 6% att-PSM, a 193 nm radiation wavelength and a 0.93 numerical aperture. The pattern of FIG. 48 without assist features (identified as "(a)") and the illumination arrangement (identified as "(b)") are also shown. As can be seen in this graph, it is possible to increase the depth of focus with a −5 nm bias (corresponding to a 70 nm trench on mask).

Figure 55:
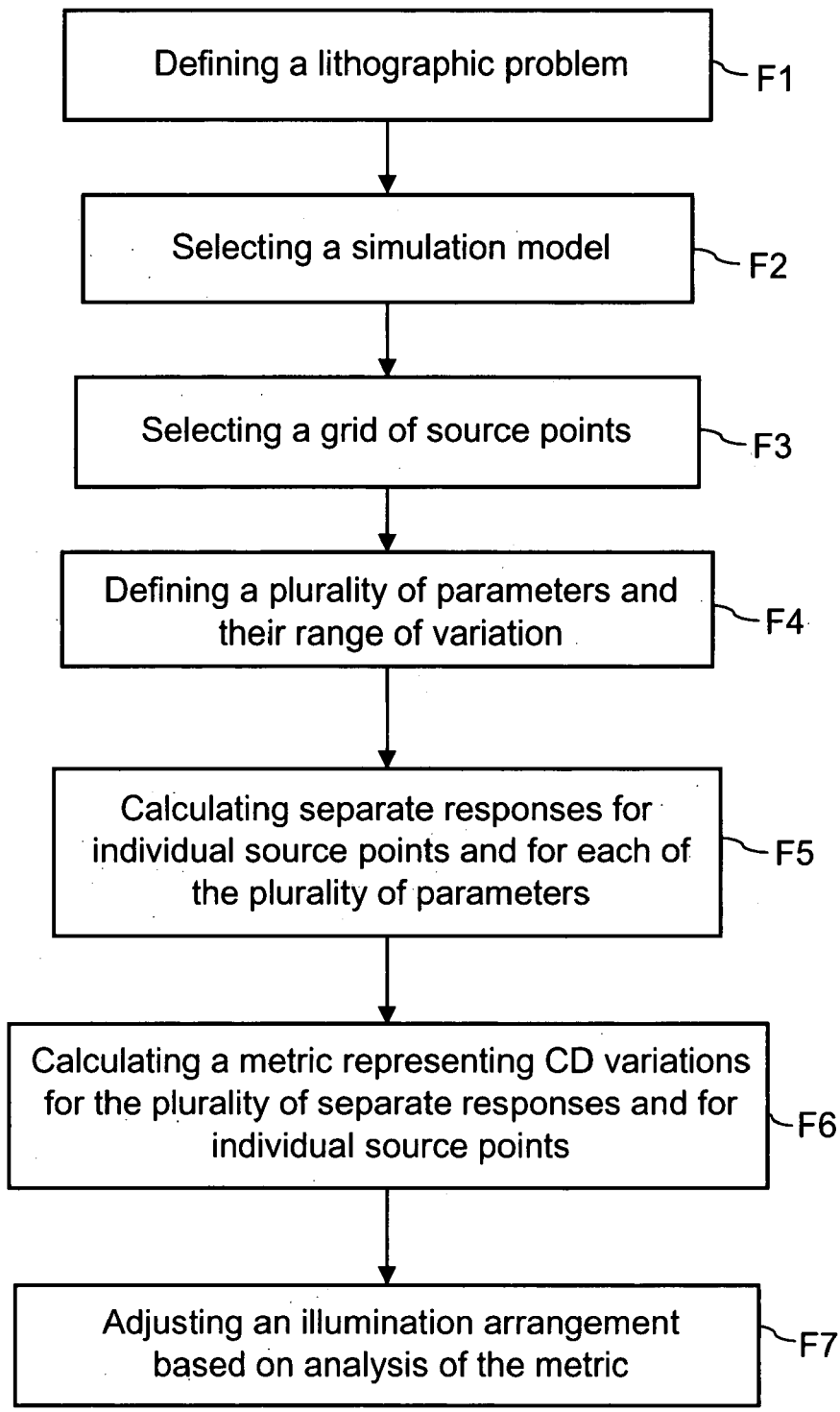
FIG. 55 is a flowchart illustrating a method for optimizing the conditions of illumination with best CDU metric in accordance with an embodiment of the invention.

Referring now to FIG. 55, a method for optimizing the conditions of illumination of a lithographic projection apparatus according to an embodiment of the invention will now be explained. In this embodiment of the invention, optimization of the illumination is performed using a best CDU (Critical Dimension Uniformity) metric. More particularly, the critical dimension uniformity of a lithographic pattern is calculated as a function of the source point location, and that information is then used to select the best condition of illumination.

In this embodiment of the invention, optimization of the source using best CDU metric is achieved with a method including: defining a lithographic pattern to be printed on the substrate; selecting a simulation model; selecting a grid of source points in a pupil plane of the illuminator; defining a plurality of parameters and their range of variation; calculating separate responses for the individual points and for each of the plurality of parameters, each of the responses representing a result of a single or series of simulations using the simulation model; calculating a metric representing a CD variation of the lithographic pattern for the plurality of parameters and for the individual source points; and adjusting an illumination arrangement based on analysis of the metric. In this embodiment of the present invention, optimization of the conditions of illumination is performed to maximize the critical dimension uniformity (CDU) of the lithographic pattern. This is achieved in an embodiment of the invention by including many important contributors to CD variation when selecting the best illuminator arrangement.

Critical dimensions (CDs), which are used to monitor the pattern size and ensure that it is within the customer's specification, are especially important to have size maintenance during substrate processing. CD uniformity (CDU) refers to when the designed values match the actual values on the substrate, or when the CD's of multiple similar features on the same semiconductor device are identical. CDU is generally considered by process engineers as one of the most direct indicators in determining whether a device will function within specifications.

However, pattern fidelity can deteriorate dramatically in sub-wavelength lithography and the resulting semiconductor features may deviate significantly in size and shape from the ideal pattern drawn by the circuit designer. Given that deviations from the target CD may dramatically affect the product yield and the product performances, it is desirable to account for CDU when selecting the best condition of illumination.

It should be noted that one of the approaches to determine simulated CD uniformity is to use a Monte Carlo method. In this method, all the variables are changed simultaneously with values selected randomly from their assumed (or known) distribution. With the method of the present invention, it is possible to obtain similar results to those obtained with a Monte Carlo calculation.

Referring back to FIG. 55, the method for optimizing the conditions of illumination using best CDU metric begins in step (F1) and proceeds to step (F3). That is, a lithographic problem is defined in step (F1), a simulation model is selected in step (F2) and a grid of source points is generated at the pupil plane of the illuminator in step (F3). Next the method proceeds to step (F4) where a plurality of parameters and their associated variation range are defined and loaded in the simulator.

In the embodiment of the present invention shown in FIG. 55, at least two separate responses are calculated. However, it may be desirable to calculate as many responses as possible for each source point in order to define a good process window. In an embodiment of the present invention, the plurality of parameters may include the focus range (μm), the dose range (%), the lens aberrations (RMS in milliwaves), the system flare level (%), the variation of pattern density (%) and the mask CD range (nm). The flare level corresponds to non-image-forming light that reaches the substrate, resulting generally in a loss of contrast in the final image. It should be understood that this list of potential parameters is not exhaustive and that additional parameters may also be included in the calculation.

The method according to the embodiment of the present invention shown in FIG. 55 then proceeds to step (F5) where separate responses are calculated for each source point and for each parameter. In FIG. 55, the calculated response is a critical dimension (CD) of the lithographic pattern defined in (F1). More particularly, the CD variation is calculated for each source point over the predetermined range defined in (F4). In the embodiment of the invention shown in FIG. 55, each of the parameters, i.e. each of the causes of CD variations, are treated independently.

After determining a plurality of CD variation (each of them being obtained by varying the value of the parameters over their predetermined range), the method then proceeds to step (F6) where a metric is calculated. This metric determines the overall CD variation induced by all of the parameters. More particularly, the metric calculates the quadratic sum of the parameters and determines an average CD variation for each source point. The method then ends in step (F7) where an illumination arrangement is adjusted based on analysis of the metric.

It should be understood that it is up to the user of the method of the present invention to determine a way of weighting the CD variation. Therefore, it should be understood that the CD variation for each source point may be determined differently in other embodiments of the invention. For example, in an embodiment of the present invention, the highest CD variation induced by the parameters may represent the CD variation for the studied source point.

Figure 56:
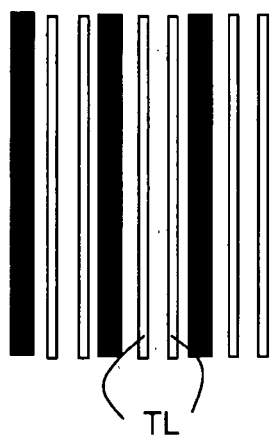
FIG. 56 schematically illustrates a 50 nm double line structure printed on a CPL mask.
Figure 57:
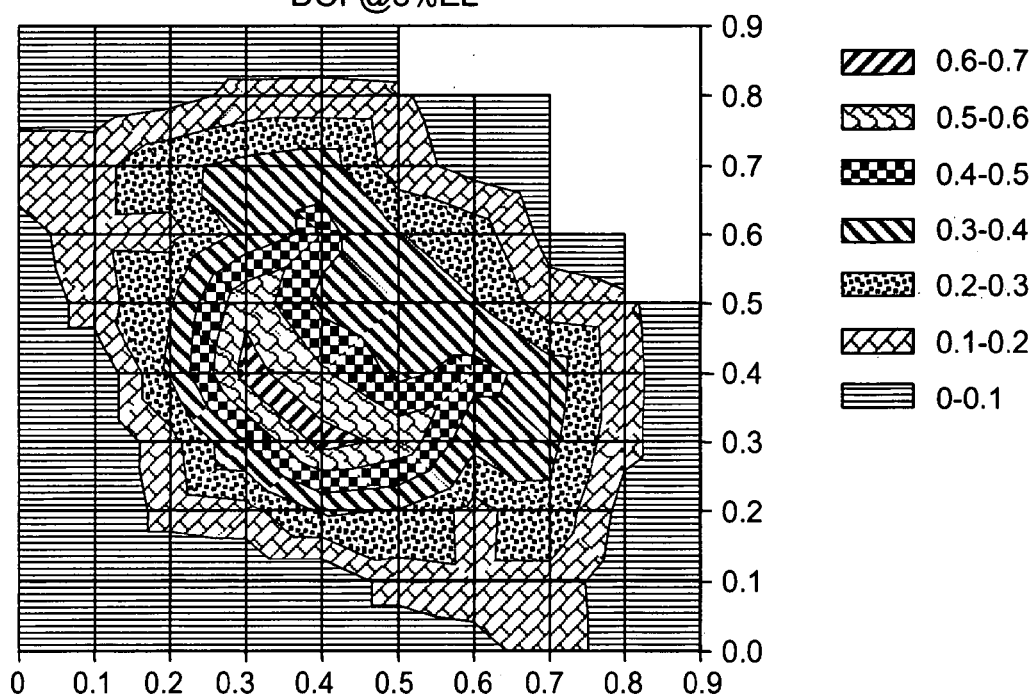
FIG. 57 is a contour map representing DOF@8% EL variation as a function of source point location in accordance with an embodiment of the present invention.

The method of optimization according to the embodiment of FIG. 55 was successfully applied to select the best illumination arrangement for the lithographic problem shown in FIG. 56. This problem corresponds to a pattern of 50 nm twin line structures (identified as "TL" in FIG. 56) printed with a CPL mask. As can be seen in FIG. 57, calculation of the DOF@8% EL as a function of source point location, according to the embodiment of the invention shown in FIG. 16, indicates that a small quasar illumination may be desirable to print for this specific lithographic pattern. Calculations were performed with a 0.82 numerical aperture, a 157 nm radiation wavelength and a resist simulation model. FIG. 57 shows that the "best choice" for illumination based on a process window metric is a 0.64/0.42 Quasar 30° illumination arrangement. This illumination arrangement corresponds to an off-axis quadrupole illumination arrangement that includes poles arranged at +/−45° relative to the horizontal axis of the illuminator. Each pole has a 30° opening angle, a 0.42 inner radius and a 0.64 outer radius. As also shown in FIG. 57, smaller poles centered at about the same location are expected to give better process window.

Figure 58:
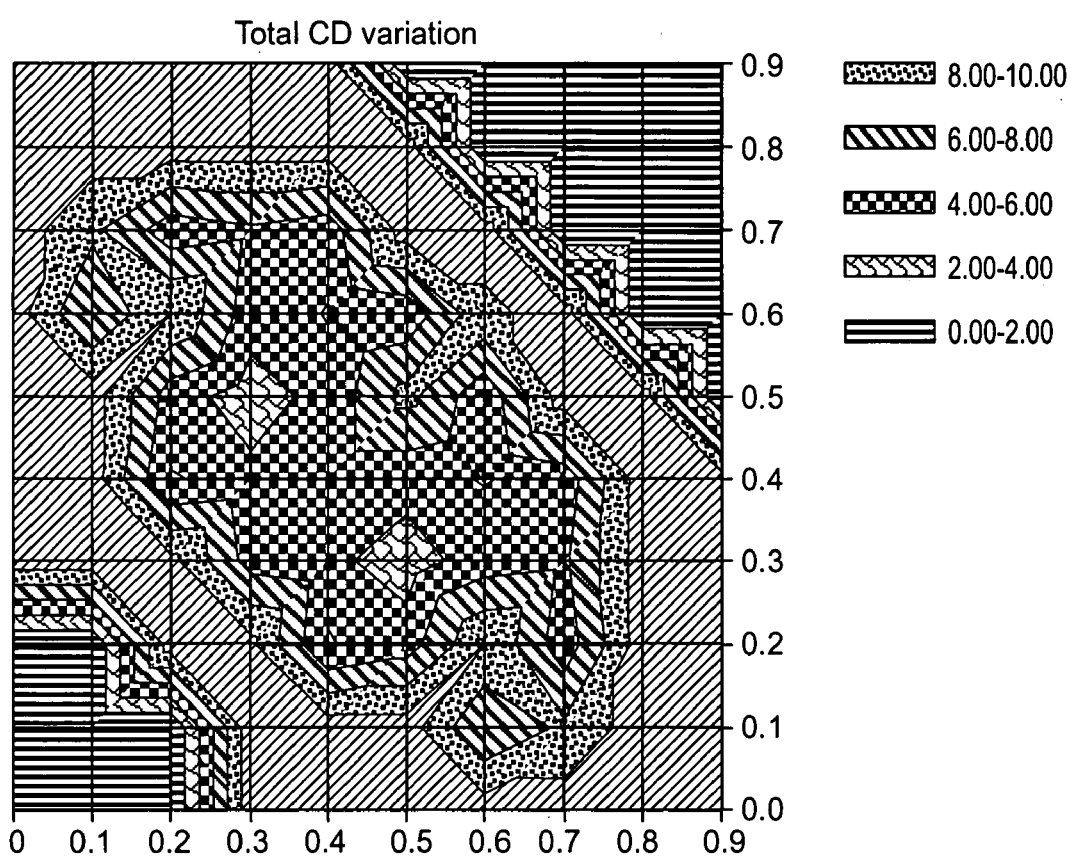
FIG. 58 is a contour map representing CD variation as a function of source point location in accordance with the embodiment of the present invention shown in FIG. 55.

Referring now to FIG. 58, this contour map illustrates the total CD variation, determined in accordance with the embodiment of the invention shown in FIG. 55, as a function of source point location. This graph suggests that a quasar illumination with large poles (or at least larger than those determined in FIG. 57) may be desirable to lower CD variation and to improve the CD uniformity (CDU). As can be seen in FIG. 58, the lowest CD variation is obtained with source points that are slightly off the 45° diagonal.

A comparison of CD variation for different illumination arrangements and for different parameters is shown in FIG. 59. Calculation of the CD variation for each of these arrangements is done with the embodiment of the present invention illustrated in FIG. 55. In FIG. 59, the CDU values were calculated using the actual illuminators (A–E) depicted. The sigma range along the X-axis and Y-axis of the illumination arrangements shown in FIG. 59 is from −1 to +1. However, the CD value for each arrangement may also be determined by averaging the CD values of each point contained within the illumination spots (similarly to the embodiment of the invention shown in FIG. 18). As can be seen in this graph, the quasar arrangements with poles larger than those determined in FIG. 57 lower the CD variation. The best conditions are obtained for the following illumination arrangements: 0.64/0.42Q45° and 0.64/0.42Q60°. The process window is expected to increase when the size of the off-axis poles decreases. More importantly, this graph shows that selecting an illuminator based on the process window alone may not be sufficient to reduce CD variation. It is concluded, therefore, that the best CDU approach defined in the embodiment of the invention of FIG. 55 may be a useful tool to optimize the conditions of illumination for a given lithographic problem.

As mentioned in the foregoing discussion, the shape of the mask pattern may be adjusted in order to increase both the depth of focus and the resolution of the printed pattern and to limit the distortions that arise at small k1 values. These enhancement techniques generally include optical proximity corrections (OPC), use of a phase shift mask and sub-resolution assist features (SRAF).

Alternatively or additionally, and as previously explained in detail, the optimization of the depth of focus and the resolution may be achieved by refining the illumination conditions in a way that maximizes CD uniformity between various pattern features. This may be done, for example, by configuring portions of the illumination arrangement that maximize specific lithographic responses. However, as the radiation wave diffracted by the patterning structure pattern is dependent on both the illumination amplitude and the diffractive properties of the pattern, a method that only optimizes the illumination arrangement (e.g., shape) to achieve acceptable CD uniformity may be constrained by the geometry of the desired pattern to be printed.

It is proposed in an embodiment of the invention to perform a simultaneous parametric illumination arrangement and patterning structure optimization using a calibrated model. By optimizing both the illumination arrangement (e.g., illumination shape) and the patterning structure pattern, it may be possible to print specific repetitive or other patterns at very low k1 values, e.g., k1 values lower than about 0.35–0.3.

In an embodiment, the source mask optimization (hereinafter also referred to as "SMO" in some portions of the text) may be accomplished by identifying useful parameters for the optimization, by performing iterative simulations with a calibrated model in order to optimize the identified parameters, and by minimizing or maximizing a selected metric. The selected metric determines and/or calculates the response of an attribute of the printed pattern (e.g., CD non-uniformity/variation), which is calculated with the optimized identified parameters, over an assumed budget of process parameters (e.g., focus, dose, and mask size variation). The lithographic parameters are adjusted based on the value of the metric until, for example, the smallest or largest value for the attribute is obtained, thus producing a "best result" with the corresponding lithographic parameters giving the smallest or largest value of the metric. For example, the lithographic parameters are adjusted until the smallest value of the CD non-uniformity is obtained.

At very low k1, i.e., k1 values below about 0.35, the image that prints in resist may be quite different from the projected image due to finite dissolution contrast associated with the resist process. As a result, a source mask optimization based only on optical image considerations may be undesirable since it may produce large errors. Moreover, approaches that use indirect metrics such as image contrast or NILS may not easily incorporate responses such as depth of focus in the optimization procedure.

In order to provide more direct, realistic results, a calibrated model is used to perform the SMO, in accordance with an embodiment of the invention. A calibrated model is a model that has been matched to experimental data. In an embodiment, the calibrated model may be obtained by calibrating a lithographic model of a simulator (e.g., Prolith™) with various experimental data. For example, the AutoTune option of Prolith™ may be used to automatically calibrate the simulation model to specific experimental data including CD and photoresist thickness.

Figure 60:
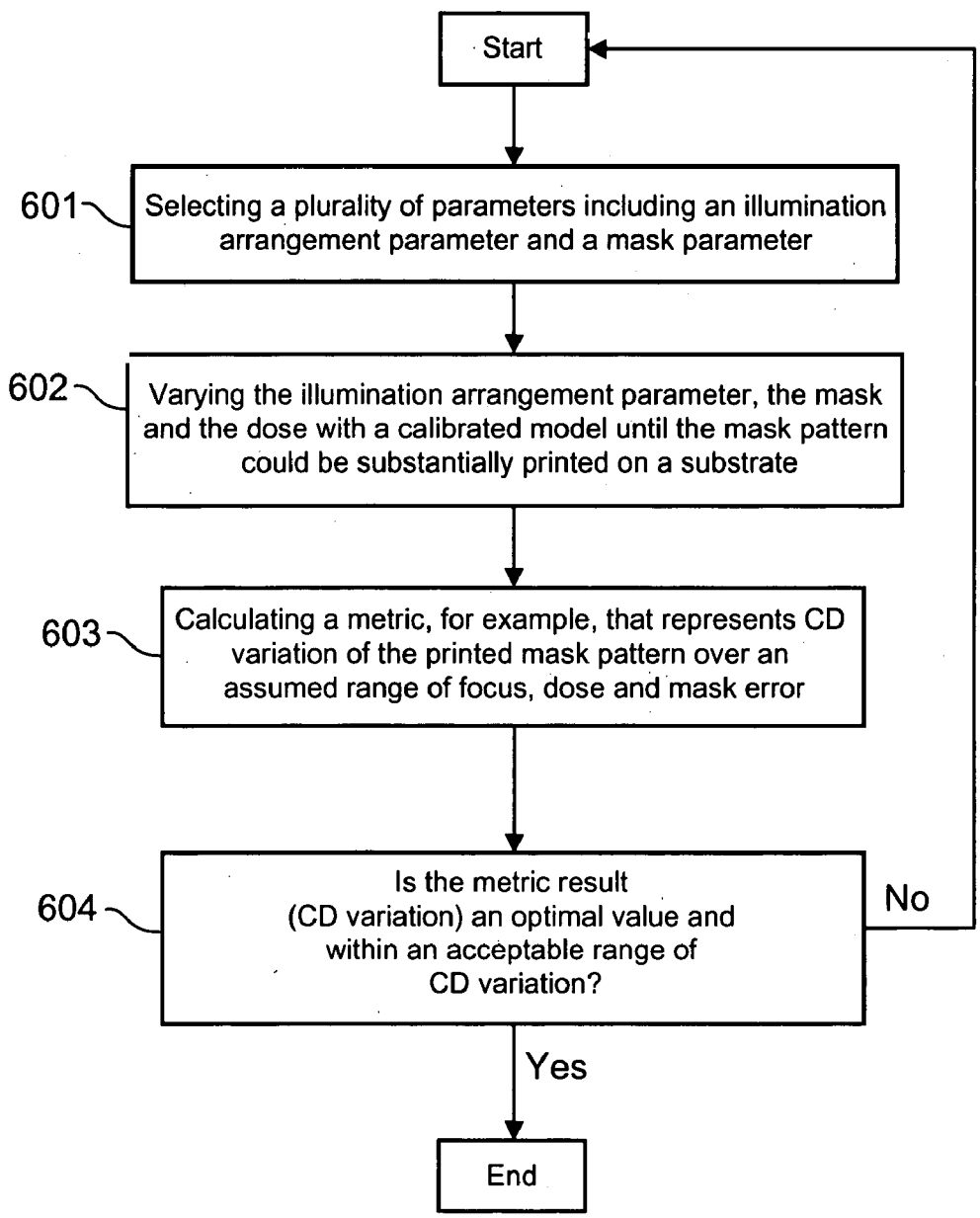
FIG. 60 is a flowchart representing a method of optimizing a lithographic process using a parametric source mask optimization in accordance with an embodiment of the invention.

Referring to FIG. 60, a method of configuring a lithographic process using a parametric source mask optimization in accordance with an embodiment of the invention will now be explained in terms of a mask as an example of the patterning structure. The method begins at step 601 where a plurality of lithographic parameters are selected. The plurality of lithographic parameters include an illumination arrangement parameter and a mask parameter.

Figure 61A:
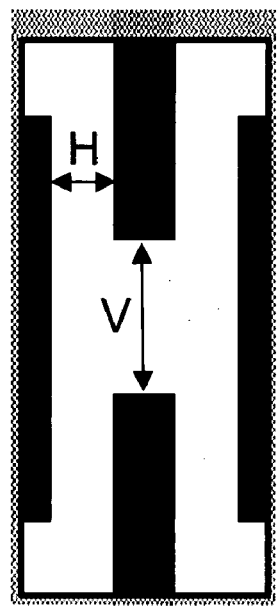
FIG. 61a shows a brickwall pattern.
Figure 61B:
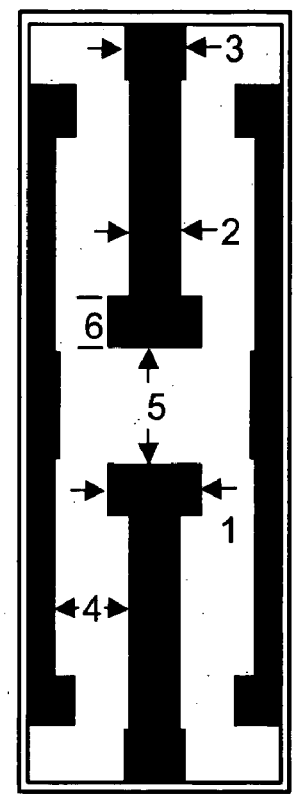
FIG. 61b shows the brickwall pattern including various optical proximity corrections.

In an embodiment, the mask parameter may include a horizontal space H or a vertical gap V between two features of the mask pattern, as shown in FIG. 61a. FIG. 61a shows a brickwall pattern that represents a portion of a DRAM structure, which may be used in performing the SMO. This pattern includes a horizontal pitch of about 180 nm and a vertical pitch of about 600 nm. The mask parameter may also include multiple mask parameters that define the OPC or SRAF that are applied on the pattern. FIG. 61b shows an example of a brickwall pattern that includes OPC. The multiple mask parameters may include the hammerhead width (1), the brick width (2), the center hammerhead (3), the horizontal gap (4), the vertical gap (5) and the hammerhead length (6). It will be appreciated that additional mask parameters may be used in other embodiments of the invention. These additional mask parameters may include, for example, the phase shifting transmissivity.

Figure 62:
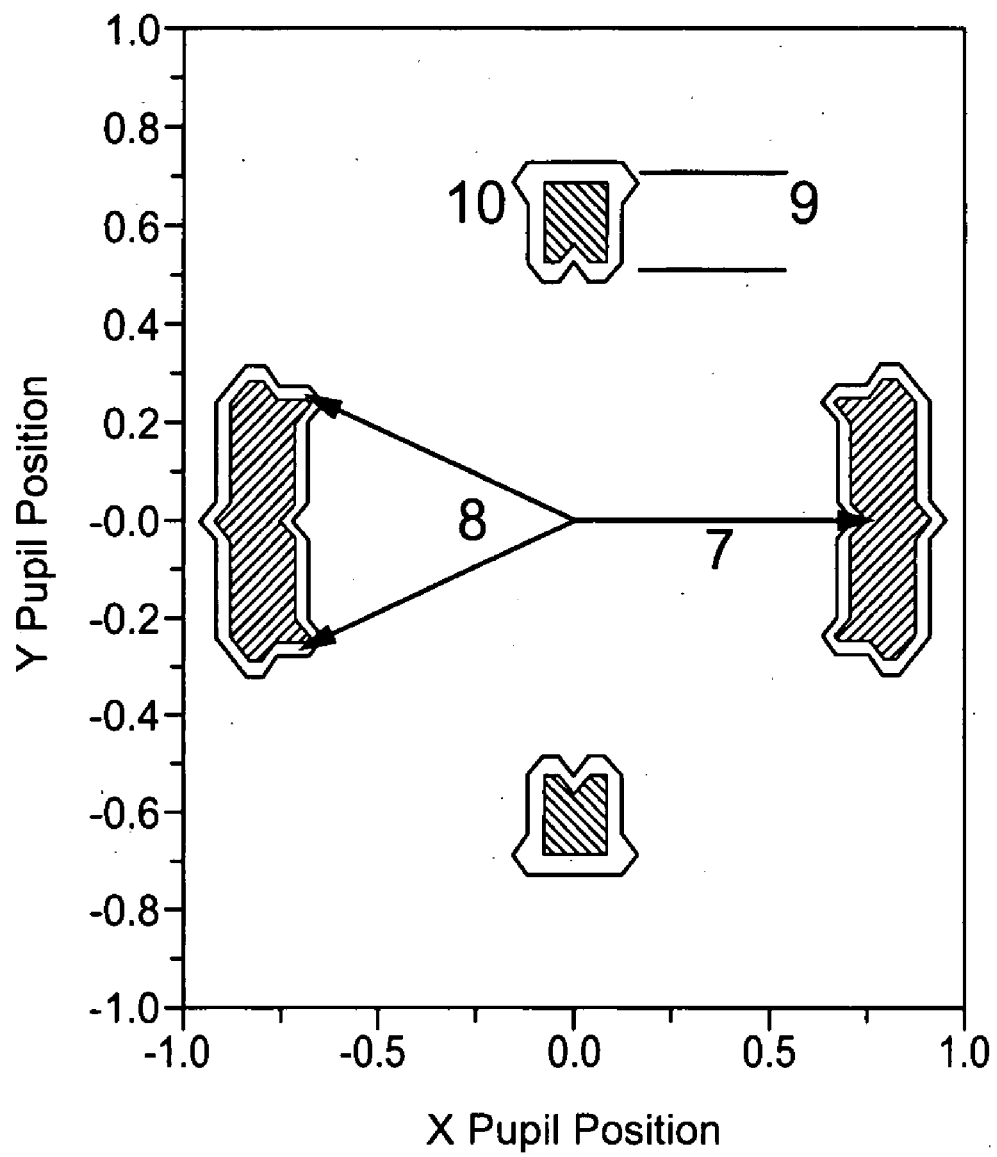
FIG. 62 shows various source parameters that may be varied during a source mask optimization procedure.

Illumination arrangement parameters that may be used in an embodiment may include geometric parameters that define the position and/or the dimension of the illumination shape within the illumination system. FIG. 62 shows an asymmetric parametric illumination shape in accordance with an embodiment of the invention. This illumination shape corresponds to a quadrupole illumination including a first and a second dipole that are oriented along, respectively, a first horizontal axis (as seen in FIG. 62) and a second vertical axis (as seen in FIG. 62) of the illumination system. This illumination arrangement may be referred to as an asymmetric CQuaD. Each pole of the first dipole has an inner/outer radii of about 0.7/0.9 and an opening angle of about 40°. Each pole of the second dipole has an inner/outer radii of about 0.5/0.7 and an opening angle of about 20°. In this example implementation, the source parameters may include one or more of the following four parameters: the pole center radius (7), the pole opening angle (8), the pole radial width (9), and the pole intensity (10) of one or more poles and the illumination arrangement. It will be appreciated that additional parameters may also be used. Additionally or alternatively, those and/or other parameters may be used for other embodiments, e.g., annular, 5-pole (e.g. a CQuad + a central pole, or a quadrupole having two dipoles oriented at about +/−45° with respect to the horizontal axis (also referred to as a Quasar arrangement) and a central pole).

The method then proceeds to step 602 where the illumination arrangement and mask parameters and the dose are iteratively varied with a calibrated model until the calculated image of the pattern printed on a substrate is within predetermined specification. When the image of the pattern calculated by the calibrated model is within specification, the image substantially matches the nominal pattern.

Specifically, the image of the mask pattern is calculated with a calibrated model for an initial set of values of dose, mask parameters and illumination arrangement parameters. The calculated image is then compared to the nominal mask pattern and, if the calculated image substantially differs from the nominal pattern (e.g. tolerance/specification of a few percent may be acceptable), a new set of values for the dose, illumination arrangement parameters and mask parameters are generated. Iterative image calculations are then performed with a convergence routine to determine the set of parameters (dose, mask and illumination arrangement) for which the calculated image matches the nominal printed pattern or an otherwise acceptable printed pattern (e.g. tolerance of a few percent (e.g. +/−5%) may be acceptable). In doing so, the mask parameters (e.g., optical proximity correction values) are adjusted to match the size targets on the printed wafer.

After finding the iterated values of the selected parameters, the method proceeds to step 603 where a metric representing, for example, the CD variation for an assumed budget of focus, dose and mask error is calculated. In an embodiment, the metric may include the quadratic sum of the CD variations induced by defocus, dose and mask variations, as shown in equation (3):

$$CD \text{ total variation} = \sqrt{CD_{Rfoc}^2 + CD_{Rdose}^2 + CD_{Rglobalmask}^2} \quad (3)$$

where $CD_{Rfoc}$, $CD_{Rdose}$, and $CD_{Rglobalmask}$ correspond to the CD variation induced by focus, dose, and mask variations, respectively, over an assumed budget.

It will be appreciated that the total CD variation as defined in equation (3) substantially represents the full CD variation range of the pattern printed on the wafer and, as such, approximates the six sigma statistical variation range. Thus, half of the value of the CD variation (also termed as CD variation half range) substantially approximates the normally used three sigma CD uniformity (CDU).

At step 604, a determination is made as to whether the result of the metric is acceptable, e.g., within an acceptable range of CD variation (typically 10%), and, alternatively or additionally, has converged to its optimal value. If the determination is positive, the SMO ends. If the determination is negative, the method then proceeds to step 601 where new trial conditions are generated, and the method proceeds again from step 601 to step 603 and a new value of the lithographic response (e.g., CD variation) is obtained. In an embodiment, this procedure is iterated until a minimum value (e.g., if the lithographic response is the CD variation) or a maximum value is obtained. The new trial conditions may include, for example, new values for the set of parameters. Alternatively, the new trial conditions may include a new illumination arrangement (e.g., shape), a new OPC, another mask parameter, or another illumination arrangement parameter of the previously used illumination arrangement.

The initial illumination arrangement shape (e.g., annular, dipole, quadrupole or a multipole including on and off-axis illumination) may be determined either via experimentation or simulation. In this latter case, the initial illumination arrangement shape for the selected mask pattern may be estimated with contour maps that are generated using the method illustrated in the embodiment of FIG. 13. Once the initial illumination arrangement shape is generated, geometric parameters defining the illumination arrangement are selected as the illumination arrangement parameters of the SMO.

Figure 63A:
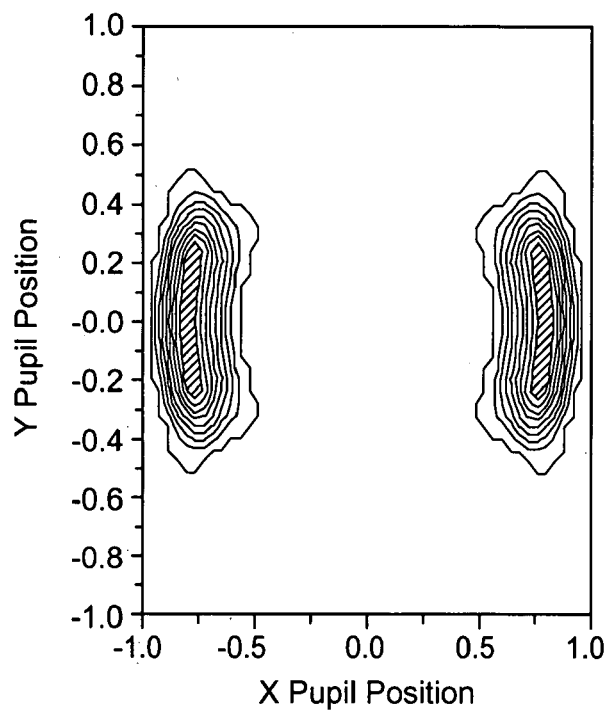
FIGS. 63a–b respectively show an illumination source and a mask pattern that are simultaneously optimized with the source mask optimization procedure.
Figure 63B:
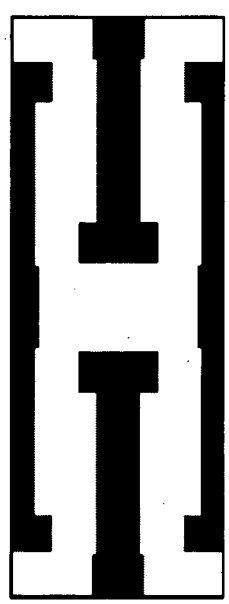

FIGS. 63*a–b* show respectively an illumination shape (dipole of about max σ=0.9) and a brick wall mask pattern that are configured in accordance with the embodiment of FIG. 60. In this embodiment, the illumination arrangement parameter corresponds to the pole angle and the configured mask parameters include: (1) the hammerhead width, (2) the brick width, (3) the center hammerhead, (4) the vertical gap and (5) the hammerhead length. Table (b) shows the values of the illumination arrangement and mask parameters determined by SMO described above. In this embodiment, calculations are iterated until a lowest CDU value is obtained. In an embodiment, the lowest CDU value is within +/−10% CD variation, preferably within +/−5% CD variation. Table (b) also shows the value of three additional illumination arrangement parameters, which remain unchanged during the SMO procedure. These additional illumination arrangement parameters include the pole center, the pole width and the pole intensity. As will be appreciated, any appropriate combination of the above-mentioned parameters may be varied in the SMO procedure.

TABLE (b)

| Mask Parameters | |
|---|---|
| Hammerhead width | 135.6 nm |
| Brick width | 74.9 nm |
| Center hammerhead | 88.7 nm |
| Vertical gap | 115.6 nm |
| Hammerhead length | 56.3 nm |
| Illumination Arrangement Parameters | |
| Pole center | 0.82 |
| Pole angle | 55.6° |
| Pole width | 0.2 |
| Pole intensity | 1 |

Figure 63C:
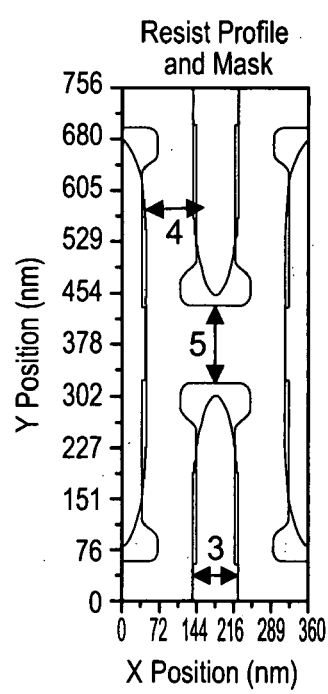

FIG. 63*c* shows a superposition of the modified mask pattern using the SMO and the simulated image of the mask pattern. As can be seen in this figure, the agreement between these two patterns is good. The use of optimized hammerheads allows one to significantly reduce line shortening and to obtain a simulated image that substantially matches the nominal pattern. Table (c) shows various CD values of the simulated image of the mask pattern after SMO, and the CDU and MEEF results. Table (c) also shows the nominal CD values of the pattern.

TABLE (c)

| | | |
|---|---|---|
| Dose | 53.8 mJ/cm² | |
| Mask (vertical gap) | 115.6 nm | |
| CD (horizontal "4") | 95.1 nm | 95 nm (nominal) |
| CD (vertical "5") | 149.9 nm | 150 nm (nominal) |
| CD (middle "3") | 85 nm | 85 nm (nominal) |
| MEEF (horizontal) | 4.1 | |
| MEEF (vertical) | 12.5 | |
| CDU (horizontal) | 4.6 nm | |
| CDU (vertical) | 14 nm | |
| Weighted CDU | 7.75 nm | |

The weighted CDU was used as the metric in the SMO and in this case is defined as:

$$\text{Weighted } CDU = \frac{(2 * CDU \text{ (horizontal)} + CDU \text{ (vertical)})}{3}$$

As can be seen in Table (c), SMO provides acceptable CDU and MEEF values. These CDU and MEEF values are about two to three times lower than those obtained without SMO.

Figure 64A:
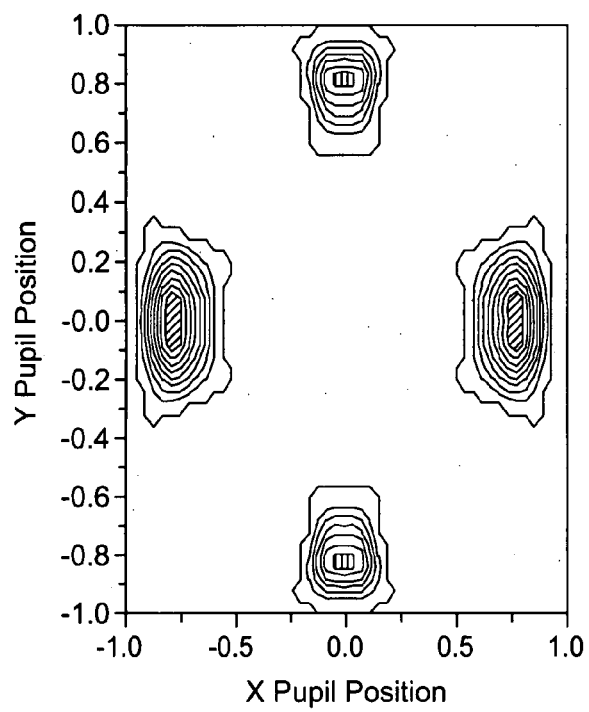
FIG. 64a shows an illumination source that is optimized with the SMO procedure of FIG. 60.

FIG. 64*a* shows an illumination shape that includes an asymmetric quadrupole illumination having four poles oriented along the horizontal and vertical axis of the illumination with max σ=0.9. This illumination shape, which may be referred to as "CQuad", is configured with the mask pattern of FIG. 63b in accordance with the embodiment of FIG. 60. In this embodiment, the mask pattern remains the same (brick wall), but a vertical dipole is added to the initial horizontal dipole illumination shape of FIG. 63a. Similarly to the embodiment of FIG. 63a, calculations are iterated until convergence is obtained. In this embodiment, the combined illumination arrangement parameters are the x-pole angle and the y-pole intensity and the mask parameters are the hammerhead width, the brick width, the center hammerhead and the vertical gap between the two lines (identified as "5" in FIG. 63c). Table (d) shows the values of the illumination arrangement and mask parameters determined by the SMO. Table (d) also shows the values of six additional illumination arrangement parameters and one additional mask parameter, which remain unchanged during the SMO. These additional parameters include the x-pole center, the x-pole width, the x-pole intensity, the y-pole center, the y-pole angle, the y-pole width, and the hammerhead length. As will be appreciated, any appropriate combination of the above-mentioned parameters may be varied in the SMO procedure.

TABLE (d)

| Mask Parameters | |
|---|---|
| Hammerhead width | 150.8 nm |
| Brick width | 77.2 nm |
| Center hammerhead | 98.1 nm |
| Vertical gap | 120.4 nm |
| Hammerhead length | 61.8 nm |
| Source Parameters | |
| x-pole center | 0.82 |
| x-pole angle | 31.3° |
| x-pole width | 0.2 |
| x-pole intensity | 1 |
| y-pole center | 0.82 |
| y-pole angle | 20° |
| y-pole width | 0.2 |
| y-pole intensity | 0.68 |

Figure 64B:
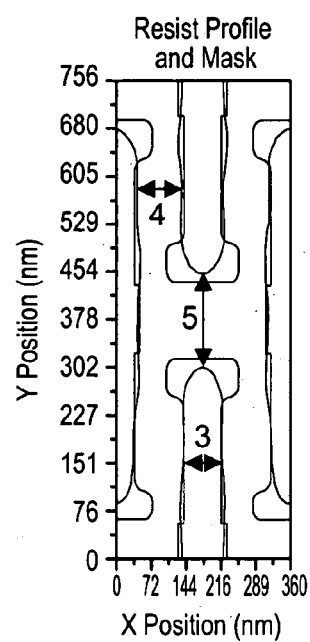

FIG. 64b shows a superposition of the modified mask pattern using the SMO and the simulated image of the mask pattern. As can be seen in this figure, the agreement between these two patterns is also good, although the profile for the horizontal space is slightly degraded relative to the pure dipole. Table (e) shows various CD values of the simulated image of the mask pattern after SMO, and the CDU and MEEF results. Table (e) also shows the nominal CD values of the pattern.

TABLE (e)

| Dose | 61.3 mJ/cm² | |
|---|---|---|
| Mask (vertical gap) | 120.4 nm | |
| CD (horizontal "4") | 95.1 nm | 95 nm (nominal) |
| CD (vertical "5") | 150.1 nm | 150 nm (nominal) |
| CD (middle "3") | 85 nm | 85 nm (nominal) |
| MEEF (horizontal) | 5.1 | |
| MEEF (vertical) | 7.1 | |
| CDU (horizontal) | 5.9 nm | |
| CDU (vertical) | 7.8 nm | |
| Weighted CDU | 6.52 nm | |

Figure 65A:
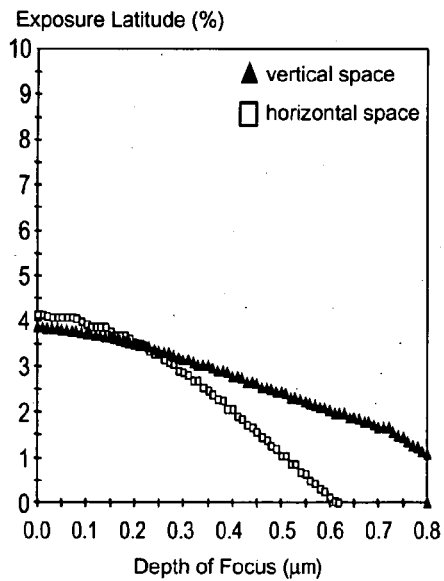
FIGS. 65a–c show the variations of exposure latitude as a function of depth of focus for both the vertical space and the horizontal space of FIG. 61a and for an optimization procedure including SMO (FIGS. 65b–c) and an optimization procedure that does not include SMO (FIG. 65a)
Figure 65B:
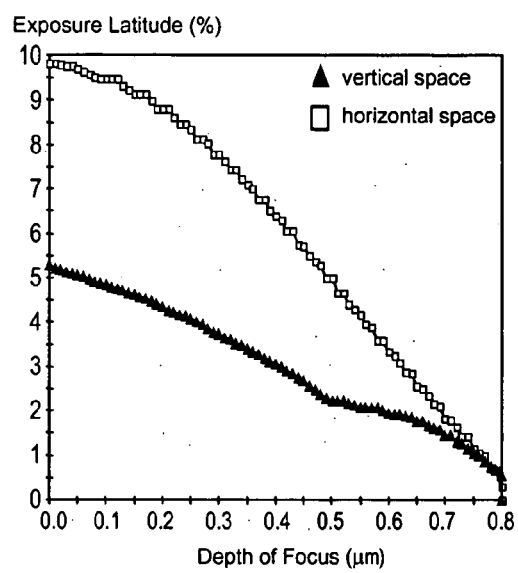
Figure 65C:
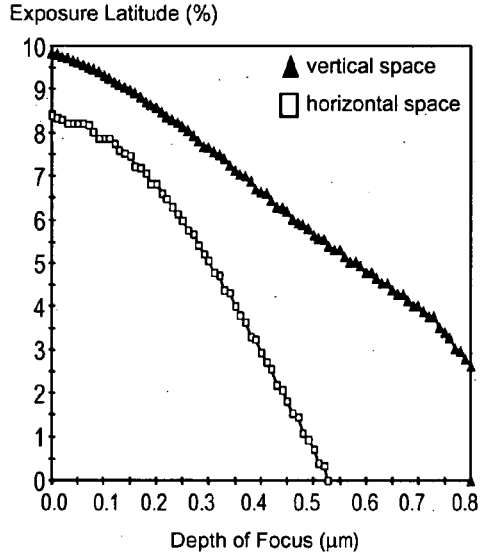

FIGS. 65a–c show the variations of exposure latitude as a function of depth of focus (μm) for various illumination arrangements and mask patterns that are configured to print the brickwall pattern of FIG. 61a to the nominal size (95 nm horizontal space and 150 nm vertical space). The exposure latitude for both the vertical space and the horizontal space (H and V distances of FIG. 61a) are represented in FIGS. 65a–c.

Figure 66A:
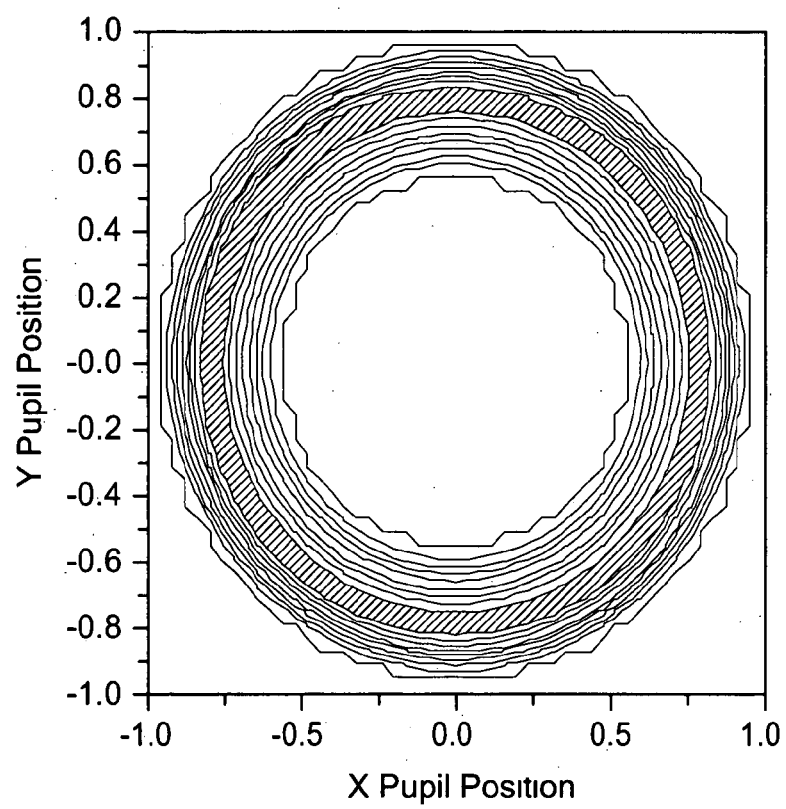
FIGS. 66a–b respectively show an illumination source and the mask pattern that are individually optimized without SMO.
Figure 66B:

In FIG. 65a, the illumination is optimized independently from the mask pattern and corresponds to an annular illumination including about a 0.9/0.7 outer/inner radius. Because the brickwall pattern has a 90 nm half pitch and the assumed numerical aperture and radiation wavelength are 0.8 and 248 nm, respectively, the estimated convention circular optimal illumination based on the diffraction theory is about σ=0.86 (σ=1/(4*k1)=0.86 and $$k_1 = R * \frac{NA}{\lambda}$$

with λ=248 nm, (90*0.8/248=0.29032)). In order to simulate a σ=0.86 with a realistic illumination setting, a 0.9/0.7 annular illumination may be used, as shown in FIG. 66a. FIG. 66b shows the required brickwall mask pattern without using hammerhead OPC.

FIG. 65b shows the exposure latitude results obtained for the illumination shape of FIG. 63a and the mask pattern of FIG. 63b configured using SMO. FIG. 65c shows the exposure latitude results obtained for the illumination shape of FIG. 64a and the mask pattern of FIG. 63b configured using SMO.

As can be seen in FIGS. 65a–c, the use of parametric SMO (FIGS. 65b–c) substantially improves the process window. The exposure latitude for both the horizontal and vertical spaces are substantially increased.

In the embodiments of FIGS. 60–66b, the metric is selected to minimize the CD variations. However, it will be appreciated that one or more additional or alternative metrics may be used in other embodiments of the invention. For example, the metric may be selected to minimize other attributes such as MEEF or the shape error. As another example, the metric may be selected to maximize the depth of focus.

It will also be appreciated that additional or alternative parameters may be varied during the SMO. In an embodiment, the state of polarization in the pupil plane of the illumination system may be varied and a SMO procedure may be performed for various states of polarization. The state of polarization in the illumination may be accounted for in the calculation of the image of the mask pattern by using the vector form of the Fourier optics.

Figure 69:
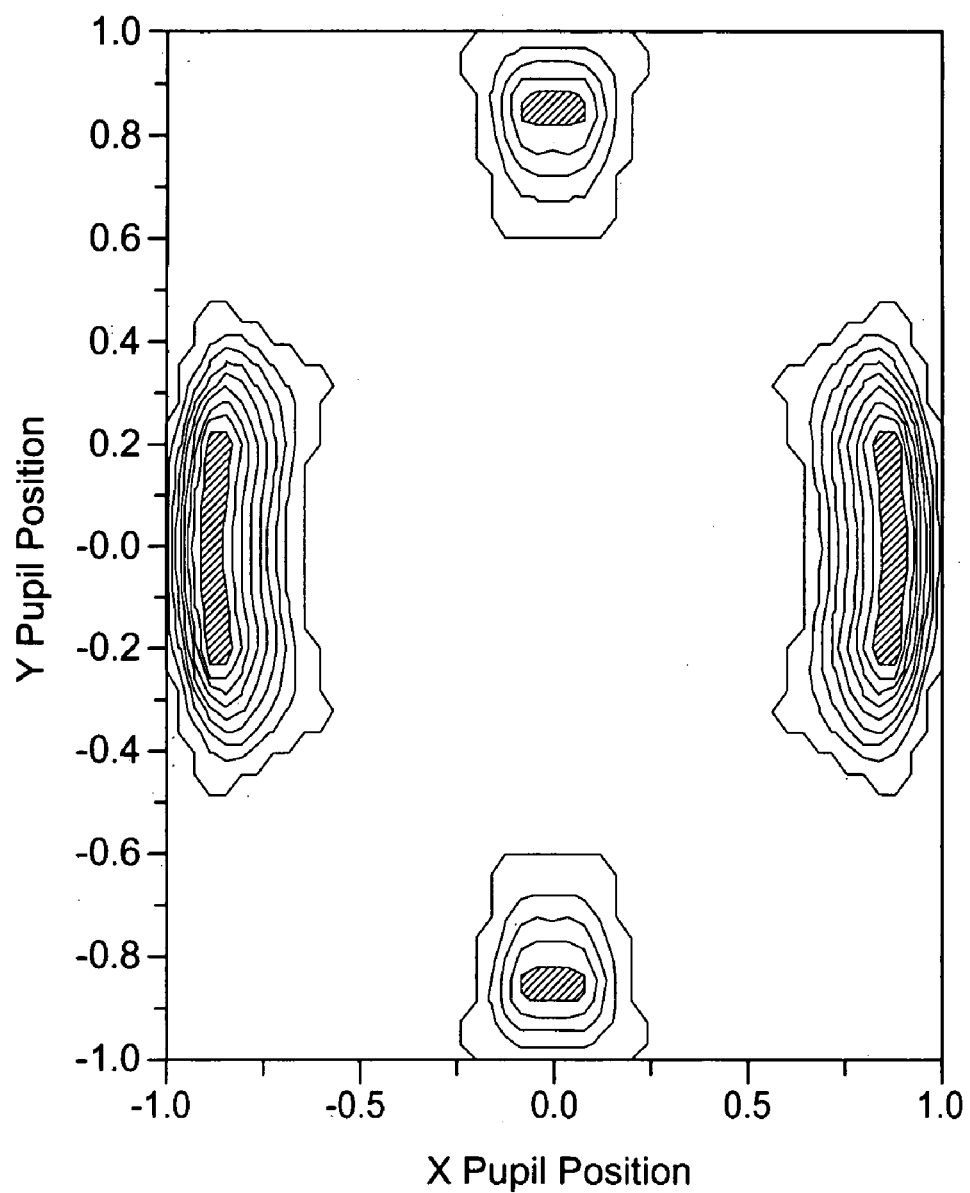
FIG. 69 shows a source shape that is optimized during the SMO.

In an embodiment, a source mask optimization with various polarization states is performed in order to optimize a DRAM structure, as shown in FIG. 67. This structure includes a plurality of angled rectangles, the angled rectangles having 100 nm horizontal and 270 nm vertical pitch and inclined relative to each other at about 20°. The angled rectangles have a 50 nm width and a 210 nm length, thus forming a so-called herringbone structure. FIGS. 68a–c show three polarization states (unpolarized—FIG. 68a, azimuthal/TE—FIG. 68b and X+Y—FIG. 68c) that are used during the SMO procedure. The initial illumination arrangement that is selected for the optimization includes an asymmetric quadrupole having two dipoles oriented substantially perpendicular to each other, as shown in FIG. 69. This initial source may be initially determined based on experimental data or preliminary simulations in accordance with, for example, the embodiment of FIG. 13.

In an embodiment, the rectangle width and the rectangle length are varied in fit during the SMO. The horizontal pole center, the horizontal pole angle, the vertical pole center and the vertical pole intensity are also varied in fit.

Figure 70A:
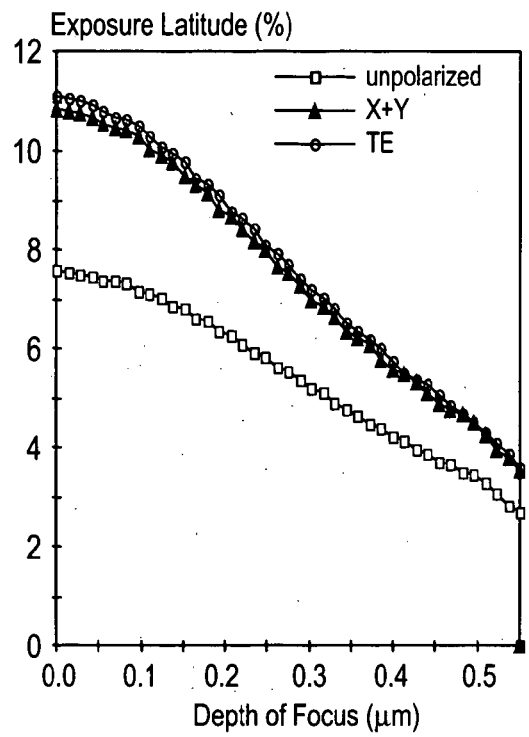
FIGS. 70a–b show the variations of exposure latitude as a function of depth of focus for the various polarization states of FIGS. 69a–c and for the rectangle width and rectangle length;.
Figure 70B:
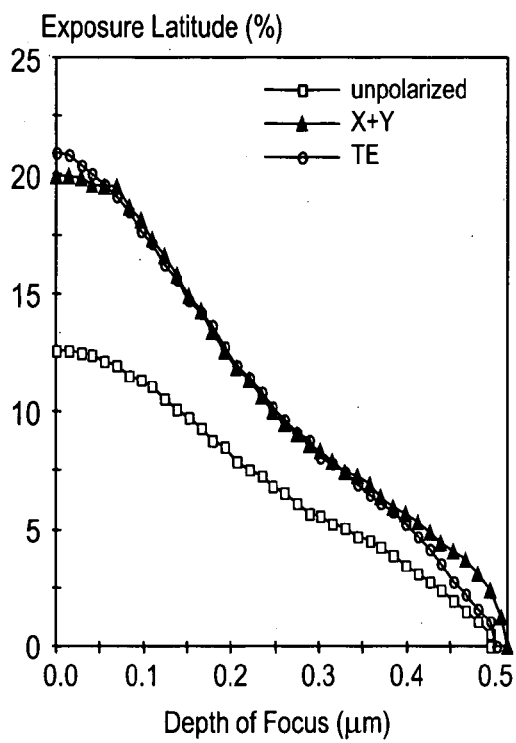

FIGS. 70*a–b* show the variations of exposure latitude as a function of depth of focus for both (a) the various polarization states of FIGS. 68*a–c* and (b) the brick width (FIG. 70*a*) and brick length (FIG. 70*b*). These results are obtained with an SMO procedure. It is shown that the polarization state can have a significant impact on the process window and that it is, therefore, desirable to take into account this parameter during the SMO procedure. The azimuthal TE and the x+y polarization states provide almost identical results. However, the unpolarized state consistently gives a lower exposure latitude over a range of depth of focus. These results also show that, in the present implementation, the optimum source shape is approximately independent of the polarization condition and, therefore, the effect of the polarization can be seen by calculating with the fixed source.

A comparison of equations 1 and 2 indicates that, for a specific wavelength, any increase in the resolution of the pattern (i.e., lower CD) through the use of higher NA, decreases the depth of focus. However, the loss of depth of focus may have a considerable impact on device manufacturing yield. The focal plane of the lithographic apparatus may not coincide with the surface of the substrate anymore due to, for example, a large unevenness of the surface of the substrate or a large field curvature of the impinging radiation. Therefore, it is desirable to maintain an acceptable level of depth of focus to properly image the pattern.

In order to increase the depth of focus, it is proposed in an embodiment of the invention to use a focus variation during exposure. The use of a focus variation, or focus drilling, changes the position of the focal plane of the lithographic apparatus relative to a reference plane that substantially coincides with or is substantially parallel to a surface of the substrate during exposure. The reference plane may correspond to the best focus plane. As a result, the effective depth of focus of the lithographic process may be increased significantly.

Optimization of the focus variation range and the illumination arrangement (e.g., shape) may be done together using an iterative process. For example, the focus variation may be a parameter that is varied during SMO in accordance with the embodiment shown in FIG. 60, i. e. in a same way as a mask parameter (e.g., OPC width) or an illumination arrangement parameter (e.g., pole angle). In addition, the focus variation range may be a parameter that is optimized or determined using the methods shown in the above described embodiments. The determination of focus variation and its position relative to the best focus may be done by computer simulation.

Figure 71:
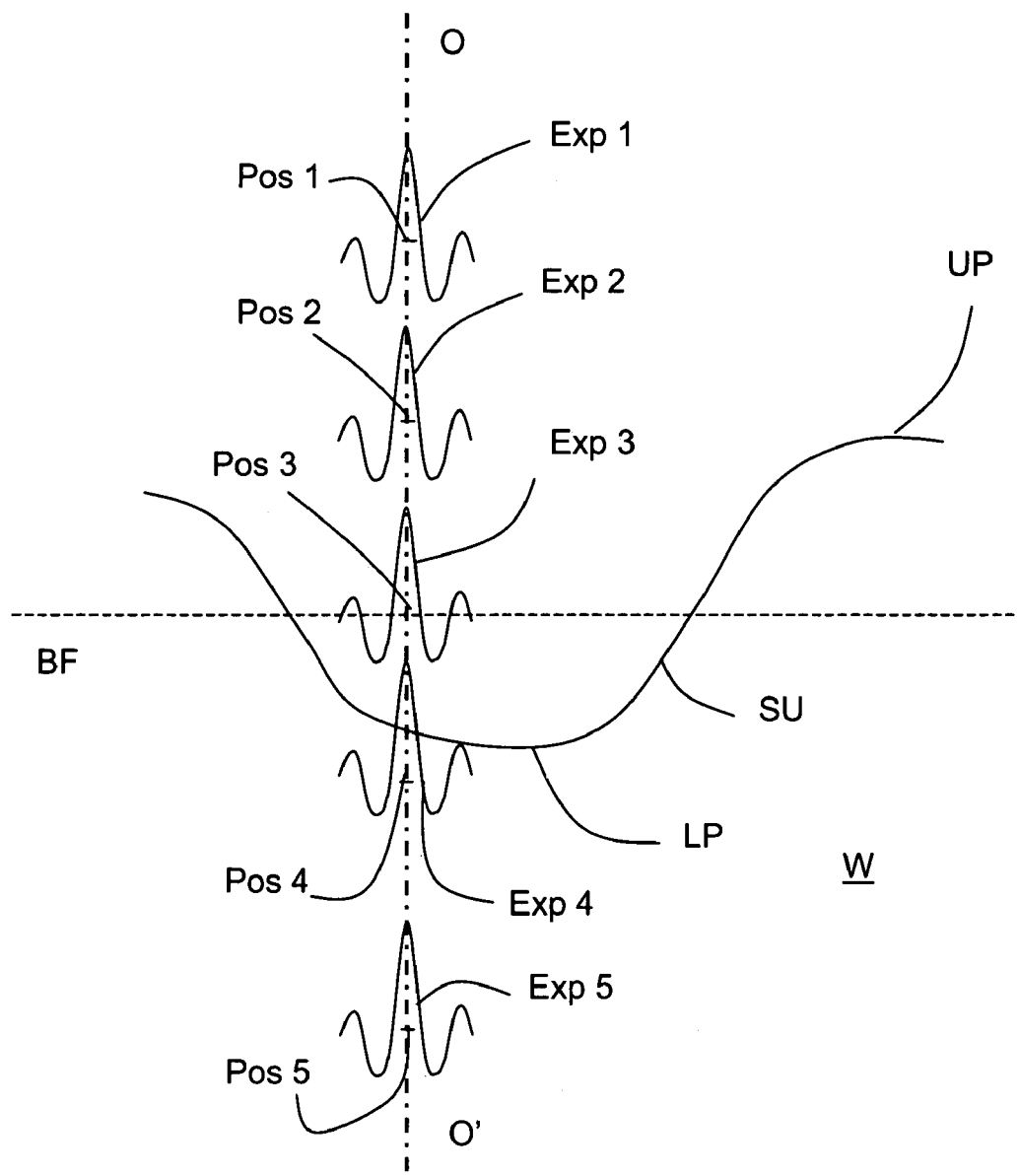
FIG. 71 schematically shows various positions of the focal plane of the lithographic apparatus during a focus variation.

FIG. 71 schematically shows the positions of the focal plane of a stepper lithographic apparatus during a focus variation in accordance with an embodiment. The focus variation consists of a superposition of a plurality of exposures Exp 1, Exp 2, Exp 3, Exp 4 and Exp 5 at different corresponding positions Pos 1, Pos 2, Pos 3, Pos 4 and Pos 5 along the optical axis O–O' of the projection system. The distance between the first exposure Exp 1 and the fifth exposure Exp 5 is at least larger than the distance between the upper portion UP and lower portion LP of the surface SU of the substrate W. With a sufficient number of exposures, the focal plane and the surface of the substrate may substantially coincide with each other at the upper, lower and intermediate portions of the topography of the substrate surface. Thus, the image of the pattern can be formed accurately all over the surface of the substrate W regardless of its unevenness.

Although the focus variation shown in FIG. 71 consists of five consecutive discreet exposures, it will be appreciated that additional or fewer exposures may be performed. In addition, the focus variation of FIG. 71 may be performed on a scanning apparatus. Specifically, as an alternative to multiple consecutive exposures, the focal plane in a scanning apparatus may be changed continuously during the focus variation. This may be done, for example, by tilting the substrate during the scan, as explained in more detail below.

In an embodiment, a focus variation may be generated during exposure by moving the substrate support along the optical axis of the projection system. In this configuration, the lithographic apparatus may include a control system, which may operatively be connected to the radiation system and the substrate table. The control system may be configured to synchronize the pulses emitted by the radiation system with the motion of the substrate table.

The displacement of the substrate support along the optical axis of the projection system may be continuous with a preselected time dependence (during exposure). In an implementation, the continuous displacement of the substrate support along the O–O' optical axis is a cyclic movement (e.g., a vibration), which may be sinusoidal or triangular. The distribution of distances between the focal plane and the reference plane during the entire exposure will depend upon the selected cyclic movement. The positioning of the substrate at a plurality of subsequent positions during exposure may be determined in accordance with a particular distribution, which may be modified in order to maximize the process window. It will be appreciated that the distribution may be used as a parameter to increase the process window. In an embodiment, the distribution may be uniform or Gaussian.

In an embodiment, a focus variation may be generated with a scanner type lithographic apparatus by scanning a substrate having a predetermined constant inclination relative to a plane perpendicular to the optical axis of the projection system. The focus variation may be determined geometrically with the tilt angle of the substrate and the slit width of the scanner. Alternatively or additionally, the focus variation may be obtained by varying the wavelength of the impinging radiation. In this embodiment, the pattern is imaged at different positions along the optical axis (i.e., one position for each wavelength) due to the chromatic aberrations of the projection system.

The contrast of the image obtained with a focus variation substantially corresponds to the average of the image contrasts of the various exposures Exp 1, Exp 2, Exp 3, Exp 4 and Exp 5. The focus variation and the distance between two adjacent exposures may be determined based on the image pattern to be printed, the numerical aperture of the projection system, and the radiation wavelength. However, it will be appreciated that the focus variation may also be determined based on the illumination arrangement (e.g., the shape of a dark field component of the illumination arrangement). In an embodiment, a focus variation of less than about 0.5 μm may be used with more complex illuminations, which include on and off axis components. In an embodiment of the invention, the focus variation may be centered about the best focus, which schematically corresponds to the reference plane BF in FIG. 71.

Figure 72:
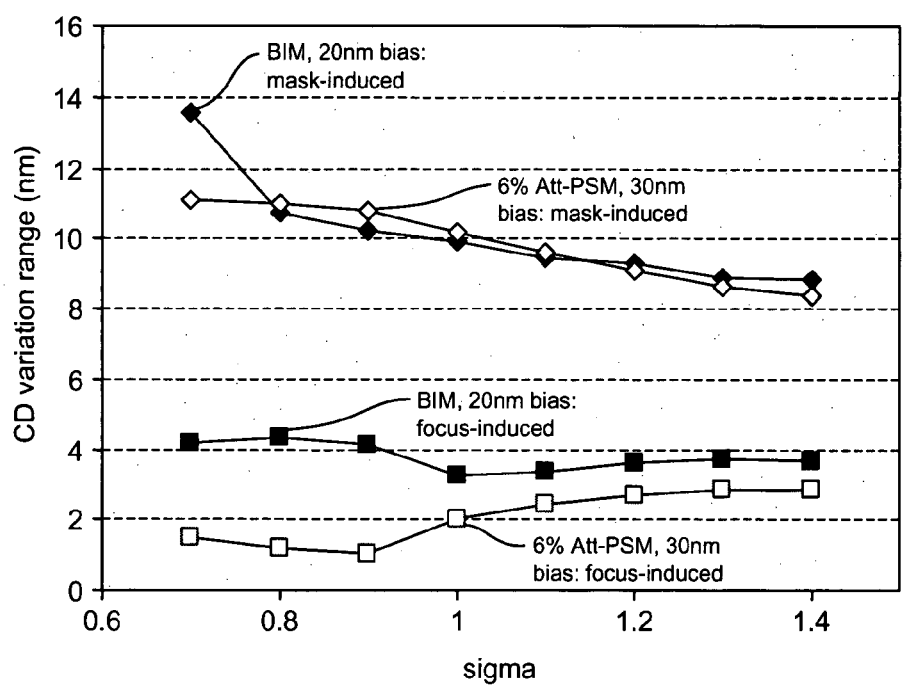
FIG. 72 shows the CD variation half range (nm) as a function of the pole size of a sigma illumination for two lithographic processes, with and without a focus variation.

FIG. 72 shows the simulated CD variation half range (nm) as a function of pole size for a sigma illumination. The CD variation is given for two lithographic processes with and without focus variation of focus drilling. In this embodiment, a random or irregular pattern of 90 nm holes and a 0.9 numerical aperture are used. The first lithographic process includes a binary mask and a 20 nm hole bias. The second lithographic process includes a 6% attenuated phase shift mask and a 30 nm hole bias. As can be seen in FIG. 72, mask error-induced CD errors are most prominent for both processes, and their effect is reduced as sigma is increased. This favorable result continues even as the pupil is over-filled (σ>1); this so called "dark field" light further improving the process.

Figure 73:
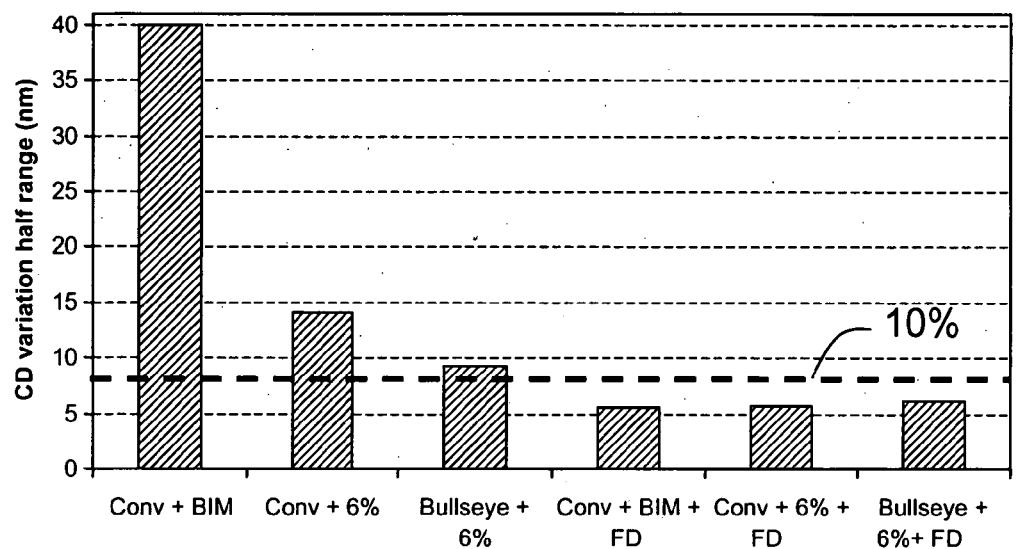
FIG. 73 shows the simulated CD variation half range for various illumination configurations with or without a focus variation, in accordance with an embodiment of the invention.
Figure 74:
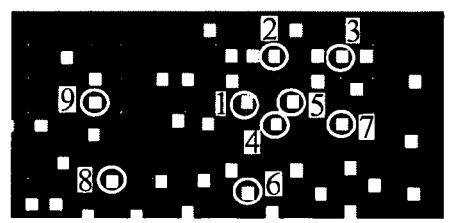
FIG. 74 shows a random pattern of holes in accordance with an embodiment of the invention.

FIG. 73 shows the simulated CD variation half range for various illumination configurations with or without a focus variation (referred to as "FD" in FIG. 73). The various illumination configurations include a conventional circular illumination having a radius of about 0.7 (referred to as "conv"), and a bullseye illumination consisting of a conventional circular illumination having a radius of about 0.1 and an annular illumination having an outer/inner radii of about 1.0/0.9. Calculations are performed for both a binary mask (referred to as "BIM") and a 6% attenuated phase shift mask (referred to as "6%") for nine 90 nm holes illustrated in the random or irregular pattern of FIG. 74. The minimum pitch of this random hole pattern is about 171 nm.

The CD variation half range in FIG. 73 is the output of a metric that calculates the average CD variation for eighteen hole measurements (horizontal and vertical measurements for the nine holes of FIG. 75) and the CD variation for the worst hole. The metric calculates the CD variation over a budget of 0.15 μm defocus, 2% dose and 2 nm mask error. Calculations are done for a 0.9 numerical aperture and 193 nm wavelength. The focus variation is optimized together with the illumination arrangement using a calibrated model, in accordance with the embodiment of the invention of FIG. 13. Results indicate that a focus variation of about 0.6 μm can substantially reduce CD variation half range regardless of the illumination shape. As can be seen in FIG. 73, the inclusion of a focus variation in the process optimization improves all illumination arrangement mask configurations and provides a CD variation lower than about 10%.

It will be appreciated that the different acts involved in configuring the optical transfer of the mask pattern onto the substrate or the SMO may be executed using machine executable instructions. These machine executable instructions may be embedded in a data storage medium, e.g., of a control unit of the lithographic apparatus. The control unit may include a processor that is configured to control the adjusting device AM and to modify the cross-sectional intensity distribution in the beam exiting the illumination system IL. Control of the cross-sectional intensity may be done based on a result of the metric and in accordance with the optimized illumination arrangement parameter.

Furthermore, it will be appreciated that the method of configuring a lithographic process described in FIG. 60 could be generalized to include projection system parameters. For example, in an embodiment of the invention, a simultaneous parametric illumination arrangement, patterning structure and projection system pupil parameter optimization using a calibrated model may be performed. By optimizing, the illumination arrangement (e.g., illumination shape), the patterning structure pattern and attributes of the pupil plane of the projection system, it may be possible to print specific repetitive or other patterns at very low k1 values, e.g., k1 values lower than about 0.35–0.3. Such a simultaneous optimization procedure may be referred to as source mask projection lens pupil optimization or SMPLPO. Examples of projection system parameters that may be used during a SMPLPO include spatial transmission and/or phase distribution in the pupil plane of the projection system.

In an embodiment of the invention, the machine executable instructions may be embedded in a computer product which can be used in conjunction with or as part of a simulation software, such as Prolith™, Solid-C™, Lithocruiser™ or the like. That is, the computer product can be configured to generate and input illumination files into the simulation software and instruct the simulation software to calculate an image of the desired pattern using, for example, an aerial, a full resist model, or a calibrated model. The computer product may then be configured to output the calculated image and to evaluate this image versus one or more criteria to judge whether the image has appropriate optical qualities to successfully print the desired mask pattern on the substrate. The image can be analyzed, for example, through a focus range to provide estimates of the exposure latitude and depth of focus. The computer product may also be configured to create the contour maps for the different lithographic responses as a function of illumination point location.

While specific embodiments of the invention have been described above, it will be appreciated that the invention may be practiced other than as described. The description is not intended to limit the invention.

What is claimed is:

1. A method of configuring a transfer of an image of a patterning device pattern onto a substrate with a lithographic apparatus, the method comprising:
   determining an intermediate illumination arrangement parameter and an intermediate patterning device parameter by varying an initial illumination arrangement parameter and an initial patterning device parameter using a calibrated model until the calculated image of the pattern printed on the substrate is within predetermined specification;
   calculating a metric that represents a variation of a lithographic response of the printed pattern over a process range, where the pattern would be imaged with the intermediate illumination arrangement and patterning device parameters over the process range, and
   depending on a result of the metric, iteratively (a) varying the initial patterning device and illumination arrangement parameters and (b) calculating the metric until a substantially maximum or minimum value of the lithographic response is obtained.

2. The method of claim 1, wherein the maximum or minimum value is within a selected range of variation of the lithographic response.

3. The method of claim 2, wherein the lithographic response is CD variation and the range is about +/−5%.

4. The method of claim 1, wherein the lithographic response is CD variation, CD uniformity, MEEF, depth of focus, exposure latitude or E1:1.

5. The method of claim 1, wherein the calculating includes calculating the metric that represents a variation of a lithographic response of the printed pattern over a plurality of process variation ranges, and wherein the metric is a quadratic sum of CD variations that are each induced by one of the plurality of process ranges.

6. The method of claim 5, wherein the plurality of process ranges include a focus range, a patterning device error range and a dose range.

7. The method of claim 1, wherein the varying and the calculating are done by computer simulation.

8. The method of claim 1, wherein the varying and the calculating further comprises using a parameter representing a polarization state of radiation within an illumination system of the lithographic apparatus.

9. The method of claim 1, wherein the determining includes determining an intermediate focus variation range by varying an initial focus variation range using a calibrated model until the calculated image of the pattern printed on the substrate is within predetermined specification, the focus variation range being applied during exposure of the substrate by the lithographic apparatus;
  wherein the calculating includes calculating a metric that represents a variation of a lithographic response of the printed pattern over a process range, where the pattern would be imaged with the intermediate illumination arrangement and patterning device parameters over the process range and the intermediate focus variation range, and
  wherein the varying and calculating include, depending on a result of the metric, iteratively (a) varying the initial patterning device and illumination arrangement parameters and the initial focus variation range and (b) calculating the metric until a substantially maximum or minimum value of the lithographic response is obtained.

10. The method of claim 1, wherein the predetermined specification includes a variation of a critical dimension of the pattern in a range of about +/−5%.

11. The method of claim 1, wherein the intermediate and initial illumination arrangement parameters include a radius, an opening angle, a radial width or an intensity of an illumination arrangement in a pupil plane of an illumination system of the lithographic apparatus.

12. The method of claim 1, wherein the intermediate and initial patterning device parameters include a critical dimension of the pattern, a dimension between two adjacent features of the pattern or a critical dimension of an optical proximity correction feature arranged in the pattern.

13. A lithographic apparatus, comprising
  an illumination system configured to condition a beam of radiation;
  a substrate table configured to hold a substrate;
  a projection system configured to project a beam of radiation patterned by a patterning device onto a surface of the substrate; and
  a processor to perform a method of configuring a transfer of an image of a patterning device pattern onto the substrate, the method comprising:
    determining an intermediate illumination arrangement parameter and an intermediate patterning device parameter by varying an initial illumination arrangement parameter and an initial patterning device parameter using a calibrated model until the calculated image of the pattern on the substrate is within predetermined specification;
    calculating a metric that represents a variation of a lithographic response of the printed pattern over a process range, where the pattern would be imaged with the intermediate illumination arrangement and patterning device parameters over a process range, and
    depending on a result of the metric, iteratively (a) varying the initial patterning device and illumination arrangement parameters and (b) calculating the metric until a substantially maximum or minimum value of the lithographic response is obtained.

14. The lithographic apparatus of claim 13, wherein if the result of the metric is within a threshold, the apparatus is configured to adjust a setting of the illumination system in accordance with the intermediate illumination arrangement parameter.

15. The lithographic apparatus of claim 13, further comprising a selectably variable beam controller that is adapted to modify a cross-sectional intensity distribution in the beam of radiation exiting the illumination system in accordance with the adjusted illumination arrangement parameter.

16. The apparatus of claim 15, wherein the lithographic response is CD variation and the threshold is a range of about +/−5%.

17. The apparatus of claim 13, wherein the lithographic response is CD variation, CD uniformity, MEEF, depth of focus, exposure latitude or E1:1.

18. The apparatus of claim 13, wherein the varying and calculating includes using a parameter representing a polarization state of radiation within the illumination system, and wherein the apparatus is configured to adjust the polarization state of the illumination system based on the result of the metric.

19. The apparatus of claim 13, wherein the varying and calculating includes using a parameter representing a focus variation that is applied during exposure of the substrate by the lithographic apparatus, and wherein the apparatus is configured to adjust the focus variation based on the result of the metric.

20. A computer product, embodied in a computer-readable medium, having machine executable instructions, the instructions being executable by a machine to perform a method of configuring a transfer of an image of a patterning device pattern onto a substrate with a lithographic apparatus, the method comprising:
  determining an intermediate illumination arrangement parameter and an intermediate patterning device parameter by varying an initial illumination arrangement parameter and an initial patterning device parameter using a calibrated model until the calculated image of the pattern printed on the substrate is within predetermined specification;
  calculating a metric that represents a variation of a lithographic response of the printed pattern over a process range, where the pattern would be imaged with the intermediate illumination arrangement and patterning device parameters over the process range, and
  depending on a result of the metric, iteratively (a) varying the initial patterning device and illumination arrangement parameters and (b) calculating the metric until a substantially maximum or minimum value of the lithographic response is obtained.

21. The computer product of claim 20, wherein the maximum or minimum value is within a selected range of variation of the lithographic response.

22. The computer product of claim 21, wherein the lithographic response is CD variation and the range is about +/−5%.

23. The computer product of claim 20, wherein the lithographic response is CD variation, CD uniformity, MEEF, depth of focus, exposure latitude or E1:1.

24. The computer product of claim 20, wherein the calculating includes calculating the metric that represents a variation of a lithographic response of the printed pattern over a plurality of process variation ranges, and wherein the metric is a quadratic sum of CD variations that are each induced by one of the plurality of process ranges.

25. The computer product of claim 24, wherein the plurality of process ranges include a focus range, a patterning device error range and a dose range.

26. The computer product of claim 20, wherein the varying and the calculating are done by computer simulation.

27. The computer product of claim 20, wherein the determining includes determining an intermediate polarization state of radiation within an illumination system of the lithographic apparatus by varying an initial polarization state,
- wherein the calculating includes calculating a metric that represents a variation of a lithographic response of the printed pattern over a process range, where the pattern would be imaged with the intermediate illumination arrangement and patterning device parameters over the process range and the intermediate polarization state, and
- wherein the varying and calculating include, depending on a result of the metric, iteratively (a) varying the initial patterning device and illumination arrangement parameters and the initial polarization state and (b) calculating the metric until a substantially maximum or minimum value of the lithographic response is obtained.

28. The computer product of claim 20, the determining includes determining an intermediate focus variation range by varying an initial focus variation range using a calibrated model until the calculated image of the pattern could be substantially printed on the substrate is within predetermined specification, the focus variation range being applied during exposure of the substrate by the lithographic apparatus;
- wherein the calculating includes calculating a metric that represents a variation of a lithographic response of the printed pattern over a process range, where the pattern would be imaged with the intermediate illumination arrangement and patterning device parameters over the process range and the intermediate focus variation range, and
- wherein the varying and calculating include, depending on a result of the metric, iteratively (a) varying the initial patterning device and illumination arrangement parameters and the initial focus variation range and (b) calculating the metric until a substantially maximum or minimum value of the lithographic response is obtained.

29. A method of configuring a transfer of an image of a patterning device pattern onto a substrate with a lithographic apparatus, the method comprising:
- determining a plurality of intermediate parameters by varying a corresponding plurality of initial intermediate parameters using a calibrated model until the calculated image of the pattern printed on the substrate is within predetermined specification;
- calculating a metric that represents a variation of a lithographic response of the printed pattern over a process range, where the pattern would be imaged with the plurality of intermediate parameters over the process range, and
- depending on a result of the metric, iteratively (a) varying the initial plurality parameters and (b) calculating the metric until a substantially maximum or minimum value of the lithographic response is obtained.

30. The method of claim 29, wherein the plurality of initial intermediate parameters include an illumination arrangement parameter, an intermediate patterning device parameter, and a polarization state of radiation within an illumination system of the lithographic apparatus and/or a focus variation range, and/or a projection system parameter.

* * * * *